US012757586B2

(12) United States Patent
Liu et al.

(10) Patent No.: US 12,757,586 B2
(45) Date of Patent: Oct. 6, 2026

(54) DISPLAY SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Xu Liu, Beijing (CN); Hongli Wang, Beijing (CN); Yong Qiao, Beijing (CN); Xinyin Wu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 467 days.

(21) Appl. No.: 18/549,800

(22) PCT Filed: Oct. 19, 2022

(86) PCT No.: PCT/CN2022/126073
§ 371 (c)(1),
(2) Date: Sep. 8, 2023

(87) PCT Pub. No.: WO2023/066279
PCT Pub. Date: Apr. 27, 2023

(65) Prior Publication Data

US 2024/0155881 A1 May 9, 2024

(30) Foreign Application Priority Data

Oct. 20, 2021 (CN) ......................... 202111220749.3

(51) Int. Cl.
*H10K 59/123* (2023.01)
*H10K 59/124* (2023.01)
(Continued)

(52) U.S. Cl.
CPC ......... *H10K 59/123* (2023.02); *H10K 59/124* (2023.02); *H10K 59/126* (2023.02); *H10K 59/131* (2023.02); *H10K 59/40* (2023.02)

(58) Field of Classification Search
CPC ....... H10K 59/123–124; H10K 59/126; H10K 59/131; H10K 59/40; H10K 59/1213;
(Continued)

(56) References Cited

U.S. PATENT DOCUMENTS 5,702,981 A 12/1997 Maniar et al.
5,874,357 A 2/1999 Jun et al.
(Continued)

FOREIGN PATENT DOCUMENTS

CN 105742299 A 7/2016
CN 207165572 U 3/2018
(Continued)

OTHER PUBLICATIONS

Machine translation of CN113451386A (Year: 2021).*
(Continued)

*Primary Examiner* — Anne M Hines
*Assistant Examiner* — Jose M Diaz

(57) ABSTRACT

A display substrate and a display device are provided. The display substrate includes a first insulating layer, a first conductive layer, a second insulating layer and a second conductive layer stacked in sequence. The first insulating layer includes a first depression structure; the first conductive layer includes a first conductive structure; the second conductive layer includes a second conductive structure which is in contact with a first side surface of the first conductive structure; the first side surface includes a protruding curved surface, at least a portion of which is covered by the second conductive structure; the first conductive structure includes a connection portion in the first depression
(Continued)

structure and connected to the protruding curved surface; in a direction parallel to a surface of the base substrate, the protruding curved surface protrudes towards a middle of the first depression structure relative to the connection portion.

18 Claims, 29 Drawing Sheets

(51) Int. Cl.
*H10K 59/126* (2023.01)
*H10K 59/131* (2023.01)
*H10K 59/40* (2023.01)

(58) Field of Classification Search
CPC .. H10K 59/1315; H10K 59/12; H10K 59/121; H10K 59/35; H10K 59/805; H10K 77/10; H10D 86/40; H10D 86/441; H10D 86/60; G06F 3/0412; G09G 3/3233; G09G 2300/0426; G09G 2300/0819; G09G 2300/0861; G09G 2310/0248; G09G 2310/0262; G09G 2310/061
See application file for complete search history.

(56) References Cited

U.S. PATENT DOCUMENTS

| | | | |
|---|---|---|---|
| 6,064,119 | A | 5/2000 | Jun et al. |
| 6,258,691 | B1 | 7/2001 | Kim |
| 2004/0099915 | A1 | 5/2004 | Takayama et al. |
| 2005/0176241 | A1 | 8/2005 | Ryu |
| 2009/0302477 | A1 | 12/2009 | Shor et al. |
| 2014/0097455 | A1 | 4/2014 | Ono |
| 2016/0163587 | A1 | 6/2016 | Backes et al. |
| 2016/0197013 | A1 | 7/2016 | Backes et al. |
| 2018/0151647 | A1 | 5/2018 | Lee et al. |
| 2018/0217464 | A1 | 8/2018 | Wang |
| 2020/0357870 | A1 | 11/2020 | Cheng |
| 2021/0151540 | A1 | 5/2021 | Wang |
| 2021/0167161 | A1 | 6/2021 | Yang et al. |
| 2021/0367021 | A1 | 11/2021 | Yang et al. |

FOREIGN PATENT DOCUMENTS

| | | | |
|---|---|---|---|
| CN | 108376676 | A | 8/2018 |
| CN | 109599502 | A | 4/2019 |
| CN | 110114885 | A | 8/2019 |
| CN | 113257881 | A | 8/2021 |
| CN | 113257885 | A | 8/2021 |
| CN | 113451386 | A | 9/2021 |
| CN | 113658995 | A | 11/2021 |
| GB | 2 339 962 | A | 2/2000 |
| KR | 1020000010390 | A | 2/2000 |
| KR | 1020180013226 | A | 2/2018 |
| KR | 1020210068330 | A | 6/2021 |
| KR | 1020210119951 | A | 10/2021 |
| WO | 2021/102988 | A1 | 6/2021 |
| WO | 2021/103504 | A1 | 6/2021 |

OTHER PUBLICATIONS

The extended European search report dated Sep. 23, 2024; Appln. No. 22882884.4.
The First Chinese Office Action dated May 14, 2025; Appln. No. 202210289047.9.
Korean Office Action dated May 22, 2026; Appln. No. 10-2023-7042199.

* cited by examiner

502

DISPLAY SUBSTRATE AND DISPLAY DEVICE

This application is a National Stage of International Application No. PCT/CN2022/126073, filed Oct. 19, 2022, which claims priority to and the benefit of Chinese patent application No. 202111220749.3, filed Oct. 20, 2021, the entireties of which are hereby incorporated herein by reference as part of the disclosure of this application.

TECHNICAL FIELD

Embodiments of the present disclosure relate to a display substrate and a display device.

BACKGROUND

An organic light emitting diode (OLED) display has many advantages such as active light emission, high contrast, rapid response, and being light and thin, and thus has become one of major new generation displays. With the rapid development of high-resolution products, higher requirements have been put forward on a structural design, such as arrangements of pixels and signals, of a display substrate of a display.

SUMMARY

At least an embodiment of the present disclosure provides a display substrate, comprising a base substrate, and a first insulating layer, a first conductive layer, a second insulating layer, and a second conductive layer which are disposed on the base substrate in sequence. The first insulating layer comprises a first depression structure; the first conductive layer comprises a first conductive structure comprising a bottom surface close to the base substrate, a top surface away from the base substrate, and a first side surface between the bottom surface and the top surface; the second insulating layer comprises a first via hole, and the second conductive layer comprises a second conductive structure; an orthographic projection of the first via hole on the base substrate is at least partially overlapped with an orthographic projection of the first depression structure on the base substrate; the first via hole exposes at least a portion of the first side surface of the first conductive structure, and the second conductive structure is in contact with the at least portion of the first side surface of the first conductive structure; the first side surface of the first conductive structure comprises a protruding curved surface, and the second conductive structure covers at least a portion of the protruding curved surface; the first conductive structure comprises a connection portion located in the first depression structure and connected to the protruding curved surface; and in a direction parallel to a surface of the base substrate, the protruding curved surface protrudes towards a middle of the first depression structure relative to the connection portion.

In some examples, the second conductive structure comprises a first protrusion, and an orthographic projection of the first protrusion on the base substrate is located within the orthographic projection of the first depression structure on the base substrate; and the first protrusion is in contact with at least a portion of the first side surface of the first conductive structure.

In some examples, the orthographic projection of the first depression structure on the base substrate is at least partially overlapped with the orthographic projection of the first via hole on the base substrate.

In some examples, the first conductive structure further comprises a second side surface located between the bottom surface and the top surface, and the first side surface is opposite to the second side surface; and a size of the first side surface in a direction perpendicular to the base substrate is greater than a size of the second side surface in the direction perpendicular to the base substrate.

In some examples, the first side surface comprises a first side surface portion on a side, away from the base substrate, of the first insulating layer; and a size of a portion, not covered by the second conductive structure, of the first side surface portion in the direction perpendicular to the base substrate is greater than the size of the second side surface in the direction perpendicular to the base substrate.

In some examples, at least a portion, which is directly connected to the first side surface, of the top surface of the first conductive structure is separated from the second conductive layer.

In some examples, the display substrate has a first cross section, and a size of the first depression structure within the first cross section in a reference direction parallel to a surface of the base substrate is denoted as b; within the first cross section, a size of an overlapping region of the first via hole and the first depression structure in the reference direction is denoted as c, and a size of a portion, covered by the second conductive structure, of the first side surface of the first conductive structure in the direction perpendicular to the base substrate is denoted as d; the first conductive structure comprises a contact portion located on the side, away from the base substrate, of the first insulating layer and in contact with the second conductive structure, and a size of the contact portion in the direction perpendicular to the base substrate is denoted as e; c/b is greater than 0.1; and d/e is greater than 0.3.

In some examples, c/b is greater than 0.15, and d/e is less than 0.8.

In some examples, c/b is less than 0.19, and d/e is less than 0.5.

In some examples, within the first cross section, a maximum depth of the first depression structure is denoted as i; an included angle formed by a side edge of the first depression structure within the first cross section and the surface of the base substrate is denoted as j; a thickness of a portion, in contact with the first conductive structure, of the second conductive structure in the direction perpendicular to the base substrate is denoted as k; and $d/e<0.0273*i*\sin(j)/k$.

In some examples, $c/b<0.0102*i*\sin(j)/k$.

In some examples, the size of the first side surface in the direction perpendicular to the base substrate is denoted as n, and the size of the second side surface in the direction perpendicular to the base substrate is denoted as e; and $0.1*(n/e)/\sin(j)>(d/n)$.

In some examples, $0.08*(n/e)/\sin(j)>d/n$.

In some examples, the contact portion comprises a second protrusion facing the first depression structure, and an orthographic projection of the second protrusion on the base substrate is located within the orthographic projection of the first depression structure on the base substrate; and within the first cross section, a size of the second protrusion in the direction perpendicular to the base substrate is greater than a size of a portion, located on a side surface of the first depression structure, of the first conductive layer in a direction perpendicular to the side surface of the first depression structure.

In some examples, the first insulating layer further comprises a second depression structure spaced apart from the first depression structure; the first conductive structure further comprises a second side surface located between the bottom surface and the top surface, and the first side surface is opposite to the second side surface; an orthographic projection of the second side surface on the base substrate is at least partially overlapped with an orthographic projection of the second depression structure on the base substrate; the first via hole further exposes at least a portion of the second side surface, and the second conductive structure covers the at least portion of the second side surface of the first conductive structure.

In some examples, in a direction perpendicular to the base substrate, a size of the portion, covered by the second conductive structure, of the first side surface of the first conductive structure is different from a size of a portion of the second side surface that is covered by the second conductive structure.

In some examples, an overlapping size of the orthographic projection of the first via hole on the base substrate and the orthographic projection of the first depression structure on the base substrate is different from an overlapping size of the orthographic projection of the first via hole on the base substrate and the orthographic projection of the second depression structure on the base substrate.

At least an embodiment of the present disclosure further discloses a display substrate, comprising a base substrate; and a first insulating layer, a first conductive layer, a second insulating layer, and a second conductive layer which are disposed on the base substrate in sequence. The first insulating layer comprises a first conductive structure; the second conductive layer comprises a second conductive structure; the first conductive structure comprises a bottom surface close to the base substrate, a top surface away from the base substrate, and a first side surface located between the bottom surface and the top surface; the second insulating layer comprises a first via hole, and the second conductive layer is in contact with the first conductive structure through the first via hole; the second conductive structure comprises a first protrusion; the first via hole exposes at least a portion of the first side surface of the first conductive structure, and the first protrusion is in contact with the at least portion of the first side surface of the first conductive structure; the first insulating layer comprises a first depression structure and a second depression structure spaced apart from each other; the first conductive structure further comprises a second side surface located between the bottom surface and the top surface, and the first side surface is opposite to the second side surface; and at least a portion of the first conductive structure is respectively located in the first depression structure and the second depression structure.

In some examples, the first conductive structure comprises a second protrusion facing the first depression structure, and an orthographic projection of the second protrusion on the base substrate is located within an orthographic projection of the first depression structure on the base substrate.

In some examples, the display substrate further comprises a plurality of sub-pixels located on the base substrate, wherein the plurality of sub-pixels are arranged in a plurality of pixel rows along a first direction and a plurality of pixel columns along a second direction, and the first direction is different from the second direction; the first conductive layer further comprises a first signal line and a second signal line which are spaced apart from the first conductive structure, and the first signal line and the second signal line are extended in the second direction; a distance of an orthographic projection of the first protrusion on the base substrate to an orthographic projection of the first signal line on the base substrate in the first direction is denoted as l, and a distance of an orthographic projection of the second signal line on the base substrate to the orthographic projection of the first signal line on the base substrate in the first direction is denoted as m; the display substrate comprising a first cross section perpendicular to the base substrate; within the first cross section, a size of a portion of the first conductive structure which is located on a side, away from the base substrate, of the first insulating layer in a direction perpendicular to the base substrate is denoted as e, and a size of a portion, covered by the first protrusion, of the first side surface in the direction perpendicular to the base substrate is denoted as d; and $l/m>0.9(d/e)$.

In some examples, $l/m>1.2*(d/e)$.

In some examples, the display substrate further comprises a plurality of sub-pixels located on the base substrate, wherein the plurality of sub-pixels are arranged in a plurality of pixel rows along a first direction and a plurality of pixel columns along a second direction, and the first direction is different from the second direction; the second insulating layer comprises a plurality of via holes that are arranged in a plurality of via hole rows and a plurality of via hole columns in the first direction and the second direction, and the plurality of via holes comprise multiple first via holes; the plurality of via hole rows comprise a first via hole row, and in the first via hole row, three continuous first via holes are present at an interval of one via hole.

In some examples, the plurality of via hole columns comprise a first via hole column, and in the first via hole column, each via hole is the first via hole, or one first via hole is present at an interval of one via hole.

In some examples, the plurality of pixel columns comprise a first pixel column and a second pixel column which are adjacent in the first direction; the first signal line is connected to sub-pixels in the first pixel column to provide a first signal, and the second signal line is connected to sub-pixels in the second pixel column to provide a second signal; and orthographic projections of electrodes, on a side close to the base substrate, of light emitting elements of the first pixel column on the base substrate are at least partially overlapped with an orthographic projection of the first signal line on the base substrate and an orthographic projection of the second signal line on the base substrate, respectively.

In some examples, the display substrate further comprises a pixel defining layer located on a side, away from the base substrate, of a pixel electrode; the pixel defining layer comprises a plurality of pixel opening regions that correspond to the plurality of sub-pixels one to one; and orthographic projections of the plurality of pixel opening regions on the base substrate are separated from an orthographic projection of the first protrusion on the base substrate.

In some examples, the pixel defining layer comprises a plurality of protrusion portions which are located among the plurality of pixel opening regions; the plurality of protrusion portions comprise a first protrusion portion, a second protrusion portion, and a third protrusion portion which are surrounding a same pixel opening region; and connecting lines of centers of orthographic projections of the first protrusion portion, the second protrusion portion, and the third protrusion portion on the base substrate form a triangle.

In some examples, the first protrusion portion is located among four adjacent pixel opening regions, and the second protrusion portion and the third protrusion portion are each located between two adjacent pixel opening regions; and an area of the orthographic projection of the first protrusion portion on the base substrate is greater than an area of the orthographic projection of the second protrusion portion on the base substrate and greater than an area of the orthographic projection of the third protrusion portion on the base substrate.

In some examples, the display substrate further comprises a third conductive layer on a side, close to the base substrate, of the first conductive layer; wherein the display substrate further comprises a plurality of sub-pixels on the base substrate; the plurality of sub-pixels are arranged in a plurality of pixel rows in a first direction and a plurality of pixel columns in a second direction, and the first direction is different from the second direction; the third conductive layer comprises a shielding electrode and a first capacitor electrode; and the shielding electrode comprises a portion extended in the first direction, and a portion extended towards the first capacitor electrode of the sub-pixel where the shielding electrode is located.

In some examples, the display substrate further comprises a third conductive layer on the side, close to the base substrate, of the first conductive layer; the display substrate further comprises a plurality of sub-pixels located on the base substrate; the plurality of sub-pixels are arranged in a plurality of pixel rows in a first direction and a plurality of pixel columns in a second direction, and the first direction is different from the second direction; the first conductive layer comprises a first reset voltage line extended in the second direction, and the third conductive layer comprises a second reset voltage line extended in the first direction, and the first reset voltage line is electrically connected to the second reset voltage line; the display substrate further comprises a semiconductor layer on a sided, close to the base substrate, of the third conductive layer; the semiconductor layer comprises a connection portion which electrically connects the first reset voltage line to a first electrode of a reset transistor in a sub-pixel; and an orthographic projection of the connection portion on the base substrate is overlapped with an orthographic projection of the first reset voltage line on the base substrate and is overlapped with an orthographic projection of the first electrode of the reset transistor on the base substrate.

In some examples, the display substrate further comprises a plurality of sub-pixels located on the base substrate, wherein the plurality of sub-pixels are arranged in a plurality of pixel rows in a first direction and a plurality of pixel columns in a second direction, and the first direction is different from the second direction; the display substrate further comprises a first gate reset voltage line and a first pixel electrode reset voltage line which are extended in the second direction, and a second gate reset voltage line and a second pixel electrode reset voltage line which are extended in the second direction, the first gate reset voltage line is electrically connected to the second gate reset voltage line through a second via hole, and the first pixel electrode reset voltage line is electrically connected to the second pixel electrode reset voltage line through a third via hole; the first gate reset voltage line and the second gate reset voltage line are configured to provide a reset voltage signal for a gate electrode of a driving transistor, and the first pixel electrode reset voltage line and the second pixel electrode reset voltage line are configured to provide a reset voltage signal for a pixel electrode.

In some examples, the second pixel electrode reset voltage line is electrically connected to a first electrode of a pixel electrode reset transistor through a fourth via hole, and orthographic projections of the fourth via hole and the third via hole on the base substrate are separated from each other.

In some examples, the second gate reset voltage line is electrically connected to a first electrode of a gate electrode reset transistor through a fifth via hole, and orthographic projections of the fifth via hole and the second via hole on the base substrate are separated from each other.

In some examples, the display substrate further comprises a plurality of sub-pixels located on the base substrate, wherein the plurality of sub-pixels are arranged in a plurality of pixel rows along a first direction and a plurality of pixel columns along a second direction, and the first direction is different from the second direction; each of the plurality of sub-pixels comprises a first capacitor electrode; the display substrate further comprises a plurality of data lines extended in the second direction; first capacitor electrodes of two sub-pixels adjacent in the first direction are connected by a connection portion, and the plurality of data lines are respectively overlapped with a plurality of connection portions in a direction perpendicular to the base substrate; the connection portion comprises a first portion overlapping a corresponding data line and a second portion not overlapping the corresponding data line; a size of the first portion in the second direction is greater than a size of the second portion in the second direction; the display substrate further comprises a reset voltage line extended along the second direction; and the second portion is overlapped with the reset voltage line in the direction perpendicular to the base substrate.

At least an embodiment of the present disclosure further provides a display substrate, comprising a base substrate, and a first metal layer, a second metal layer, a first conductive layer, and a second conductive layer which are disposed on the base substrate in sequence. The display substrate further comprises a first sub-pixel and a second sub-pixel which are on the base substrate and adjacent in a first direction; the first sub-pixel comprises a first pixel circuit, and the second sub-pixel comprises a second pixel circuit; the first pixel circuit and the second pixel circuit each comprise a capacitor which comprises a first capacitor electrode in the second metal layer and a second capacitor electrode in the first metal layer; the first capacitor electrode of the first pixel circuit and the first capacitor electrode of the second pixel circuit are connected to each other into an integrated capacitor electrode block; the capacitor electrode block has a first opening and a second opening; an orthographic projection of the first opening on the base substrate is overlapped with an orthographic projection of the second capacitor electrode of the first pixel circuit on the base substrate, and an orthographic projection of the second opening on the base substrate is overlapped with an orthographic projection of the second capacitor electrode of the second pixel circuit on the base substrate; and an area of the orthographic projection of the first opening on the base substrate is different from an area of the orthographic projection of the second opening on the base substrate.

In some examples, the second conductive layer comprises a reset voltage line, a first data line, a second data line, a first power line, and a second power line which are extended along a second direction, and the first direction is different from the second direction; each of the first pixel circuit and the second pixel circuit comprises a driving transistor and a data writing transistor; the reset voltage line is configured to provide a reset voltage for pixel electrodes or gate electrodes of the driving transistors of the first pixel circuit and the second pixel circuit; the first data line and the second data line are configured to provide data voltages for the data writing transistors of the first pixel circuit and the second pixel circuit, respectively; the first power line is configured to provide a power voltage for the driving transistor of the first pixel circuit, and the second power line is configured to provide a power voltage for the driving transistor of the second pixel circuit; the reset voltage line is between the first data line and the second data line; the first data line and the second data line are both between the first power line and the second power line; and the first power line and the second power line each have a closed hollowed-out region.

In some examples, an orthographic projection of a pixel electrode of the first sub-pixel on the base substrate is overlapped with an orthographic projection of each of the reset voltage line, the first data line, the second data line, the first power line, and the second power line on the base substrate.

In some examples, the display substrate further comprises a plurality of sub-pixels located on the base substrate and arranged in a plurality of pixel rows and a plurality of pixel columns in the first direction and in a second direction, wherein the first direction is different from the second direction; the first conductive layer further comprises a plurality of connection electrodes which are connected to the plurality of sub-pixels in one-to-one correspondence to provide a power voltage; the plurality of sub-pixels comprise a first sub-pixel; the display substrate further comprises a reset voltage line extended in the second direction, and the reset voltage line is connected to the first sub-pixel to provide a reset voltage; and an orthographic projection of a first protrusion on the base substrate is between an orthographic projection of the connection electrode correspondingly connected to the first sub-pixel on the base substrate and an orthographic projection of the reset voltage line on the base substrate.

In some examples, along the first direction, a distance of the first protrusion to the reset voltage line is smaller than a distance of the first protrusion to the connection electrode.

In some examples, the connection electrode comprises a main body portion and an extension portion extended in the first direction, and a size of the extension portion in the second direction is smaller than a size of the main body portion in the second direction; and in the second direction, the first conductive structure is at least partially overlapped with the extension portion of the connection electrode.

In some examples, the second conductive layer comprises a plurality of power electrodes that are connected to the plurality of connection electrodes in one-to-one correspondence to provide the power voltage; and the power electrodes corresponding to each of the plurality of pixel columns are connected to one another into an integrated structure, so as to form a plurality of power lines extended in the second direction.

In some examples, the second conductive layer further comprises a plurality of data lines extended in the second direction, wherein the plurality of data lines are connected to the plurality of pixel columns in one-to-one correspondence to provide data signals; the plurality of data lines are divided into a plurality of groups of data lines, and each data line group comprises two data lines; between every two adjacent pixel columns is provided with one data line group, and adjacent groups of data lines are spaced apart by two power lines.

In some examples, the display substrate comprises a plurality of reset voltage lines extended in the second direction, and the plurality of reset voltage lines comprise a first reset voltage line and a second reset voltage line disposed alternately in the first direction; the first reset voltage line and the second reset voltage line are configured to provide a first reset voltage and a second reset voltage, respectively; and adjacent first reset voltage and second reset voltage are spaced apart by two pixel columns.

In some examples, the plurality of reset voltage lines are in the first conductive layer; one first reset voltage line or one second reset voltage line is provided between the two power lines between the adjacent groups of data lines; and an orthographic projection of any one of the plurality of reset voltage lines on the base substrate is separated from an orthographic projection of any one of the plurality of power lines on the base substrate.

In some examples, the plurality of reset voltage lines are in the second conductive layer and are in one-to-one correspondence with the plurality of groups of data lines; and each of the plurality of reset voltage lines is between two data lines of a data line group corresponding to the each reset voltage line.

In some examples, the two power lines between adjacent groups of data lines are connected to each other into an integrated structure such that two power electrodes adjacent in the first direction in the two power lines are connected to each other into an integrated power electrode set; the display substrate comprises a plurality of second conductive structures disposed in one-to-one correspondence with the plurality of power electrodes; and the power electrode set comprises a hollowed-out region provided with two second conductive structures.

In some examples, the second conductive layer further comprises a connection line extended in the second direction to divide the hollowed-out region into two hollowed-out sub-regions; and the two second conductive structures are disposed within the two hollowed-out sub-regions and located on two sides of the connection line, respectively.

In some examples, the display substrate further comprises a third conductive layer located on a side, close to the base substrate, of the first conductive layer, and a semiconductor layer located between the third conductive layer and the second metal layer; the second metal layer is on a side, close to the base substrate, of the third conductive layer; the sub-pixel comprises a reset transistor configured to reset a first electrode of a light emitting element and comprising an active layer located in the semiconductor layer; the display substrate comprises a first reset control line in the second metal layer and a second reset control line in the third conductive layer; the first reset control line and the second reset control line are each configured to control a gate voltage of the reset transistor, and orthographic projections of the first reset control line and the second reset control line on the base substrate are at least partially overlapped with each other.

At least an embodiment of the present disclosure further provides a display substrate, comprising a base substrate, and a plurality of sub-pixels located on the base substrate. Each of the plurality of sub-pixels comprises a pixel circuit configured to drive a light emitting element to emit light; a plurality of pixel circuits of the plurality of sub-pixels are arranged in a plurality of pixel rows extended along a first direction and a plurality of pixel columns extended along a second direction, and the first direction is different from the second direction; the pixel circuit comprises a driving transistor and a storage capacitor, and the driving transistor is configured to be connected to the light emitting element and to control a driving current flowing through the light emitting element; the storage capacitor comprises a first capacitor electrode configured to receive a first power voltage, and a second capacitor electrode; the plurality of sub-pixels comprise a first sub-pixel; the first sub-pixel further comprises a shielding electrode which is in a same layer and of an integrated structure with the first capacitor electrode of the first sub-pixel; the shielding electrode comprises a first shielding portion and a second shielding portion, the second shielding portion is extended from the first capacitor electrode in the second direction, and the first shielding portion is extended from the second shielding portion in the first direction; the display substrate further comprises a semiconductor pattern in a same semiconductor layer with an active layer of the driving transistor; and in a direction perpendicular to the base substrate, the first shielding portion is at least partially overlapped with the semiconductor pattern.

In some examples, the pixel circuit further comprises another transistor comprising a gate electrode, a first electrode, and a second electrode, and the first electrode and the second electrode of the another transistor are respectively connected to a second electrode and a gate electrode of the driving transistor; and the semiconductor pattern is configured as at least a portion of an active layer of the another transistor.

In some examples, the another transistor comprises a first gate electrode and a second gate electrode; the active layer of the another transistor comprises a first portion, a second portion, and a third portion; an orthographic projection of the first portion on the base substrate is overlapped with an orthographic projection of the first gate electrode on the base substrate; an orthographic projection of the second portion on the base substrate is overlapped with an orthographic projection of the second gate electrode on the base substrate; the third portion is located between the first portion and the second portion and connects the first portion to the second portion; and the semiconductor pattern is configured as the third portion of the active layer of the another transistor.

In some examples, the first shielding portion comprises a first sub-portion and a second sub-portion; an orthographic projection of the first sub-portion on the base substrate is overlapped with an orthographic projection of the semiconductor pattern on the base substrate, and an orthographic projection of the second sub-portion on the base substrate is not overlapped with the orthographic projection of the semiconductor pattern on the base substrate; and a size of the first sub-portion in the second direction is greater than a size of the second sub-portion in the second direction.

In some examples, the display substrate further comprises a power line on a side, away from the base substrate, of the first capacitor electrode; the power line is configured to be electrically connected to the first capacitor electrode of the first sub-pixel to provide the first power voltage.

In some examples, the first sub-pixel further comprises a connection electrode configured to electrically connect the gate electrode of the driving transistor of the first sub-pixel to the second electrode of the another transistor; and an orthographic projection of the connection electrode of the first sub-pixel on the base substrate is at least partially overlapped with an orthographic projection of the second shielding portion of the shielding electrode of the first sub-pixel on the base substrate in the first direction.

In some examples, the orthographic projection of the connection electrode of the first sub-pixel on the base substrate is within a range of an orthographic projection of the integrated structure of the first capacitor electrode and the shielding electrode of the first sub-pixel on the base substrate in the second direction.

In some examples, the pixel circuit further comprises a data writing transistor connected to the driving transistor; the display substrate further comprises a data line configured to be electrically connected to a first electrode of the data writing transistor to provide a data signal; the orthographic projection of the second shielding portion of the first sub-pixel on the base substrate is located between the orthographic projection of the connection electrode of the first sub-pixel on the base substrate and an orthographic projection of the data line on the base substrate.

At least an embodiment of the present disclosure further provides a display device, comprising the display substrate provided by any one of the above embodiments.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

DETAILED DESCRIPTION

The technical solutions of the embodiments will be described below in a clearly and fully understandable way in connection with the related drawings. Exemplary embodiments of the present disclosure and features and advantageous details thereof will be described more comprehensively. It should be noted the features shown drawings are not necessarily drawn in a real scale. The present disclosure omits descriptions of the knows materials, components, and process technologies, which does not make the exemplary embodiments of the present disclosure obscure. The examples are provided to make the implementation of the exemplary embodiments of the present disclosure better understood, so that those skilled in the art can implement the embodiments. Thus, these embodiments should not be limitative to the scope of the disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

Figure 1:
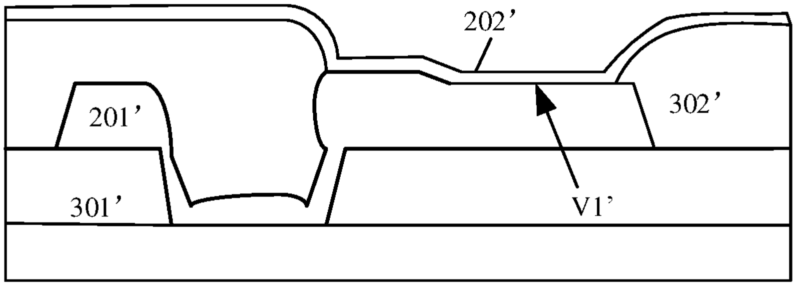
FIG. 1 is a schematic diagram of a display substrate.

FIG. 1 is a structural schematic diagram of a display substrate. As shown in FIG. 1, the display substrate includes a first insulating layer 301', a first conductive layer 201', a second insulating layer 302', and a second conductive layer 202' that are disposed on a base substrate (not shown) in sequence. A via hole V1' is formed in the second insulating layer 302', and the second conductive layer 202' is electrically connected to the first conductive layer 201' through the via hole V1'.

As shown in FIG. 1, the second conductive layer 202' is only lapped on an upper surface of the first conductive layer 201' with a limited lapping area and great contact resistance, which is not conducive to rapid transfer of an electrical signal.

At least one embodiment of the present disclosure provides a display substrate, including a base substrate, and a first insulating layer, a first conductive layer, a second insulating layer, and a second conductive layer that are disposed on the base substrate in sequence. The first insulating layer includes a first depression structure. The first conductive layer includes a first conductive structure including a bottom surface close to the base substrate, a top surface away from the base substrate, and a first side surface located between the bottom surface and the top surface. The second insulating layer includes a first via hole. The second conductive layer includes a second conductive structure. The second conductive structure is in contact with the first conductive structure through the first via hole. An orthographic projection of the first via hole on the base substrate overlaps at least in part an orthographic projection of the first depression structure on the base substrate. The first via hole exposes at least a portion of the first side surface of the first conductive structure, and the second conductive structure is in contact with the at least portion of the first side surface of the first conductive structure.

The display substrate provided by at least one embodiment of the present disclosure is provided with the first via hole to expose at least a portion of the first side surface of the first conductive structure such that the second conductive structure is in contact with the first side surface of the first conductive structure in addition to the upper surface of the first conductive structure, thereby effectively increasing the contact area of the first conductive structure and the second conductive structure. Not only is the contact resistance reduced and the transmission efficiency of electrical signals improved, but also the side surface of the first conductive structure can be protected, e.g., against erosion by water vapor. Moreover, such an arrangement further increases a cross-sectional area of the second conductive structure in a longitudinal direction (a direction perpendicular to the base substrate). Not only can the interference of the first conductive structure with other conductive structures in the substrate be effectively shielded, but also mutual interference between signal lines located on two sides of the second conductive structure can be reduced.

At least one embodiment of the present disclosure further provides a display substrate, including a base substrate, and a first insulating layer, a first conductive layer, a second insulating layer, and a second conductive layer that are disposed on the base substrate in sequence. The display substrate further includes a plurality of sub-pixels located on the base substrate and arranged in a plurality of pixel rows and a plurality of pixel columns in a first direction and in a second direction, and the first direction is different from the second direction. The first conductive layer includes a first conductive structure, a first signal line, and a second signal line that are spaced apart from one another. The first signal line and the second signal line extend in the second direction. The second conductive layer includes a second conductive structure. The first conductive structure includes a bottom surface close to the base substrate, a top surface away from the base substrate, and a first side surface located between the bottom surface and the top surface. The second insulating layer includes a first via hole, and the second conductive structure is in contact with the first conductive structure through the first via hole. The second conductive structure includes a first protrusion. The first via hole exposes at least a portion of the first side surface of the first conductive structure, and the first protrusion is in contact with the at least portion of the first side surface of the first conductive structure. An orthographic projection of the first protrusion on the base substrate is located between an orthographic projection of the first signal line on the base substrate and an orthographic projection of the second signal line on the base substrate.

In the display substrate provided by at least one embodiment of the present disclosure, the first protrusion of the second conductive structure is in contact with the first side surface of the first conductive structure. Not only is the contact area of the first conductive structure and the second conductive structure increased and the contact resistance therebetween reduced, but also the longitudinal cross-sectional area of the second conductive structure is effectively increased. The interference of the first conductive structure with other conductive structures in the substrate can be effectively shielded. Meanwhile, the first protrusion is disposed between the first signal line and the second signal line so that the mutual interference between the first signal line and the second signal line can also be reduced.

At least one embodiment of the present disclosure further provides a display substrate, including a base substrate, a first insulating layer, a first conductive layer, a second insulating layer, and a second conductive layer that are disposed on the base substrate in sequence, and a pixel electrode located on a side, away from the base substrate, of the second conductive layer. The pixel electrode is configured as a first electrode of a light emitting element and is electrically connected to the second conductive structure. The first insulating layer includes a first depression structure. The first conductive layer includes a first conductive structure, and the second conductive layer includes a second conductive structure. The first conductive structure includes a bottom surface close to the base substrate, a top surface away from the base substrate, and a first side surface located between the bottom surface and the top surface. The second insulating layer includes a first via hole, and the second conductive structure is in contact with the first conductive structure through the first via hole. An orthographic projection of the first via hole on the base substrate overlaps at least in part an orthographic projection of the first depression structure on the base substrate. The second conductive structure includes a first protrusion. The first via hole exposes at least a portion of the first side surface of the first conductive structure, and the first protrusion is in contact with the at least portion of the first side surface of the first conductive structure.

In the display substrate provided by at least one embodiment of the present disclosure, the first protrusion of the second conductive structure is in contact with the first side surface of the first conductive structure, thereby effectively increasing the contact area of the first conductive structure and the second conductive structure, reducing the contact resistance, and improving the transmission efficiency of electrical signals. Moreover, since such an arrangement further increases a cross-sectional area of the second conductive structure in a longitudinal direction (a direction perpendicular to the base substrate), not only can the interference of the first conductive structure with other conductive structures in the substrate be effectively shielded, but also mutual interference between signal lines located on two sides of the second conductive structure can be reduced.

At least one embodiment of the present disclosure further provides a display substrate, including a base substrate, and a first insulating layer, a first conductive layer, a second insulating layer, and a second conductive layer that are disposed on the base substrate in sequence. The first insulating layer includes a first depression structure. The first conductive layer includes a first conductive structure including a bottom surface close to the base substrate, a top surface away from the base substrate, and a first side surface located between the bottom surface and the top surface. The second insulating layer includes a first via hole. The second conductive layer includes a second conductive structure. An orthographic projection of the first via hole on the base substrate overlaps at least in part an orthographic projection of the first depression structure on the base substrate. The first via hole exposes at least a portion of the first side surface of the first conductive structure, and the second conductive structure is in contact with the at least portion of the first side surface of the first conductive structure. The first side surface of the first conductive structure includes a protruding curved surface, and the second conductive structure covers at least a portion of the protruding curved surface. The first conductive structure includes a connection portion located in the first depression structure and connected to the protruding curved surface. In a direction parallel to a surface of the base substrate, the protruding curved surface protrudes towards a middle of the first depression structure relative to the connection portion.

In the display substrate provided by at least one embodiment of the present disclosure, with the above arrangement, not only can the contact area of the first conductive structure and the second conductive structure be effectively increased and the contact resistance reduced, but also a slope of a lapping portion of the second conductive structure and the first side surface can be mitigated such that the second conductive structure is not broken due to great steepness.

At least one embodiment of the present disclosure further provides a display substrate, including a base substrate, and a first insulating layer, a first conductive layer, a second insulating layer, and a second conductive layer that are disposed on the base substrate in sequence. The first conductive layer includes a first conductive structure. The second conductive layer includes a second conductive structure. The first conductive layer includes a first conductive structure including a bottom surface close to the base substrate, a top surface away from the base substrate, and a first side surface located between the bottom surface and the top surface. The second insulating layer includes a first via hole, and the second conductive structure is in contact with the first conductive structure through the first via hole. The second conductive structure includes a first protrusion. The first via hole exposes at least a portion of the first side surface of the first conductive structure, and the first protrusion is in contact with the at least portion of the first side surface of the first conductive structure. The first insulating layer includes a first depression structure and a second depression structure spaced apart from each other. The first conductive structure further includes a second side surface located between the bottom surface and the top surface, and the first side surface is opposite to the second side surface. At least a portion of the first conductive structure is located in the first depression structure and the second depression structure separately.

In the display substrate provided by at least one embodiment of the present disclosure, with the above arrangement, contact relationships of the second insulating layer and the first conductive structure on two sides are similar such that forces acting on two sides of the first conductive structure are balanced, avoiding separation of the second insulating layer from the first conductive structure. Meanwhile, at least a portion of the first conductive structure is located in the depression structure and the second depression structure so that the connection strength of the first conductive structure and the first insulating layer can be improved, avoiding separation between film layers.

At least one embodiment of the present disclosure further provides a display substrate, including a base substrate, and a first metal layer, a second metal layer, a first conductive layer, and a second conductive layer that are disposed on the base substrate in sequence. The display substrate further includes a first sub-pixel and a second sub-pixel that are located on the base substrate and adjacent in a first direction. The first sub-pixel has a first pixel circuit, and the second sub-pixel has a second pixel circuit. The first pixel circuit and the second pixel circuit each include a capacitor that includes a first capacitor electrode located at the second metal layer and a second capacitor electrode located at the first metal layer. The first capacitor electrode of the first pixel circuit and the first capacitor electrode of the second pixel circuit are connected to each other into an integrated capacitor electrode block. The capacitor electrode block has a first opening and a second opening. An orthographic projection of the first opening on the base substrate overlaps an orthographic projection of the second capacitor electrode of the first pixel circuit on the base substrate, and an orthographic projection of the second opening on the base substrate overlaps an orthographic projection of the second capacitor electrode of the second pixel circuit on the base substrate. An area of the orthographic projection of the first opening on the base substrate is different from an area of the orthographic projection of the second opening on the base substrate.

Since adjacent sub-pixels in the first direction are usually different in color, and lightening voltages and data signals are different, a driving circuit needs to be adjusted to balance charging speeds of the two sub-pixels, so as to improve the uniformity of display. Openings of the capacitor electrodes of the two sub-pixels are different; that is, the two sub-pixels are allowed to have different capacitor electrodes and storage capacitors, and thus have different charging speeds, which is conducive to the improvement of the uniformity of display.

For example, the area of the orthographic projection of the first opening on the base substrate is smaller than the area of the orthographic projection of the second opening on the base substrate.

It needs to be noted that the side surface in the present disclosure may be formed by the depression of the top surface, i.e., may be continuous with the top surface.

At least one embodiment of the present disclosure further provides a display substrate, including a base substrate, and a plurality of sub-pixels located on the base substrate. Each of the plurality of sub-pixels includes a pixel circuit configured to drive a light emitting element to emit light. A plurality of pixel circuits of the plurality of sub-pixels are arranged in a plurality of pixel rows and a plurality of pixel columns in a first direction and a second direction, and the first direction is different from the second direction. The pixel circuit includes a driving transistor and a storage capacitor, and the driving transistor is configured to be connected to the light emitting element and to control a driving current flowing through the light emitting element. The storage capacitor includes a first capacitor electrode configured to receive a first power voltage, and a second capacitor electrode. The plurality of sub-pixels include a first sub-pixel. The first sub-pixel further includes a shielding electrode which is disposed in a same layer and of an integrated structure with the first capacitor electrode of the first sub-pixel. The shielding electrode includes a first shielding portion and a second shielding portion. The second shielding portion extends from the first capacitor electrode in the second direction, and the first shielding portion extends from the second shielding portion in the first direction. The display substrate further includes a semiconductor pattern in a same semiconductor layer with an active layer of the driving transistor. In a direction perpendicular to the base substrate, the first shielding portion overlaps at least in part the semiconductor pattern.

The properties of the semiconductor layer are prone to changing under illumination and thus become unstable. The first shielding portion is provided to shield the semiconductor pattern so that the stability of the semiconductor pattern can be improved. For example, the semiconductor pattern may be a portion of the active layer of the transistor, e.g., a semiconductor region or a conductor region. In this case, the above arrangement can effectively improve the stability of the transistor.

Figure 2:
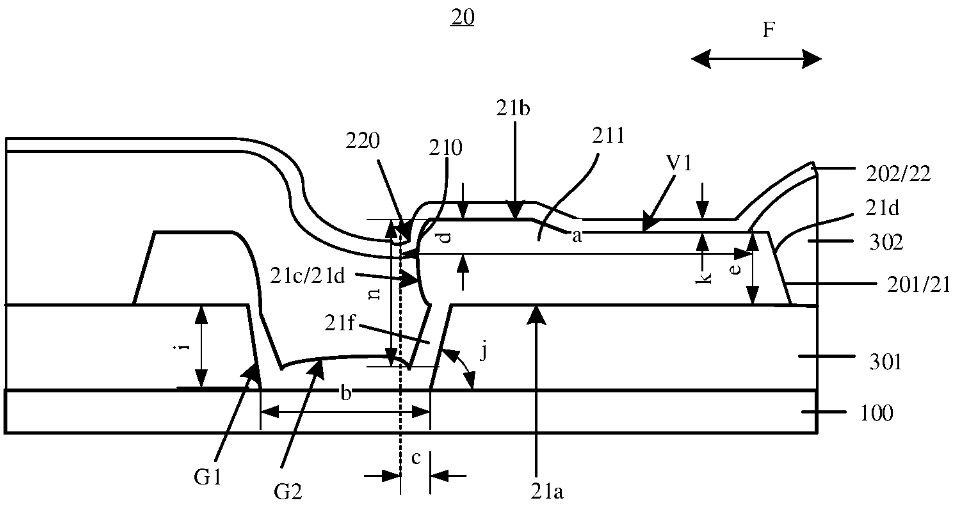
FIG. 2 is a first schematic diagram of a display substrate provided by at least one embodiment of the present disclosure.

FIG. 2 is a schematic diagram of a display substrate provided by at least one embodiment of the present disclosure. As shown in FIG. 2, the display substrate 20 includes a base substrate 100, and a first insulating layer 301, a first conductive layer 201, a second insulating layer 302, and a second conductive layer 202 that are disposed on the base substrate 100 in sequence. While the first insulating layer 101 is shown in the FIG. 2 as being directly located on the base substrate 100, the present disclosure is not limited thereto. In other examples, other film layers, such as other insulating layers or conductive layers, may also be disposed between the first insulating layer 101 and the base substrate 100.

As shown in FIG. 2, the first insulating layer 301 includes a depression structure G1 (an example of the first depression structure of the present disclosure). The depression structure G1 may penetrate or not penetrate the first insulating layer 301. For example, as shown in FIG. 2, the depression structure G1 may be a via hole. In another examples, the depression structure G1 may also be a groove. The disclosure has no particular limitation on the specific structure of the depression structure G1.

The first conductive layer 201 includes a first conductive structure 21. The first conductive structure 21 includes a depression structure G2. For example, as shown in FIG. 2, the depression structure G2 is formed by covering the depression structure G1 with the first conductive structure 21, and the first conductive structure 21 fills the depression structure G1 to form the depression structure G2. In a direction perpendicular to the base substrate 100, the depression structure G1 overlaps at least in part the depression structure G2.

The first conductive structure 21 includes a bottom surface 21*a* close to the base substrate 100, a top surface 21*b* away from the base substrate 100, and a first side surface 21*c* located between the bottom surface 21*a* and the top surface 21*b*. The first conductive structure 21 is depressed downwards to form the first side surface 21*c*. As shown in FIG. 2, the first side surface 21*c* may be a sidewall of the depression structure G2. A portion of the first side surface 21*c* that is in contact with the second conductive structure 22 is on a side, away from the base substrate, of the upper surface of the first insulating layer 301. The first side surface 21*c* and the top surface 21*b* are on a same side of the first conductive structure 21 and connected directly. The first side surface 21*c* and the bottom surface 21*a* are located on two sides of the first conductive structure 21, respectively.

The second insulating layer 302 includes a via hole V1 (an example of the first via hole of the present disclosure). The second conductive layer 202 includes a second conductive structure 22 which is in contact with the first conductive structure 21 through the via hole V1. An orthographic projection of the via hole V1 on the base substrate overlaps at least in part an orthographic projection of the depression structure G1 on the base substrate. The via hole V1 exposes at least a portion of the first side surface 21*c* of the first conductive structure 21, and the second conductive structure 22 is in contact with the at least portion of the first side surface 21*c* of the first conductive structure 21.

The via hole V1 is provided to expose at least a portion of the first side surface 21*c* of the first conductive structure 21 such that the second conductive structure 22 is in contact with the first side surface 21*c* of the first conductive structure 21 in addition to the upper surface 21*b* of the first conductive structure 21, thereby effectively increasing the contact area of the first conductive structure 21 and the second conductive structure 22, reducing the contact resistance, and improving the transmission efficiency of electrical signals. Moreover, such an arrangement further increases a cross-sectional area of the second conductive structure 22 in a longitudinal direction (the direction perpendicular to the base substrate). Not only can the interference of the first conductive structure with other conductive structures in the substrate be effectively shielded, but also mutual interference between signal lines located on two sides of the second conductive structure can be reduced.

For example, as shown in FIG. 2, the orthographic projection of the depression structure G1 on the base substrate overlaps at least in part the orthographic projection of the via hole V1 on the base substrate such that a portion, overlapping the depression structure G1, of the second insulating layer 302 is depressed downwards to expose the first sided surface 21*c* of the first conductive structure 21. Thus, the second conductive structure 22 is in contact with not only the top surface 21*b* of the first conductive structure 21 but also the first side surface 21*c*.

As shown in FIG. 2, the second conductive structure 22 includes a protrusion 220 (an example of the first protrusion of the present disclosure). The protrusion 220 protrudes downwards, i.e., protrudes towards the base substrate 100. An orthographic projection of the protrusion 220 on the base substrate 100 is located within the orthographic projection of the depression structure G1 on the base substrate. The protrusion 220 is in contact with at least a portion of the first side surface 21*c* of the first conductive structure 21. The protrusion 220 effectively increases the cross-sectional area of the second conductive structure 22 in the longitudinal direction.

As shown in FIG. 2, the first side surface 21*c* of the first conductive structure 21 includes a protruding curved surface 21*d*, and the protrusion 220 of the second conductive structure 22 covers at least a portion of the protruding curved surface.

As shown in FIG. 2, the first conductive structure 21 includes a connection portion 21*f* located in the first depression structure G1 and connected to the protruding curved surface 21*d*. In a direction parallel to surface of the base substrate 100, the protruding curved surface 21*d* protrudes towards a middle of the first depression structure G1 relative to the connection portion 21*f*.

Since at least a portion, which is in contact with the second conductive structure 22, of the first side surface 21*c* is the protruding curved surface, not only can the contact surface be further increased, but also the slope of the lapping portion of the second conductive structure 22 and the first side surface 21*c* can be mitigated such that the protrusion 220 is not broken due to great steepness.

For example, within the cross section (an example of the first cross section of the present disclosure) shown in FIG. 2, an included angle between a tangent line of the protruding curved surface and the top surface 21*b* of the first conductive structure 21 is greater than 70 degrees and gradually decreases from top to bottom.

As shown in FIG. 2, the first conductive structure 21 includes a contact portion 211 that is located on a side, away from the base substrate, of the first insulating layer 301 and in contact with the second conductive structure 22. The contact portion 211 may be regarded as, for example, a longitudinal segment, within a range of contact with the second conductive structure 22, of the first conductive structure 21.

As shown in FIG. 2, the contact portion 211 includes a protrusion 210 (an example of the second protrusion of the present disclosure) facing the depression structure G1. An orthographic projection of the protrusion 210 on the base substrate is within the orthographic projection of the depression structure G1 on the base substrate. For example, as shown in FIG. 2, the protrusion 210 is an end portion, close to the depression structure G1, of the contact portion 211, and is a portion of the top surface of the contact portion 211 that protrudes towards the depression structure G1 relative to the bottom surface. As shown in FIG. 2, the surface, facing the depression structure G1, of the protrusion 210 is a portion of the first side surface 21*c*.

For example, as shown in FIG. 2, in a reference direction F parallel to the surface of the base substrate, a maximum size of the protrusion 210 is greater than a maximum thickness of a portion, covering a side surface (sidewall) of the depression structure G1, of the first conductive structure 21.

As shown in FIG. 2, the side surface, close to the depression structure G1, of the contact portion 211 is a portion of the first side surface 21*c*, namely the portion of the first side surface 21*c* that is located on the side, away from the base substrate, of the upper surface of the first insulating layer 301. This portion is referred to as a first side surface portion. The first conductive structure 21 further includes a second side surface 21*e* away from the depression structure G1. A size of the first side surface portion in the direction perpendicular to the base substrate is greater than a size of the second side surface 21*e* in the direction perpendicular to the base substrate. As shown in FIG. 2, the second side surface 21*e* is not in contact with the second conductive structure 22. For example, at least a portion of the top surface 21*b* of the first conductive structure 21 that is connected to the second side surface 21*e* is separated from the second conductive layer 202.

Since the first side surface portion is in contact with the second conductive structure 22 and the second side surface 21*e* is not in contact with the second conductive structure 22, the longitudinal size of the first side surface portion is large such that the flatness of the portion of the second conductive structure 22 that is in contact with the top surface 21*b* of the first conductive structure 21 can be improved, thus improving the yield of the subsequent fabrication process.

Within the cross section shown in FIG. 2 and in the reference direction F, the maximum size of the protrusion 210 is greater than the maximum thickness of the portion (i.e., the sidewall of the depression structure G2 that is located within the depression structure G1), covering the side surface of the depression structure G1, of the first conductive structure 21. The reference direction F is parallel to the surface of the base substrate. Such an arrangement is convenient for the lapping of the protrusion 220 with the protrusion 210.

For example, as shown in FIG. 2, the display substrate 20 has a first cross section, i.e., the cross section shown in FIG. 2. A size of the depression structure G1 within the first cross section and in the reference direction F is denoted as b. Within the first cross section, a size of an overlapping region of the via hole V1 and the first depression structure G1 in the reference direction F is denoted as c. For example, as shown in FIG. 2, when calculating an overlapping region of the depression structure or the via hole structure with other structure, a distance between the lowest points of the depression structure or the via hole structure within the first cross section is regarded as a range of the depression structure or the via hole structure. This is the same as above in the following embodiments, which will not be described redundantly.

A size of a portion, covered by the second conductive structure 22, of the first side surface 21*c* of the first conductive structure 21 in the direction perpendicular to the base substrate 100 is denoted as d, and a size of the contact portion 211 of the first conductive structure 21 in the direction perpendicular to the base substrate is denoted as e.

For example, a size (n−d) of a portion, not covered by the second conductive structure 22, of the first side surface portion 21*c* in the direction perpendicular to the base substrate is greater than the size e of the second side surface 21*e* in the direction perpendicular to the base substrate.

For example, c/b is greater than 0.1, and d/e is greater than 0.3.

A ratio r1 of a size of the first side surface portion 21*c* of the first conductive structure 21 that is covered by the second conductive structure 22 to the size of the first side surface portion 21*c* is in a positive correlation relationship with a ratio r2 of an overlapping size of the via hole V1 and the depression structure G1 to the size of the depression structure G1; that is, the larger the overlapping ratio r2 of the via hole V1 and the depression structure G1, the larger the size of the first side surface portion 21*c* of the first conductive structure 21 that is covered by the second conductive structure 22. With the above arrangement, the second conductive structure 22 can effectively cover the side surface of the first conductive structure 21, thus effectively reducing the contact resistance thereof.

For example, the second conducive layer 202 and the first conductive layer 201 are different in material. For example, the second conducive layer 202 includes an ITO/Ag/ITO stacked structure, and the first conductive layer 201 includes a TI/AL/TI stacked structure.

For example, c/b is greater than 0.15, and d/e is less than 0.8.

For example, c/b is less than 0.19, and d/e is less than 0.5.

For example, in the case where the second conductive structure 22 is configured as a pixel electrode (e.g., a positive electrode) of a light emitting element, since a light emitting material is formed on a surface of the second conductive structure 22, the performance of the light emitting material may be affected by the surface flatness of the second conductive structure 22. If the flatness of the second conductive structure 22 is too low, the light emission efficiency of the light emitting element will be reduced. The overlapping size of the via hole V1 and the depression structure G1 is made small as much as possible within a certain range so that the flatness of the second conductive structure 22 can be improved, thus improving the display performance of the display substrate.

For example, as shown in FIG. 2, within the first cross section, a maximum depth of the depression structure G1 is denoted as i; an included angle formed by a side edge of the depression structure G1 within the first cross section and the surface of the base substrate is denoted as j; and a size of a portion, in contact with the first conductive structure 21, of the second conductive structure 22 in the direction perpendicular to the base substrate is denoted as k. As shown in FIG. 2, a shape of the depression structure G1 within the first cross section is an inverted trapezoid. For example, the side edge is the one on a side, close to the protrusion 210, of the depression structure G1.

For example, $d/e<0.0273*i*\sin(j)/k$.

For example, $c/b<0.0102*i*\sin(j)/k$.

The covered size of the first side surface 21*c* is positively correlated to the depth of the depression structure G1 and a base angle of the depression structure G1 and negatively correlated to a thickness of the second conductive layer 202.

By reducing d/e or c/b within a certain range, the overlap of the via hole V1 and the depression structure G1 can be reduced, thus reducing the size of the downward protrusion 220 of the second conductive structure 22 and improving the flatness of the second conductive structure 22.

For example, a size of the first side surface 21*c* in the direction perpendicular to the base substrate is denoted as n, and a size of the second side surface portion in the direction perpendicular to the base substrate 100 is denoted as e. For example, 0.1*(n/e)/sin(j)>(d/n).

The greater a ratio (n/e) of the size of the first side surface 21*c* to the size of the second side surface 21*e*, the larger the area of the first side surface 21*c* needing to be covered. That is, n/e is proportional to d/n. The larger the base angle of the depression structure G1, the greater a slope of a corresponding sidewall of the depression structure G1, and the less the water vapor is likely to stay on the surface and the less the surface needs to be covered. That is, sin(j) is inversely proportional to d/n. The value of d/n is adjusted according to the values of n/e and sin(j) such that the exposed side surface of the first conductive structure is protected sufficiently, reducing corrosion by water vapor and prolonging the operating life of the first conductive structure.

For example, 0.08*(n/e)/sin(j)>d/n.

With the above arrangement, the covered size of the first side surface 21*c* is made smaller, thus improving the flatness of the second conductive structure 22.

In an example, b=2.821 um, c=0.599 um, c/b=0.212, d=0.3339 um, e=0.5872 um, and d/e=0.569.

In another example, b=2.816 um, c=0.6465, c/b=0.2296, d=0.5603 um, e=0.8477, and d/e=0.661 um.

Figure 3:
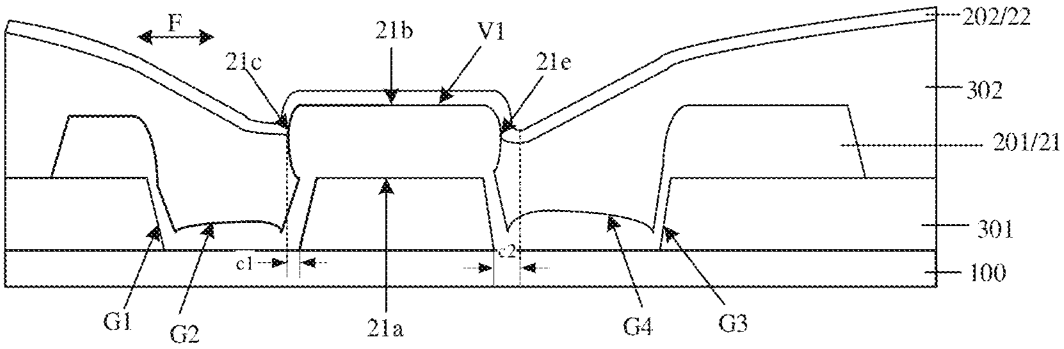
FIG. 3 is a second schematic diagram of a display substrate provided by at least one embodiment of the present disclosure.

FIG. 3 is a schematic diagram of a display substrate provided by some other embodiments of the present disclosure. As shown in FIG. 3, the first insulating layer 301 further includes a depression structure G3 (an example of the second depression structure of the present disclosure) spaced apart from the depression structure G1. The depression structure G2 may penetrate or not penetrate the first insulating layer 301. For example, as shown in FIG. 3, the depression structure G2 may be a via hole. In another examples, the depression structure G2 may also be a groove. The disclosure has no particular limitation on the specific structure of the depression structure G2.

As shown in FIG. 3, for example, the first conductive structure 21 further includes a depression structure G4. For example, the depression structure G4 is formed by covering the depression structure G3 with the first conductive structure 21. The first conductive structure 21 fills the depression structure G3 to form the depression structure G4. In the direction perpendicular to the base substrate 100, the depression structure G3 overlaps at least in part the depression structure G4.

As shown in FIG. 3, the first conductive structure 21 further includes a second side surface 21*e* located between the bottom surface 21*a* and the top surface 21*b* thereof, and the second side surface 21*e* is opposite to the first side surface 21*c*. For example, the second side surface 21*e* is connected to the first side surface 21*c* by the top surface 21*b*.

For example, an orthographic projection of the second side surface 21*e* on the base substrate overlaps at least in part an orthographic projection of the depression structure G3 on the base substrate. The first via hole V1 further exposes at least a portion of the second side surface 21*e*, and the second conductive structure 22 further covers the at least portion of the second side surface 21*e* of the first conductive structure 21.

The depression structure G1 and the depression structure G3 are located on two sides of the via hole V1, respectively, and both overlap at least in part the via hole V1 in the direction perpendicular to the base substrate such that the second insulating layer 302 is depressed downwards to expose respectively a portion of the first side surface 21*c* and a portion of the second side surface 21*e*; that is, the first conductive structure 21 exhibits a morphology of protruding upwards in the via hole V1. The second conductive structure 22 is in contact with the top surface 21*b*, the first side surface 21*c*, and the second side surface 21*e* of the first conductive structure, thus further increasing the contact area, reducing the contact resistance, and improving the shielding capability and the protection capability.

For example, within the cross section shown in FIG. 3, the size of the portion, covered by the second conductive structure 22, of the first side surface 21*c* of the first conductive structure 21 is different from a size of a portion, covered by the second conductive structure 22, of the second side surface 21*e* thereof.

For example, as shown in FIG. 3, an overlapping area of the orthographic projection of the via hole V1 on the base substrate and the orthographic projection of the depression structure G1 on the base substrate is different from an overlapping area of the orthographic projection of the via hole V1 on the base substrate and the orthographic projection of the depression structure G2 on the base substrate.

For example, as shown in FIG. 3, in the reference direction F parallel to the surface of the base substrate, an overlapping size c1 of the orthographic projection of the via hole V1 on the base substrate and the orthographic projection of the depression structure G1 on the base substrate is different from an overlapping size c2 of the orthographic projection of the via hole V1 on the base substrate and the orthographic projection of the depression structure G2 on the base substrate.

Figure 4:
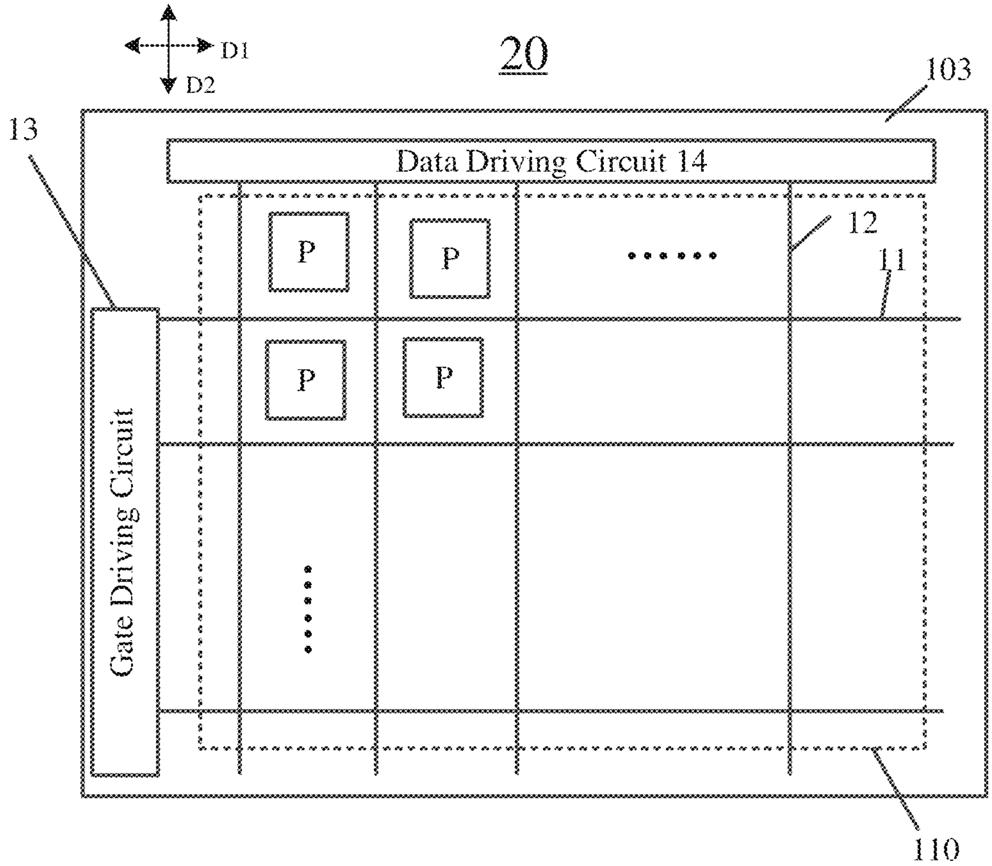
FIG. 4 is a third schematic diagram of a display substrate provided by at least one embodiment of the present disclosure.

FIG. 4 is a planar schematic diagram of a display substrate provided by at least one embodiment of the present disclosure. The cross-sectional structures shown in FIG. 2 and FIG. 3 may be, for example, the cross-sectional structure of the display substrate shown in FIG. 4.

As shown in FIG. 4, the display substrate 20 includes a display region 110 and a non-display region 103 outside the display region 110. For example, the non-display region 103 is located at a peripheral region of the display region 110. The display substrate 20 includes a plurality of sub-pixels P located in the display region 110. For example, the plurality of sub-pixels are arranged in an array, e.g., arranged in a plurality of pixel rows and a plurality of pixel columns in a first direction D1 and a second direction D2. The first direction D1 and the second direction D2 are different, e.g., orthogonal to each other. For example, the pixel rows and the pixel columns do not necessarily extend in straight lines, and may also extend along a curve (e.g., broken lines); for example, the curve extends in the first direction D1 or the second direction D2 as a whole.

Each sub-pixel includes a pixel circuit for driving a light emitting element to emit light. A plurality of pixel circuits are arranged in an array in the first direction D1 and the second direction D2. For example, the sub-pixels form a pixel unit in a traditional RGB way to realize full-color display. The present disclosure has no limitations on the arrangement way of the sub-pixels and the way of realizing the full-color display.

For example, as shown in FIG. 4, the display substrate 20 further includes wires (e.g., gate lines 11) extended in the first direction D1 and a plurality of wires (e.g., data lines 12)

extended in the second direction D2 in the display region 110. The plurality of transverse wires and the plurality of longitudinal wires cross each other to define a plurality of pixel regions in the display region 110. Each pixel region is correspondingly provided with one sub-pixel 100. FIG. 2 merely illustrates a rough positional relationship of the gate lines 11, the data lines 12, and the sub-pixels 100 in the display substrate, which may be specifically designed according to actual requirements.

For example, the pixel circuit may be an nTmC (n and m are positive integers), such as 2T1C (i.e., two transistors and one capacitor), 4T2C, 5T1C, or 7T1C, pixel circuit. Moreover, in different embodiments, the pixel circuit may further include a compensating sub-circuit which includes an internal compensating sub-circuit or an external compensating sub-circuit. The compensating sub-circuit may include a transistor, a capacitor, etc. For example, as needed, the pixel circuit may further include a reset circuit, a light emitting control sub-circuit, a detection circuit, etc. For example, the display substrate may further include a gate driving circuit 13 and a data driving circuit 14 that are located in the non-display region. The gate driving circuit 13 is connected to the pixel circuits through the gate lines 11 to provide various scanning signals, and the data driving circuit 14 is connected to the pixel circuits through the data lines 12 to provide data signals. The positional relationship of the gate driving circuit 13, the data driving circuit 14, the gate lines 11, and the data lines 12 illustrated in FIG. 4 is merely an example, and actual arrangement positions may be designed as needed.

For example, the display substrate 20 may further include a control circuit (not shown). For example, the control circuit is configured to control the data driving circuit 14 to apply the data signals and to control the gate driving-circuit to apply the scanning signals. One example of the control circuit is a timing control circuit (T-con). The control circuit may take various forms, for example, include a processor and a memory. The memory includes an executable code, and the processor runs the executable code to perform the above-mentioned detection method.

For example, the processor may be a central processing unit (CPU) or a processing unit in other form having data processing capability and/or instruction executing capability, for example, may include a microprocessor, a programmable logic controller (PLC), etc.

For example, the memory may include one or more computer program products. The computer program product may include a computer readable storage medium in any form, for example, a volatile memory and/or a nonvolatile memory. The volatile memory may include, for example, a random access memory (RAM) and/or a cache, etc. The nonvolatile memory may include, for example, a read only memory (ROM), a hard disk, a flash memory, etc. One or more computer program instruction may be stored on the computer readable storage medium, and the processor may run a function desired by the program instructions. Various application programs and various kinds of data may also be stored on the computer readable storage medium.

Figure 5A:
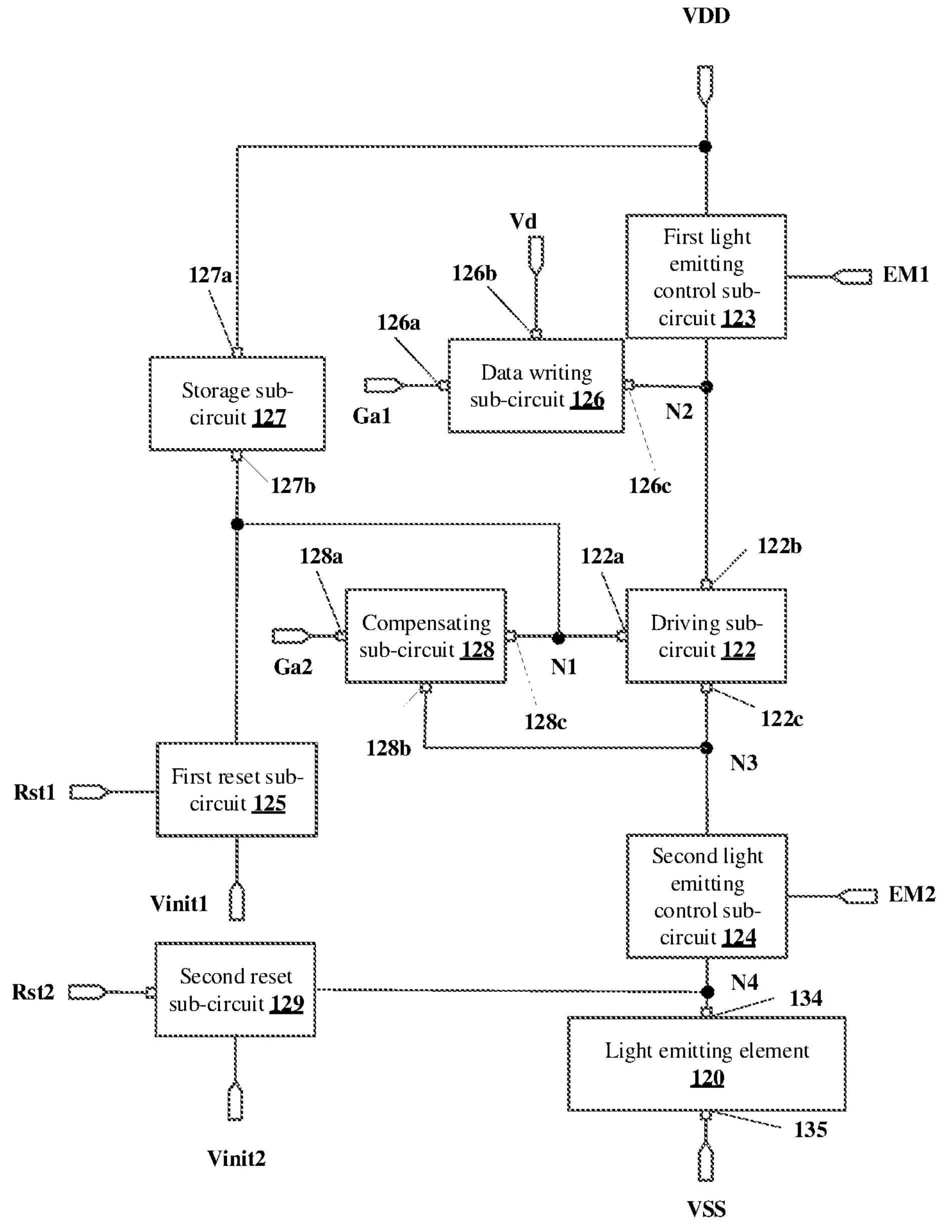
FIG. 5A is a schematic diagram of a pixel circuit provided by at least one embodiment of the present disclosure.

The pixel circuit may include a driving sub-circuit, a data writing sub-circuit, a compensating sub-circuit, and a storage sub-circuit, and may further include a light emitting control sub-circuit, a reset circuit, and the like as needed. FIG. 5A illustrates a schematic diagram of a pixel circuit.

As shown in FIG. 5A, the pixel circuit includes a driving sub-circuit 122, a data writing sub-circuit 126, and a compensating sub-circuit 128.

For example, the driving sub-circuit 122 includes a control terminal (i.e., a control electrode) 122*a*, a first terminal 122*b*, and a second terminal 122*c*, and is configured to be connected to a light emitting element 120 and to control a driving current for driving the light emitting element 120 based on a voltage on the control electrode. The control terminal 122*a* of the driving sub-circuit 122 is connected to a first node N1, and the first terminal 122*b* of the driving sub-circuit 122 connected to a second node N2, and the second terminal 122*c* of the driving sub-circuit 122 connected to a third node N3.

For example, the data writing sub-circuit 126 is connected to the driving sub-circuit 122 and configured to write a data signal to the first terminal 122*b* of the driving sub-circuit 122 in response to a first scanning signal. For example, as shown in FIG. 5A, the data writing sub-circuit 126 includes a control terminal 126*a* configured to receive the first scanning signal Ga1, a first terminal 126*b* configured to receive the data signal Vd, and a second terminal 126*c* connected to the first terminal 122*b* (i.e., the second node N2) of the driving sub-circuit 122. The data writing sub-circuit 126 is configured to write the data signal Vd to the first terminal 122*b* of the driving sub-circuit 122 in response to the first scanning signal Ga1. For example, the first terminal 126*b* of the data writing sub-circuit 126 is connected to a data line 12 to receive the data signal Vd, and the control terminal 126*a* is connected to a gate line 11 as a scan line to receive the first scanning signal Ga1. For example, at a data writing and compensation phase, the data writing sub-circuit 126 may be switched on in response to the first scanning signal Ga1 so that the data signal can be written to the first terminal 122*b* (the second node N2) of the driving sub-circuit 122, and the data signal is stored so that a driving current for driving the light emitting element 120 to emit light can be generated according to the data signal, e.g., at a light emitting phase.

For example, the compensating sub-circuit 128 is connected to the driving sub-circuit 122 and configured to compensate the driving sub-circuit 122 in response to a second scanning signal. The second scanning signal may be identical to or different from the first scanning signal. For example, as shown FIG. 5A, the compensating sub-circuit 128 includes a control terminal 128*a*, a first terminal 128*b*, and a second terminal 128*c*. The control terminal 128*a* of the compensating sub-circuit 128 is configured to receive the second scanning signal Ga2. The first terminal 128*b* and the second terminal 128*c* of the compensating sub-circuit 128 are electrically connected to the second terminal 122*c* and the control terminal 122*a* of the driving sub-circuit 122, respectively. The compensating sub-circuit 128 is configured to perform threshold compensation on the driving sub-circuit 122 in response to the second scanning signal Ga2.

For example, the pixel circuit further includes a storage sub-circuit 127, a first light emitting control sub-circuit 123, a second light emitting control sub-circuit 124, a first reset sub-circuit 125, and a second reset sub-circuit 129.

For example, the first scanning signal Ga1 may be identical to the second scanning signal Ga2. For example, the first scanning signal Ga1 and the second scanning signal Ga2 may be connected to a same signal output terminal. For example, the first scanning signal Ga1 and the second scanning signal Ga2 may be transmitted through a same scan line.

In some other examples, the first scanning signal Ga1 may also be different from the second scanning signal Ga2. For example, the first scanning signal Ga1 and the second scanning signal Ga2 may be connected to different signal output terminals, respectively. For example, the first scanning signal Ga1 and the second scanning signal Ga2 may be transmitted through different scan lines, respectively.

The storage sub-circuit 127 includes a first terminal (also referred to as a first storage electrode) 127*a* and a second terminal (also referred to as a second storage electrode) 127*b*. The first terminal 127*a* of the storage sub-circuit is configured to receive a first power voltage VDD, and the second terminal 127*b* of the storage sub-circuit is electrically connected to the control terminal 122*a* of the driving sub-circuit. For example, at the data writing and compensation phase, the compensating sub-circuit 128 may be switched on in response to the second scanning signal Ga2 so that the data signal written by the data writing sub-circuit 126 can be stored in the storage sub-circuit 127. Meanwhile, the compensating sub-circuit 128 may electrically connect the control terminal 122*a* and the second terminal 122*c* of the driving sub-circuit 122 so that related information of a threshold voltage of the driving sub-circuit 122 can be correspondingly stored in the storage sub-circuit. Thus, the stored data signal and threshold voltage may be used to control the driving sub-circuit 122, e.g., at the light emitting phase such that the output of the driving sub-circuit 122 is compensated.

For example, the storage sub-circuit 127 is electrically connected to the control terminal 122*a* of the driving sub-circuit 122 and a first voltage terminal VDD and configured to store the data signal written by the data writing sub-circuit 126. For example, at the data writing and compensation phase, the compensating sub-circuit 128 may be switched on in response to the second scanning signal Ga2 so that the data signal written by the data writing sub-circuit 126 can be stored in the storage sub-circuit 127. For example, at the data writing and compensation phase, the compensating sub-circuit 128 may electrically connect the control terminal 122*a* and the second terminal 122*c* of the driving sub-circuit 122 so that related information of the threshold voltage of the driving sub-circuit 122 can be correspondingly stored in the storage sub-circuit. Thus, the stored data signal and threshold voltage may be used to control the driving sub-circuit 122, e.g., at the light emitting phase such that the output of the driving sub-circuit 122 is compensated.

For example, the first light emitting control sub-circuit 123 is connected to the first terminal 122*b* (the second node N2) of the driving sub-circuit 122 and the first voltage terminal VDD and configured to apply a first power voltage of the first voltage terminal VDD to the first terminal 122*b* of the driving sub-circuit 122 in response to a first light emitting control signal EM1. For example, as shown in FIG. 5A, the first light emitting control sub-circuit 123 is connected to a first light emitting control terminal EM1, the voltage terminal VDD, and the second node N2.

For example, the second light emitting control sub-circuit 124 is connected to a second light emitting control terminal EM2, a first terminal 134 of the light emitting element 120, and the second terminal 122*c* of the driving sub-circuit 122, and configured to enable a driving current to be applied to the driving sub-circuit 122 in response to a second light emitting control signal.

For example, at the light emitting phase, the second light emitting control sub-circuit 123 is switched on in response to the second light emitting control signal EM2 provided by the second light emitting control terminal EM2 so that the driving sub-circuit 122 can be electrically connected to the light emitting element 120 through the second light emitting control sub-circuit 123, thereby driving the light emitting element 120 to emit light under the control of the driving current. At a non-light-emitting phase, the second light emitting control sub-circuit 123 is switched off in response to the second light emitting control signal EM2, avoiding a current from flowing through the light emitting element 120 to allow it to emit light. A contrast of a corresponding display device can be increased.

For another example, at an initialization phase, the second light emitting control sub-circuit 124 may also be switched on in response to the second light emitting control signal and thus can be combined with a reset circuit to reset the driving sub-circuit 122 and the light emitting element 120.

For example, the second light emitting control signal EM2 may be identical to the first light emitting control signal EM1. For example, the second light emitting control signal EM2 and the first light emitting control signal EM may be connected to a same signal output terminal. For example, the second light emitting control signal EM2 and the first light emitting control signal EM may be transmitted through a same light emitting control line.

For some other examples, the second light emitting control signal EM2 may be different from the first light emitting control signal EM1. For example, the second light emitting control signal EM2 and the first light emitting control signal EM1 may be connected to different signal output terminals, respectively. For example, the second light emitting control signal EM2 and the first light emitting control signal EM1 may be transmitted through different light emitting control lines, respectively.

For example, the first reset sub-circuit 125 is connected to a first reset voltage terminal Vinit1 and the control terminal 122*a* (the first node N1) of the driving sub-circuit 122, and configured to apply a first reset voltage Vinit1 to the control terminal 122*a* of the driving sub-circuit 122 in response to a first reset control signal Rst1.

For example, the second reset sub-circuit 129 is connected to a second reset voltage terminal Vinit2 and a first terminal 134 (a fourth node N4) of the light emitting element 120, and configured to apply a second reset voltage Vinit2 to the first terminal 134 of the light emitting element 120 in response to a second reset control signal Rst2. For example, the first reset voltage Vinit1 and the second reset voltage Vinit2 may be a same voltage signal or different voltage signal. For example, the first reset voltage Vinit1 and the second reset voltage Vinit2 are connected to a same reset voltage source terminal (e.g., located in the non-display region) to receive the same reset voltage.

For example, the first reset sub-circuit 125 and the second reset sub-circuit 129 may be switched on in response to the first reset control signal Rst1 and the second reset control signal Rst2, respectively, so that the second reset voltage Vinit2 and the first reset voltage Vinit1 can be applied to the first node N1 and the first terminal 134 of the light emitting element 120, respectively. Thus, the driving sub-circuit 122, the compensating sub-circuit 128, and the light emitting element 120 can be reset, eliminating the influence of a previous light emitting phase.

For example, the second reset control signal Rst2 for each row of sub-pixels and the first scanning signal Ga1 for the row of sub-pixels may be a same signal and may be transmitted through a same gate line 11. For example, the first reset control signal Rst1 for each row of sub-pixels and the first scanning signal Ga1 for a previous row of sub-pixels may be transmitted through a same gate line 11.

For example, the light emitting element 120 includes the first terminal (also referred to as a first electrode or a pixel electrode) 134 and a second terminal (also referred to as a second electrode) 135. The first terminal 134 of the light emitting element 120 is connected to the fourth node, and the second terminal 135 of the light emitting element 120 is configured to be connected to a second voltage terminal VSS. For example, in an example, as shown in FIG. 5A, the second terminal 122*c* of the driving sub-circuit 122 may be connected to the fourth node N4 through the second light emitting control sub-circuit 124. The embodiments of the present disclosure include but are not limited thereto.

It needs to be noted that in the description of the embodiments of the present disclosure, the first node N1, the second node N2, the third node N3, and the fourth node N4 do not necessarily represent actually existing components, and instead, represent junctions of related circuit connections in a circuit diagram.

It needs to be noted that in the description of the embodiments of the present disclosure, symbol Vd may represent either a data signal terminal or a level of a data signal. Likewise, symbols Ga1 and Ga2 may represent either a first scanning signal and a second scanning signal or a first scanning signal terminal and a second scanning signal terminal; symbols Rst1 and Rst2 may represent either reset control terminals or reset control signals; symbols Vinit1 and Vinit2 may represent either a first reset voltage terminal and a second reset voltage terminal or a first reset voltage and a second reset voltage; symbol VDD may represent either a first voltage terminal or a first power voltage; and symbol VSS may represent either a second voltage terminal or a second power voltage. These are the same as above in the following embodiments, which will not be described redundantly.

Figure 5B:
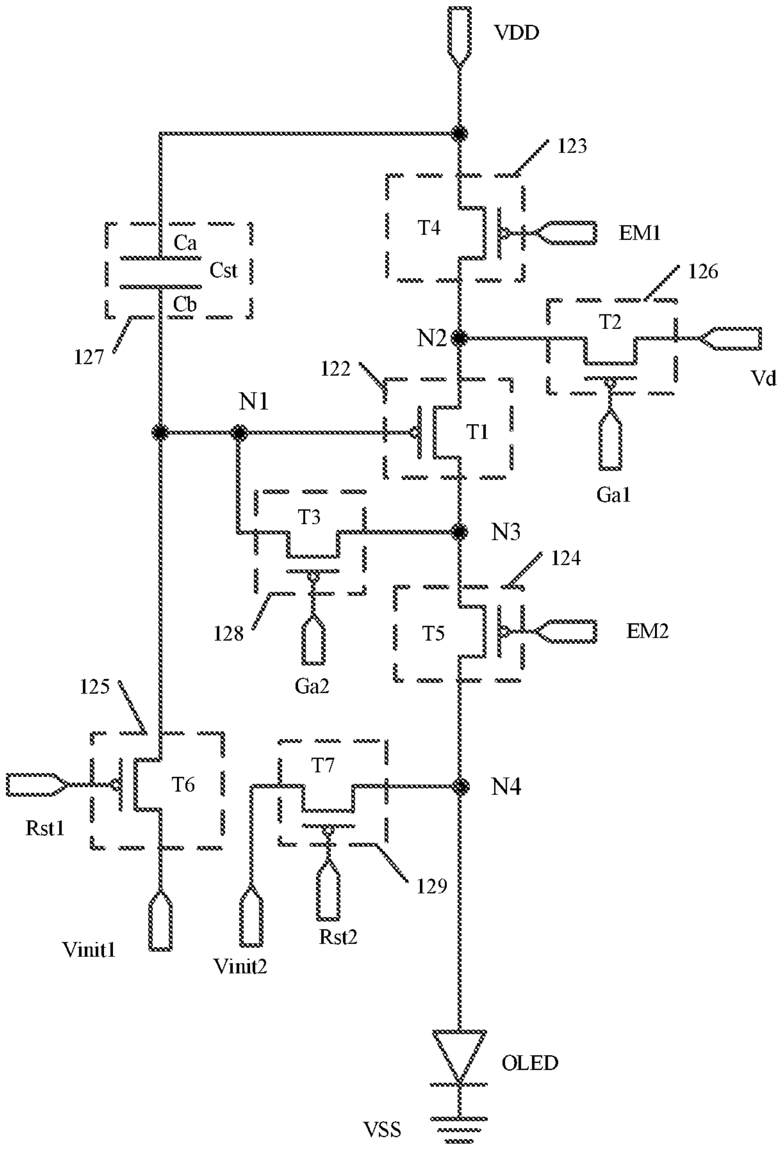
FIG. 5B is a circuit diagram of a specific implementation example of the pixel circuit shown in FIG. 5A.

FIG. 5B is a circuit diagram of a specific implementation example of the pixel circuit shown in FIG. 5A. As shown in FIG. 5B, the pixel circuit includes first to seventh transistors T1, T2, T3, T4, T5, T6, and T7 and a storage capacitor Cst.

For example, as shown in FIG. 5B, the driving sub-circuit 122 may be implemented as the first transistor T1 (i.e., a driving transistor). A gate of the first transistor T1 acts as the control terminal 122*a* of the driving sub-circuit 122 and is connected to the first node N1. A first electrode of the first transistor T1 acts as the first terminal 122*b* of the driving sub-circuit 122 and is connected to the second node N2. A second electrode of the first transistor T1 acts as the second terminal 122*c* of the driving sub-circuit 122 and is connected to the third node N3.

For example, as shown in FIG. 5B, the data writing sub-circuit 126 may be implemented as the second transistor T2. A gate of the second transistor T2 is connected to a first scan line (a first scanning signal terminal Ga1) to receive the first scanning signal. A first electrode of the second transistor T2 is connected to a data line (a data signal terminal Vd) to receive the data signal. A second electrode of the second transistor T2 is connected to the first terminal 122*b* (the second node N2) of the driving sub-circuit 122.

For example, as shown in FIG. 5B, the compensating sub-circuit 128 may be implemented as the third transistor T3 (i.e., a compensating transistor). A gate, a first electrode and a second electrode of the third transistor T3 act as the control terminal 128*a*, the first terminal 128*b* and the second terminal 128*c* of the compensating sub-circuit, respectively. A gate of the third transistor T3 is connected to a second scan line (a second scanning signal terminal Ga2) to receive the second scanning signal. A first electrode of the third transistor T3 is connected to the second terminal 122*c* (the third node N3) of the driving sub-circuit 122. A second electrode of the third transistor T3 is connected to the control terminal 122*a* (the first node N1) of the driving sub-circuit 122. For example, as shown in FIG. 5B, the storage sub-circuit 127 may be implemented as the storage capacitor Cst. The storage capacitor Cst includes a first capacitor electrode Ca connected to the first voltage terminal VDD and a second capacitor electrode Cb connected to the control terminal 122*a* of the driving sub-circuit 122.

For example, as shown in FIG. 5B, the first light emitting control sub-circuit 123 may be implemented as the fourth transistor T4. A gate of the fourth transistor T4 is connected to a first light emitting control line (the first light emitting control terminal EM1) to receive the first light emitting control signal. A first electrode of the fourth transistor T4 is connected to the first voltage terminal VDD to receive the first power voltage. A second electrode of the fourth transistor T4 is connected to the first terminal 122*b* (the second node N2) of the driving sub-circuit 122.

For example, the light emitting element 120 is specifically implemented as a light emitting diode (LED), e.g., an organic LED (OLED), a quantum-dot LED (QLED), or an inorganic LED, such as a micro LED or a micro OLED. For example, the light emitting element 120 may be of a top-emitting structure, a bottom-emitting structure or a double-sided emitting structure. The light emitting element 120 may emit red light, green light, blue light, white light or the like. The embodiments of the present disclosure have no particular limitation on the specific structure of the light emitting element.

For example, the light emitting element 120 includes a first electrode 134, a second electrode 135, and an organic functional layer sandwiched between the first electrode 134 and the second electrode 135. The organic functional layer includes a light emitting layer. As needed, the organic functional layer may also include a hole injection layer, a hole transport layer, an electron injection layer, an electron transport layer, etc.

For example, the first electrode 134 (also referred to as a pixel electrode, e.g., a positive electrode) of the light emitting element 120 is connected to the fourth node N4 and configured to be connected to the second terminal 122*c* of the driving sub-circuit 122 through the second light emitting control sub-circuit 124. The second electrode 135 (e.g., a negative electrode) of the light emitting element 120 is configured to be connected to the second voltage terminal VSS to receive the second power voltage VSS. A current flowing from the second terminal 122*c* of the driving sub-circuit 122 into the light emitting element 120 determines the brightness of the light emitting element. For example, the second voltage terminal may be grounded. That is, VSS may be 0 V. For example, the second power voltage VSS may be a negative voltage.

For example, the second light emitting control sub-circuit 124 may be implemented as the fifth transistor T5. A gate of the fifth transistor T5 is connected to a second light emitting control line (the second light emitting control terminal EM2) to receive the second light emitting control signal. A first electrode of the fifth transistor T5 is connected to the second terminal 122*c* (the third node N3) of the driving sub-circuit 122. A second electrode of the fifth transistor T5 is connected to the first terminal 134 (the fourth node N4) of the light emitting element 120.

For example, the first reset sub-circuit 125 may be implemented as the sixth transistor T6, and the second reset sub-circuit is implemented as the seventh transistor T7. A gate of the sixth transistor T6 is configured to be connected to a first reset control terminal Rst1 to receive the first reset control signal Rst1. A first electrode of the sixth transistor T6 is connected to the first reset voltage terminal Vinit1 to receive the first reset voltage Vinit1. A second electrode of the sixth transistor T6 is configured to be connected to the first node N1. A gate of the seventh transistor T7 is configured to be connected to a second reset control terminal Rst2 to receive the second reset control signal Rst2. A first electrode of the seventh transistor T7 is connected to the second reset voltage terminal Vinit2 to receive the second reset voltage Vinit2. A second electrode of the seventh transistor T7 is configured to be connected to the fourth node N4.

It needs to be noted that all the transistors used in the embodiments of the present disclosure may be thin-film transistors or field effect transistors or other switching devices having the same characteristics. The thin-film transistor is described as an example in the embodiments of the present disclosure. The source and the drain of a transistor used herein may be structurally symmetrical and thus may be structurally indistinguishable. In an embodiment of the present disclosure, to distinguish between other two electrodes than the gate of the transistor, one electrode is directly described as the first pole, while the other electrode as the second pole.

Moreover, transistors may be divided into an N-type transistor and a P-type transistor by the characteristic of a transistor. When the transistor is a P-type transistor, a switch-on voltage is a low-level voltage (e.g., 0 V, −5 V, −10 V or other suitable voltage), and a switch-off voltage is a high-level voltage (e.g., 5 V, 10 V or other suitable voltage). When the transistor is an N-type transistor, a switch-on voltage is a high-level voltage (e.g., 5 V, 10 V or other suitable voltage), and a switch-off voltage is a low-level voltage (e.g., 0 V, −5 V, −10 V or other suitable voltage). For example, as shown in FIG. 5B, the first to seventh transistors T1-T7 are all P-type transistors, e.g., low-temperature polycrystalline silicon thin-film transistors. However, the embodiments of the present disclosure have no particular limitation on the type of a transistor. When the type of the transistor changes, the connection relationship in the circuit may be adjusted correspondingly.

Figure 5C:
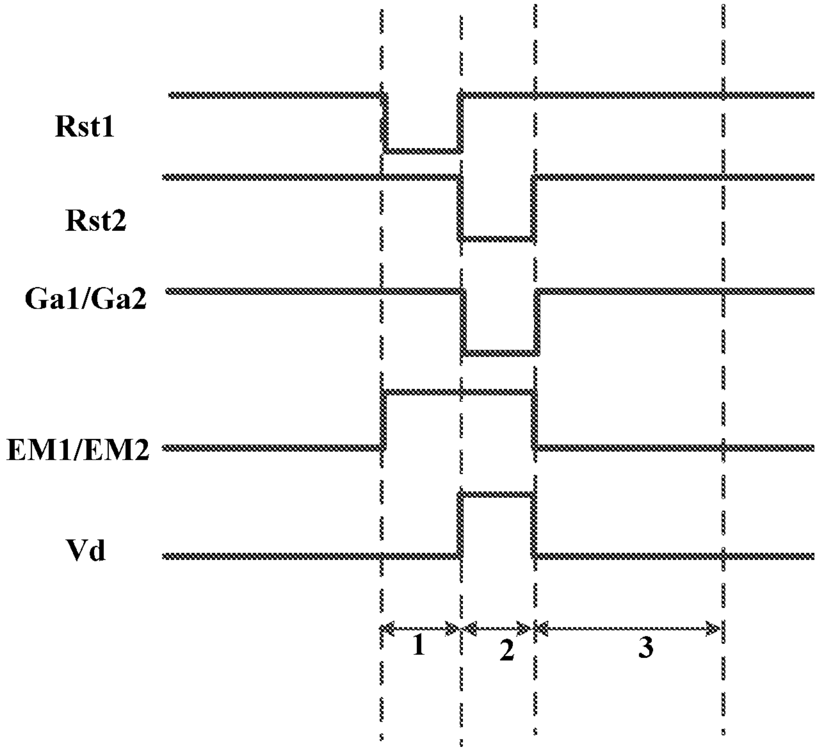
FIG. 5C is a timing signal diagram of a pixel circuit provided by at least one embodiment of the present disclosure.

The working principle of the pixel circuit shown in FIG. 5B is explained below with reference to the signal timing diagram shown in FIG. 5C. As shown in FIG. 5C, the display process of an image of each frame includes an initialization phase 1, a data writing and compensation phase 2, and a light emitting phase 3.

As shown in FIG. 5C, in the present embodiment, the first scanning signal Ga1 and the second scanning signal Ga2 are the same signal; the first light emitting control signal EM1 and the second light emitting control signal EM2 are the same signal; and the second reset control signal Rst2 and the first scanning signal Ga1/the second scanning signal Ga2 are the same in waveform, i.e., the second reset control signal Rst2, the first scanning signal Ga1/the second scanning signal Ga2 may be the same signal. The first reset signal Rst1 of the current row of sub-pixels and the first scanning signal Ga1/the second scanning signal Ga2 of a previous row of sub-pixels are the same in waveform, i.e., are the same signal. However, the present disclosure is not limited thereto. In other embodiments, different signals may be used as the first scanning signal Ga1, the second scanning signal Ga2, the first reset control signal Rst1, and the second reset control signal Rst2, respectively, and different signals may be used as the first light emitting control signal EM1 and the second light emitting control signal EM2, respectively.

At the initialization phase 1, the first reset control signal Rst1 is input to switch on the sixth transistor T6, and the first reset voltage Vinit1 is applied to the gate of the first transistor T1, thus resetting the first node N1.

At the data writing and compensation phase 2, the first scanning signal Ga1, the second scanning signal Ga2, and the data signal Vd are input to switch on the second transistor T2 and the third transistor T3. The data signal Vd is written to the second node N2 by the second transistor T2, and the first node N1 is charged through the first transistor T1 and the third transistor T3. The first transistor T1 is switched off when the potential of the first node N1 changes to Vd+Vth, wherein Vth is the threshold voltage of the first transistor T1. The potential of the first node N1 is retained by being stored in the storage capacitor Cst. In other words, voltage information with the data signal and the threshold voltage Vth is stored in the storage capacitor Cst for subsequently providing gray-level display data and compensate the threshold voltage of the first transistor T1 at the light emitting phase.

At the data writing and compensation phase 2, the second reset control signal Rst2 may also be input to switch on the seventh transistor T7, and the second reset voltage Vinit2 is applied to the fourth node N4, thus resetting the fourth node N4. For example, resetting the fourth node N4 may also be carried out at the initialization phase 1. for example, the first reset control signal Rst1, and the second reset control signal Rst2 may be identical. The embodiments of the present disclosure are not limited thereto.

At the light emitting phase 3, the first light emitting control signal EM1 and the second light emitting control signal EM2 are input to switch on the fourth transistor T4, the fifth transistor T5, and the first transistor T1, and the fifth transistor T5 applies a driving current to an OLED such that the OLED emits light. A value of the driving current I flowing through the OLED may be derived according to the following formula:

$$I=K(VGS-Vth)^2=K[(V\text{data}+V\text{th}-VDD)-Vth]^2=K(V\text{data}-VDD)^2,$$ wherein $K$ is an electrical conductivity coefficient of the first transistor.

In the above formula, Vth represents the threshold voltage of the first transistor T1; VGS represents a voltage between the gate and the source (which is the first electrode here) of the first transistor T1; and K is a constant related to the first transistor T1 itself. As can be seen from the above calculation formula of I, the driving current I flowing through the OLED is no longer related to the threshold voltage Vth of the first transistor T1. Thus, compensation for the pixel circuit can be realized. The problem of threshold voltage drift of the driving transistor (the first transistor T1 in the embodiments of the present disclosure) due to the manufacturing process and long-time operation is solved, and its influence on the driving current I is eliminated. Accordingly, the display effect of a display device using the same can be improved.

The structure of a display substrate provided by at least one embodiment of the present disclosure will be described below exemplarily by taking the pixel circuit shown in FIG. 5B for example in conjunction with FIG. 6A to FIG. 6B, FIG. 7, FIG. 8A to FIG. 8C, FIG. 9A to FIG. 9C, and FIG. 10A.

Figure 6A:
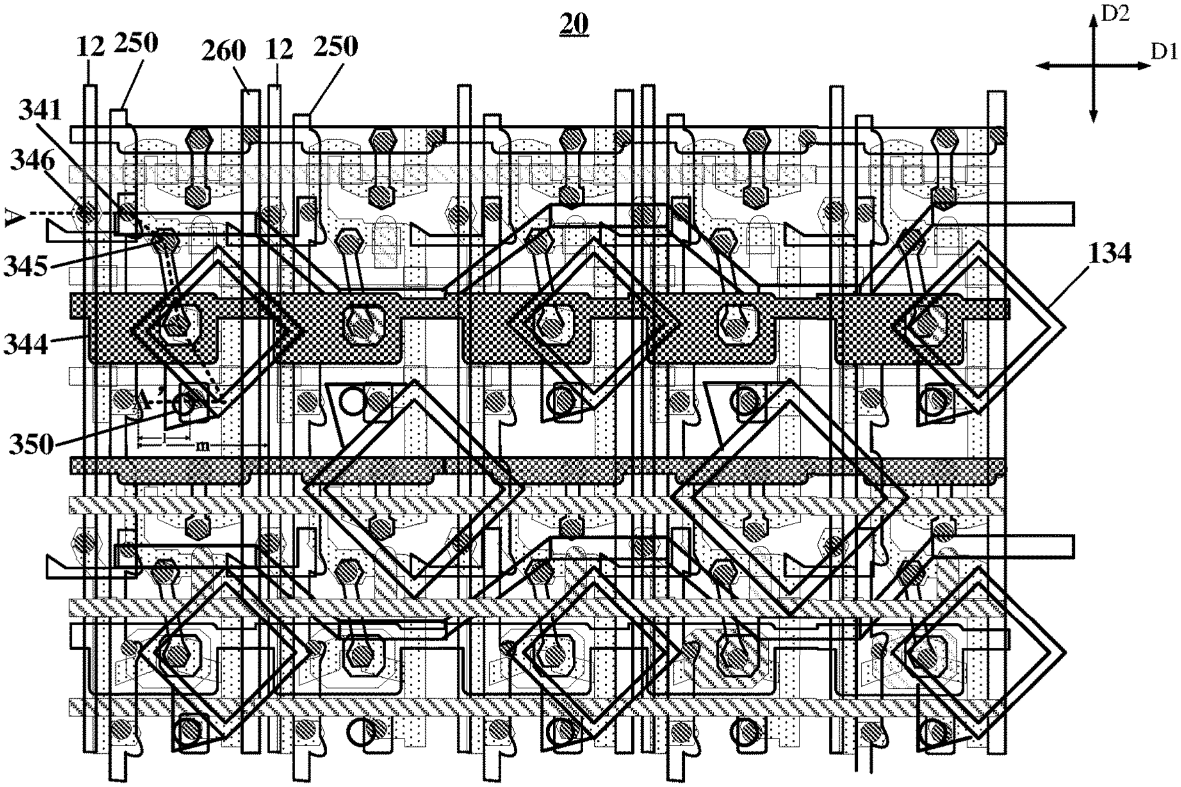
FIG. 6A is a fourth schematic diagram of a display substrate provided by at least one embodiment of the present disclosure.
Figure 6B:
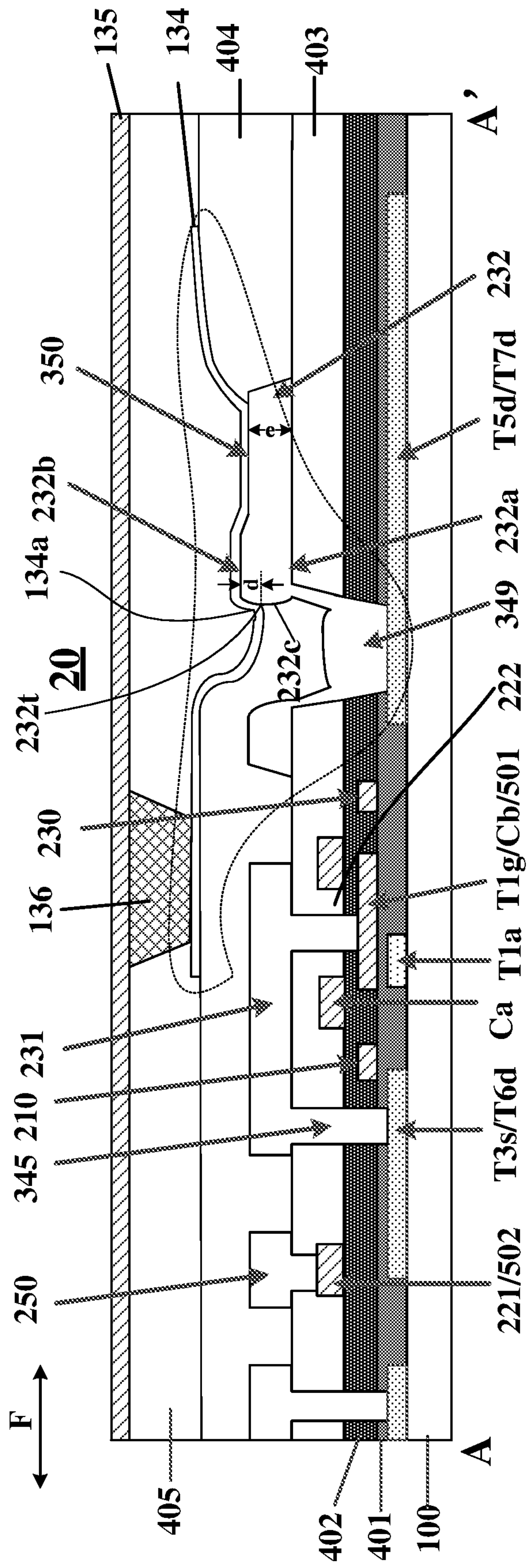
FIG. 6B is a sectional view taken along section line A-A' in FIG. 6A.

FIG. 6A is a schematic diagram of a display substrate 20 provided by at least one embodiment of the present disclosure, and FIG. 6B is a sectional view taken along section line A-A' in FIG. 6A. It needs to be noted that for the sake of clarity, some structures having no direct electrical connection relationship at the section line are omitted in FIG. 6B. For ease of contrast, FIG. 8B and FIG. 9B also illustrate the position of the section line A-A'.

As shown in FIG. 6A, the display substrate 20 includes a base substrate 100. A plurality of sub-pixels P are located on the base substrate 100. Pixel circuits of the plurality of sub-pixels P are arranged in a pixel circuit array. For example, a row direction of the pixel circuit array is a first direction D1 and a column direction is a second direction D2. In some embodiments, the pixel circuits of the sub-pixels may have a completely identical structure. That is, the pixel circuits are arranged repeatedly in the row direction and the column direction.

For ease of description, FIG. 6A exemplarily illustrates two rows and five columns of sub-pixels. For example, as shown in FIG. 6A, an arrangement rule of the pixel circuit of a sub-pixels may be identical to or different from an arrangement rule of a pixel electrode (i.e., the first electrode of the light emitting element) thereabove. For ease of description, the description of the arrangement of the sub-pixels is made here with reference to the arrangement rule of the pixel circuit, and the description of a relative positional relationship of sub-pixels is made with reference to the relative position of the pixel circuits of the sub-pixels. For example, adjacent sub-pixels refer to sub-pixels of which the pixel circuits are adjacent. These are the same as above in the following embodiments, which will not be described redundantly.

With reference to FIG. 6A to FIG. 6B, a semiconductor layer 102, an insulating layer 401, a conductive layer 501, an insulating layer 402, a conductive layer 502, an insulating layer 403, a conductive layer 503, an insulating layer 404, and a conductive layer 504 are disposed on the base substrate 100 in sequence, thus forming the structure of the display substrate shown in FIG. 6A.

Figure 7:
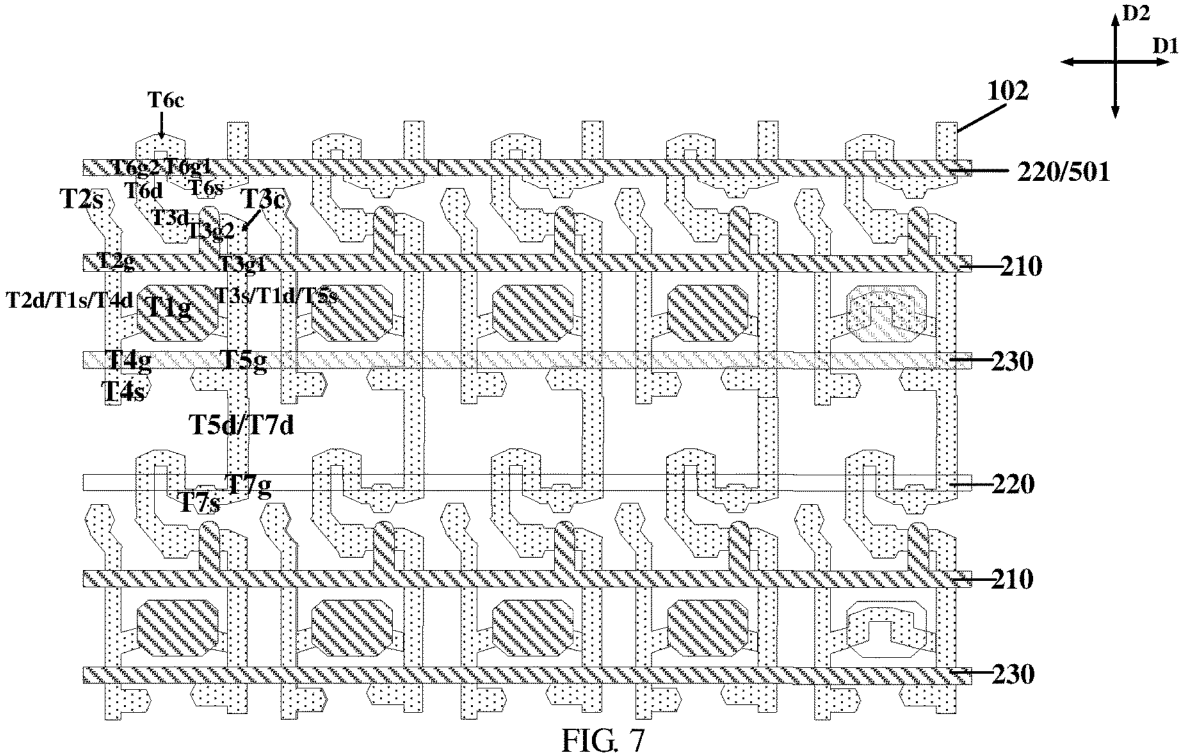
FIG. 7 is a fifth schematic diagram of a display substrate provided by at least one embodiment of the present disclosure.
Figure 8A:
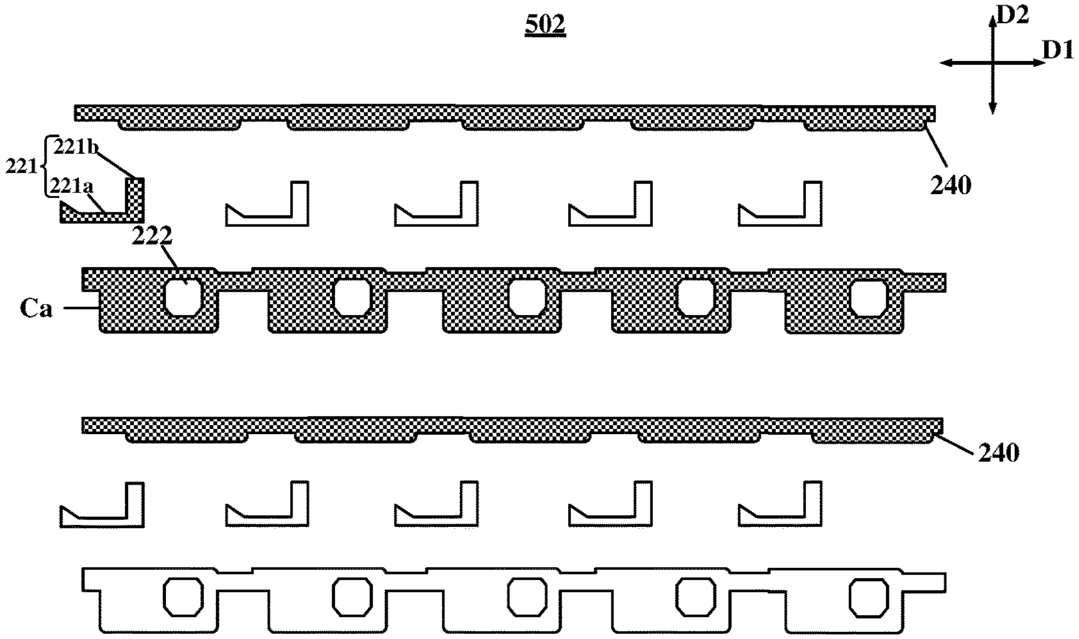
FIG. 8A is a sixth schematic diagram of a display substrate provided by at least one embodiment of the present disclosure.
Figure 8B:
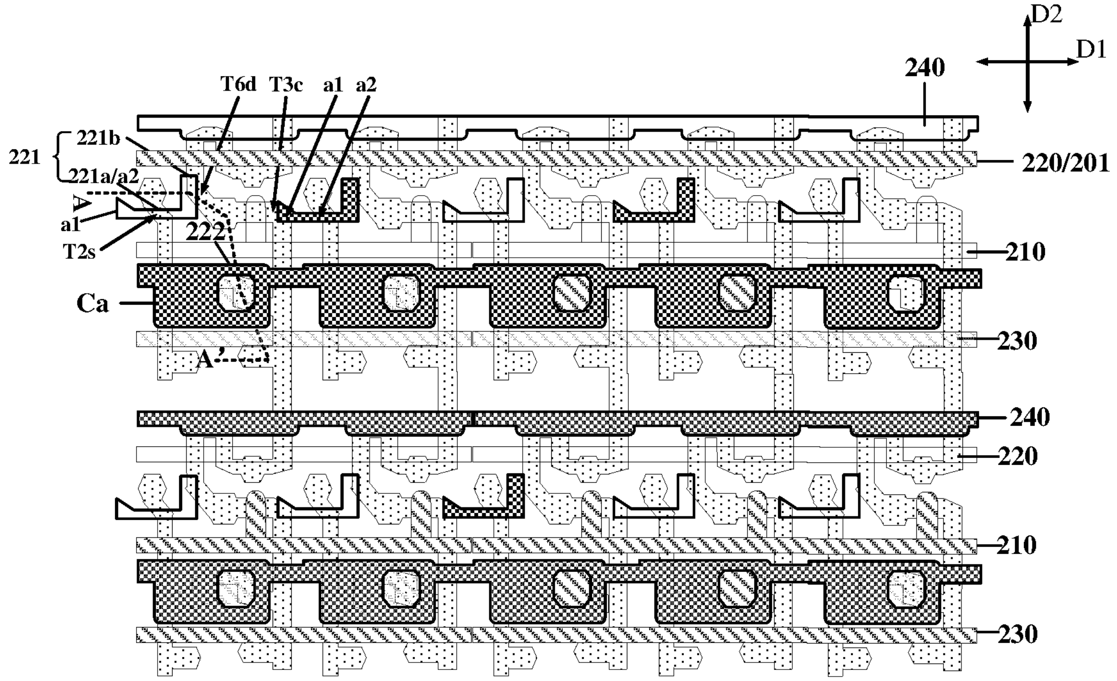
FIG. 8B is a seventh schematic diagram of a display substrate provided by at least one embodiment of the present disclosure.
Figure 8C:
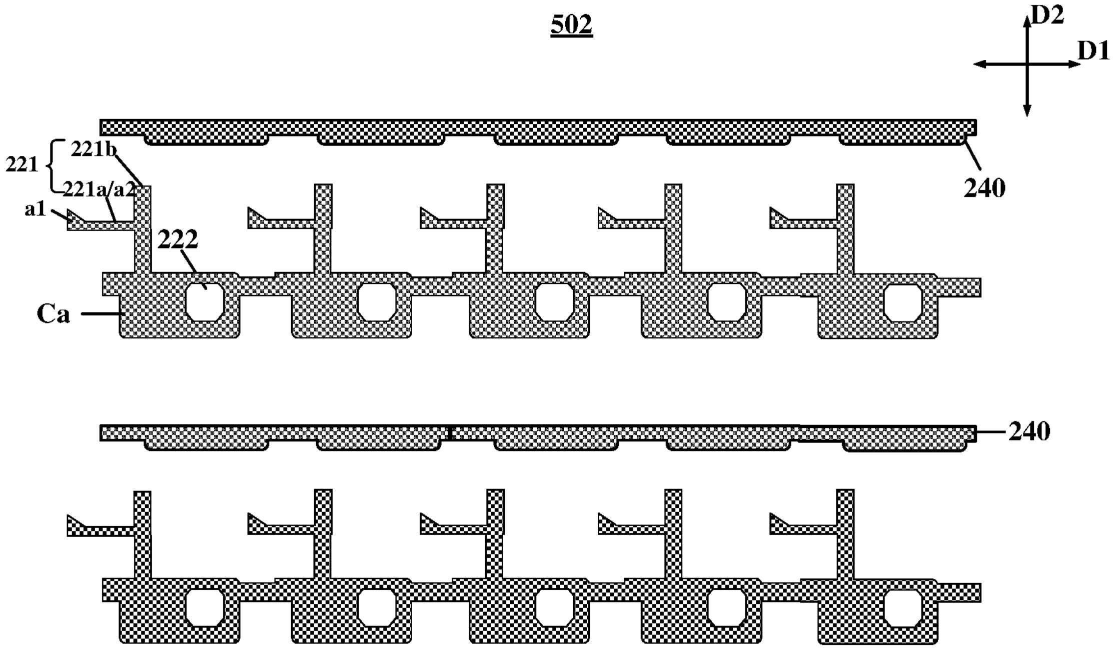
FIG. 8C is an eighth schematic diagram of a display substrate provided by at least one embodiment of the present disclosure.
Figure 9A:
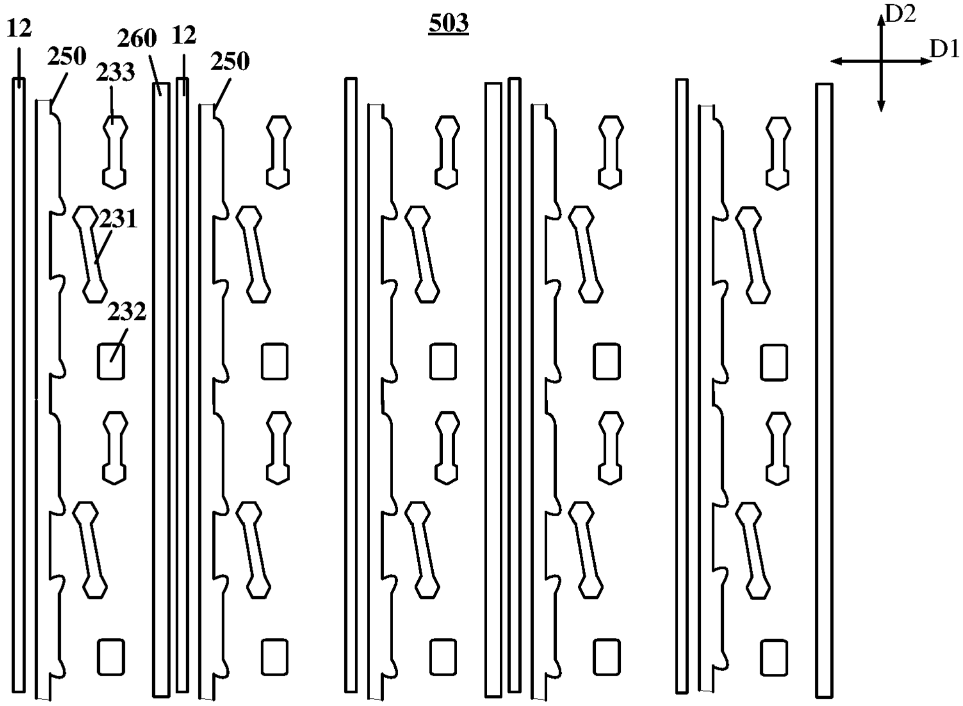
FIG. 9A is a ninth schematic diagram of a display substrate provided by at least one embodiment of the present disclosure.
Figure 9B:
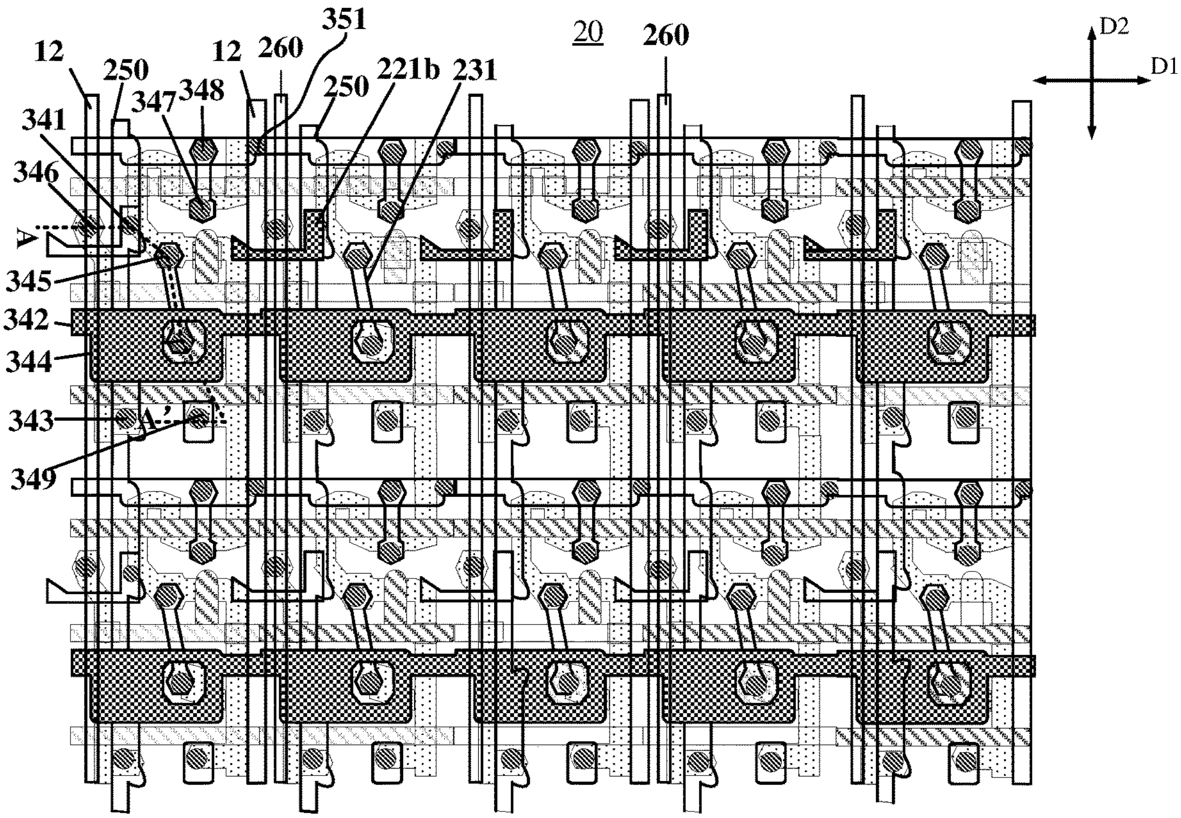
FIG. 9B is a tenth schematic diagram of a display substrate provided by at least one embodiment of the present disclosure.
Figure 10A:
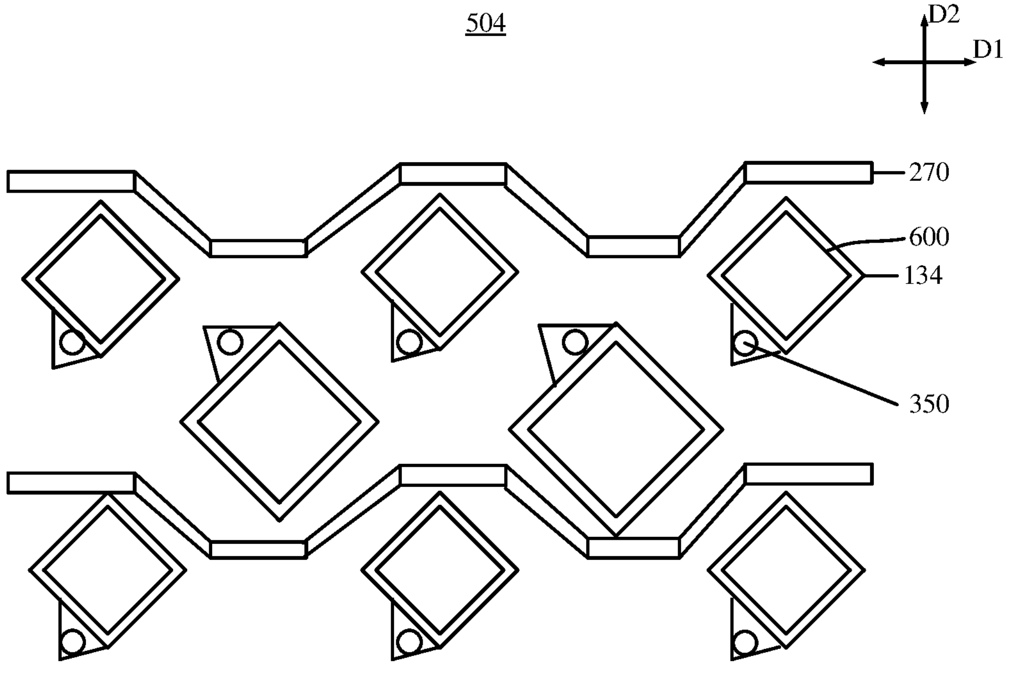
FIG. 10A is a thirteenth schematic diagram of a display substrate provided by at least one embodiment of the present disclosure.

FIG. 7 illustrates the semiconductor layer 102 and the conductive layer 501 corresponding to FIG. 6A; FIG. 8A and FIG. 8C illustrate the pattern of the conductive layer 502, and FIG. 8B illustrates the conductive layer 502 on the basis of FIG. 7; FIG. 9A illustrates the conductive layer 503, and FIG. 9B illustrates the conductive layer 503 on the basis of FIG. 8B; and FIG. 10A illustrates the conductive layer 504.

For ease of description, the gate, the first pole, the second pole, and a channel region of the nth transistor Tn are denoted by Tng, Tns, Tnd, and Tna in the following description, respectively, wherein n is 1 to 7.

It needs to be noted that the so-called "disposed in a same layer" in the present disclosure refers to that two (or more than two) structures are formed through a same deposition process and patterned through a same patterning process, but are not necessarily located in a same horizontal plane, and may be made of a same material or different materials. It needs to be noted that the so-called "integrated structure" in the present disclosure refers to a structure that is formed by connecting two (or more than two) structures formed through a same deposition process and patterned through a same patterning process to each other, and the structures may be made of a same material or different materials.

For example, as shown in FIG. 7, the conductive layer 501 includes the gate electrode of each transistor, and some scan lines and control lines. The semiconductor layer 102 includes active layers T1*a*-T7*a* of the first to seventh transistors T1-T7. As s shown in FIG. 7, the active layers T1*a*-T7*a* of the first to seventh transistors T1-T7 are connected to one another into an integrated structure. For example, the semiconductor layer 102 in each column of sub-pixels is a connected integrated structure, and semiconductor layers in two adjacent columns of sub-pixels are spaced apart from each other.

For example, as shown in FIG. 7, the conductive layer 501 includes the gates T1*g*-T7*g* of the first to seventh transistors T1-T7. For example, a self-aligned process is carried out for the display substrate 20. The semiconductor layer 102 is processed (e.g., doped) into a conductor with the first conductive layer 201 as a mask such that a portion of the semiconductor layer 102 that is not covered with the first conductive layer 201 becomes a conductor. Thus, the portions, located on two sides of the channel region, of the active layer of each transistor, are formed into conductors to act as the first electrode and the second electrode of the transistor, respectively.

For example, as shown in FIG. 7, the third transistor T3 and the seventh transistor T6 are each of a double-gate structure, including a first gate and a second gate. Thus, the gate control capability of the transistors can be improved and the leakage current can be reduced. Since the third transistor T3 and the sixth transistor T6 are transistors directly connected to the gate (i.e., the first node N1) of the first transistor T1 (i.e., the driving transistor). Therefore, the stability of the third transistor T3 and the sixth transistor T6 directly affects the stability of the voltage of the gate (the node N1) of the first transistor T1. With the double-gate structure, the gate control capability of the third transistor T3 and the sixth transistor T6 is improved, which is conducive to reducing the leakage current of the transistors and thus conducive to maintaining the voltage of the node N1. Thus, at the compensation phase, the threshold voltage of the first transistor T1 can be compensated fully, and then the display uniformity of the display substrate at the light emitting phase is improved.

As shown in FIG. 7, the third transistor T3 includes a first gate T3*g*1 and a second gate T3*g*2, and a first channel region and a second channel region that correspond to the first gate electrode T3*g*1 and the second gate T3*g*2, respectively. In other words, the active layer of the third transistor includes a first portion, a second portion, and a third portion. An orthographic projection of the first portion on the base substrate overlaps an orthographic projection of the first gate T3*g*1 on the base substrate, and an orthographic projection of the second portion on the base substrate overlaps an orthographic projection of the second gate T3*g*2 on the base substrate. For example, the first gate T3*g*1 is located on a main body portion of a scan line 220 that controls the third transistor T3, and the second gate T3*g*2 is a protrusion protruding from the main body portion of the scan line 220 in the second direction D2. The active layer of the third transistor T3 further includes a third portion (an example of the semiconductor pattern of the present disclosure) that is located between the first portion and the second portion of the active layer and connects the first portion and the second portion. The third portion is located between the first gate T3*g*1 and the second gate T3*g*2 and formed into a conductive region T3*c* due to not being shielded by a gate pattern. The conductive region T3*c* is spaced apart from the first electrode T3*s* of the third transistor T3 by the first channel region of the third transistor T3. The conductive region T3*c* is spaced apart from the second electrode T3*d* of the third transistor T3 by the second channel region of the third transistor T3. The conductive region T3*c*, and the first channel region and the second channel region of the third transistor T3 are of an integrated structure, e.g., all include a polycrystalline silicon material. Similarly, the sixth transistor T6 also includes a conductive region T6*c* located between the first gate T6*g*1 and the second gate T2*g*.

For example, the first conductive layer 201 further includes a plurality of scan lines 210, a plurality of reset control lines 220, and a plurality of light emitting control lines 230 that are insulated from one another. These signal lines may be examples of the gate lines 11 shown in FIG. 4.

The scan line 210 is electrically connected (or of an integrated structure) with the gates T2g of the second transistors T2 in the corresponding row of sub-pixels to provide the first scanning signal Ga1, and the reset control line 220 is electrically connected (or of an integrated structure) with the gates T6g of the sixth transistors T6 in the corresponding row of sub-pixels to provide the first reset control signal Rst1. The light emitting control line 230 is electrically connected to the gates T4g of the fourth transistors T4 in the corresponding row of sub-pixels to provide the first light emitting control signal EM1.

For example, as shown in FIG. 7, the scan line 210 is further electrically connected to the gates of the third transistors T3 to provide the second scanning signal Ga2, and the first scanning signal Ga1 and the second scanning signal Ga2 may be the same signal. The light emitting control line 230 is further electrically connected to the gates T5g of the fifth transistors T5 to provide the second light emitting control signal EM2. That is, the first light emitting control signal EM1 and the second light emitting control signal EM2 are the same signal.

For example, the first gate T3g1 extends in the first direction D1 and is a portion of the scanning line 210. The second gate T3g2 extends in the second direction D2 and is an extension portion of the scan line 210 that extends in the second direction D2.

For example, as shown in FIG. 7, the gates of the seventh transistors T7 of the pixel circuits of the current row are electrically connected to the reset control line 220 corresponding to the pixel circuits of next row (the pixel circuit row where the scan lines switched on sequentially behind the scan lines of the current row according to the scan sequence of the scan lines is located) to receive the second reset control signal Rst2.

For example, as shown in FIG. 8A, the conductive layer 502 includes a first capacitor electrode Ca. The first capacitor electrode Ca overlaps the gate T1g of the first transistor T1 in the direction perpendicular to the base substrate 100 to form a storage capacitor Cst. That is, the gate T1g of the first transistor T1 acts as a second capacitor electrode Cb of the storage capacitor Cst. For example, the first capacitor electrode Ca includes an opening 222. The opening 222 exposes at least a portion of the gate T1g of the first transistor T1 so that the gate T1g is electrically connected to other structure. For example, the first capacitor electrodes Ca of the sub-pixels located in a same row are connected to one another into an integrated structure.

For example, the conductive layer 502 may further include a plurality of reset voltage lines 240 extending in the first direction D1. The plurality of reset voltage lines 240 are in one-to-one corresponding connection with a plurality of rows of sub-pixels. The reset voltage line 240 is electrically connected to the first electrodes of the sixth transistors T6 in the corresponding row of sub-pixels to provide the first reset voltage Vinit1.

For example, as shown in FIG. 8B, the first electrodes of the seventh transistors T7 in the current row of sub-pixels are electrically connected to the reset voltage lines 240 corresponding to next row of sub-pixels to receive the second reset voltage Vinit2. This will be described in detail below with reference to the FIG. 9B.

For example, as shown in FIG. 8A to 8B, the conductive layer 502 may further include a shielding electrode 221. For example, the shielding electrode 221 overlaps the first electrode T2s of the second transistor T2 in the direction perpendicular to the base substrate 100 so that the signal in the first electrode T2s of the second transistor T2 can be protected against interference by other signals. Since the first electrode T2s of the second transistor T2 is configured to receive the data signal Vd which determines the display grey level of the sub-pixel. Therefore, the shielding electrode 221 improves the stability of the data signal, thus improving the display performance.

For example, with reference to FIG. 8B and FIG. 6B, the shielding electrode 221 further overlaps at least in part the second electrode T6d of the sixth transistor T6 in the direction perpendicular to the base substrate 100 to improve the stability of the signal on the second electrode T6d, thus improving the stability of the sixth transistor T6 and further stabilizing the gate voltage of the first transistor T1.

For example, as shown in FIG. 8B, the shielding electrode 221 further extends to a sub-pixel adjacent to the sub-pixel to which the shielding electrode 211 belongs in the first direction D1 and overlaps at least in part the conductive region T3c of the third transistor T3 in the adjacent sub-pixel in the direction perpendicular to the base substrate 100 to improve the stability of the signal in the conductive region T3c, thus improving the stability of the third transistor T3 and further stabilizing the gate voltage of the first transistor T1.

As shown in FIG. 8B, a first shielding portion 221a of the shielding electrode 221 includes a first sub-portion a1 and a second sub-portion a2. An orthographic projection of the first sub-portion a1 on the base substrate overlaps an orthographic projection of the conductive region T3c of the third transistor of the adjacent sub-pixel on the base substrate, and an orthographic projection of the second sub-portion a2 on the base substrate does not overlap the orthographic projection of the conductive region T3c on the base substrate. A size of a conductive region T31 of the first sub-portion in the second direction D2 is greater than a size of the second sub-portion a2 in the second direction. Such an arrangement may be conducive to the shielding area and shielding effect of the first sub-portion a1.

For example, the shielding electrode 221, the first electrode T2s of the second transistor T2 directly facing (overlapping) the shielding electrode, and the second electrode T6d of the sixth transistor T6 form a stable capacitor. The shielding electrode 221 is configured to load a fixed voltage. Since a voltage difference between two ends of the capacitor cannot change sharply, the stability of voltages on the first electrode T2s of the second transistor T2, the conductive region T3c of the third transistor T3, and the second electrode T6d of the sixth transistor T6 is improved. For example, the shielding electrode 221 is electrically connected to a power line 250 in the conductive layer 503 to load the first power voltage VDD.

For example, the shielding electrode 221 is L-shaped, V-shaped, or T-shaped. As shown in FIG. 8A, the shielding electrode 221 is L-shaped and includes a first shielding portion 221a and a second shielding portion 221b extending in different directions. The second shielding portion 221b overlaps at least in part the second electrode T6d of the sixth transistor T6 in the direction perpendicular to the base substrate 100. The first shielding portion 221a overlaps at least in part the first electrode T2s of the second transistor T2 and the conductive region T3c of the third transistor T3 in the adjacent sub-pixel in the direction perpendicular to the base substrate 100 separately to shield the conductive region T3c, thus improving the stability of the transistors. For example, the second shielding portion 221b extends in the second direction D2, and the first shielding portion 221*a* extends in the first direction D1.

FIG. 8C is a planar schematic diagram of another example of the conductive layer 502. The example shown in FIG. 8C differs from the example shown in FIG. 8A mainly in that the shielding electrode 221 and the first capacitor electrode Ca are connected to each other into an integrated structure. As shown in FIG. 8C, the second shielding portion 221*b* of the shielding electrode 221 extends from the first capacitor electrode Ca in the second direction D2, and the first shielding portion 221*a* extends from the second shielding portion 221*b* in the first direction D1. The second shielding portion 221*b* extends downwards to the first capacitor electrode Ca and is connected to the first capacitor electrode Ca into an integrated structure. A position where the first shielding portion and the second shielding portion are connected is located in a middle position of the second shielding portion in the second direction. That is, the shielding electrode is T-shaped.

Since the first capacitor electrode Ca is configured to be electrically connected to the power line 250. The above arrangement enables the shielding electrode 221 to be connected to the power line 250 through the first capacitor electrode Ca in the same layer, thus avoiding the formation of the via hole 341 and simplifying the design. For example, as shown in FIG. 9A to FIG. 9B, the conductive layer 503 includes a plurality of power lines 250 extending in the second direction D2. The plurality of power lines 250 are connected to the first voltage terminal VDD to transmit the first power voltage VDD. For example, the plurality of power lines 250 are electrically connected to a plurality of columns of sub-pixels correspondingly one to one to provide the first power voltage VDD. The power line 250 is electrically connected to the first capacitor electrodes Ca in the corresponding column of sub-pixels through via holes 342 and electrically connected to the first electrodes T4*s* of the fourth transistors T4 through via holes 343. For example, the power line 250 is further electrically connected to the shielding electrode 221 through the via hole 341 such that the shielding electrode 221 has a fixed potential and the shielding capability of the shielding electrode is improved. For example, the via hole 342 and the via hole 341 both penetrate through the third insulating layer 303, and the via hole 343 penetrates through the insulating layer 401, the insulating layer 402, and the insulating layer 403.

For example, the conductive layer 503 further includes a plurality of data lines 12 extending in the second direction D2. For example, the plurality of data lines 12 are electrically connected to a plurality of columns of sub-pixels correspondingly one to one to provide the data signal Vd. For example, the data line 12 is electrically connected to the first electrodes T2*s* of the second transistors T2 in the corresponding column of sub-pixels through via holes 346 to provide the data signal. For example, the via hole 346 penetrates through the insulating layer 401, the insulating layer 402, and the insulating layer 403. For example, with reference to FIG. 6A to FIG. 6B and FIG. 9A to FIG. 9B, the conductive layer 503 further includes a connection electrode 231. One end of the connection electrode 231 is electrically connected to the gate T1*g* of the first transistor T1 (i.e., the second capacitor electrode Cb) through the opening 222 in the first capacitor electrode Ca and a via hole 344 in the insulating layer, and the other end of the same is electrically connected to the second electrode T3*d* of the third transistor T3 through a via hole 345. Thus, the second capacitor electrode Cb is electrically connected to the second electrode T3*d* of the third transistor T3. For example, the via hole 344 penetrates through the insulating layer 402 and the insulating layer 403. For example, the via hole 345 penetrates through the insulating layer 401, the insulating layer 402, and the insulating layer 403.

As shown in FIG. 9B, an orthographic projection of the connection electrode 231 on the base substrate overlaps at least in part an orthographic projection of the second shielding portion 221*b* of the shielding electrode 221 on the base substrate in the first direction D1. That is, viewed from the first direction D1, the orthographic projection of the connection electrode 231 overlaps at least in part the orthographic projection of the second shielding portion 221*b*.

As shown in FIG. 9B, the connection electrode 231 has such an overlapping relationship with the second shielding portions 221*b* of the shielding electrodes 221 on two sides thereof.

With the above arrangement, the shielding protection effect of the second shielding portions on the connection electrode 231 can be effectively improved. For example, some jump signals can be shielded and prevented from affecting the potential of the connection electrode 231 to affect the potential of the gate of the driving transistor.

For example, as shown in FIG. 9B, the orthographic projection of the second shielding portion 221*b* on the base substrate is located between the orthographic projection of the connection electrode 231 on the base substrate and the orthographic projection of the data line 12 on the base substrate. Thus, the second shielding portion 221*b* can shield the jump signal of the data line 12 and reduce the influence of the jump signal on the potential of the connection electrode 231.

For example, with reference to FIG. 8C and FIG. 9B, the orthographic projection of the connection electrode 231 on the base substrate is located within a range of an orthographic projection of an integrated structure of the first capacitor electrode Ca and the shielding electrode 221 on the base substrate in second direction D2. In this way, when the shielding electrode 221 is as constructed as shown in FIG. 8C. The shielding electrode 221 and the first capacitor electrode Ca together form a shielding wall that can effectively improve the shielding and protection effects on the signal of the connection electrode 231. For example, with reference to FIG. 6A to FIG. 6B and FIG. 9A and FIG. 9B, the conductive layer 503 further includes a connection electrode 232. The connection electrode 232 is electrically connected to the second electrode T5*d* of the fifth transistor T5 through a via hole 349 and configured to electrically connect the second electrode T5*d* of the fifth transistor T5 with the pixel electrode 134 of the light emitting element through a via hole 350. For example, the via hole 349 penetrates through the insulating layer 401, the insulating layer 402, and the insulating layer 403.

For example, as shown in FIG. 9A to FIG. 9B, the conductive layer 503 further includes a connection electrode 233. One end of the connection electrode 233 is electrically connected to the reset voltage line 240 through a via hole 348 and the other end is electrically connected to the first electrode T6*s* of the sixth transistor T6 through a via hole 347 such that the first electrode T6*s* of the sixth transistor T6 is capable of receiving the first reset voltage Vinit1 from the first reset voltage line 240. For example, the via hole 348 penetrates through the insulating layer 403. For example, the via hole 347 penetrates through the insulating layer 401, the insulating layer 402, and the insulating layer 403.

Figure 9C:
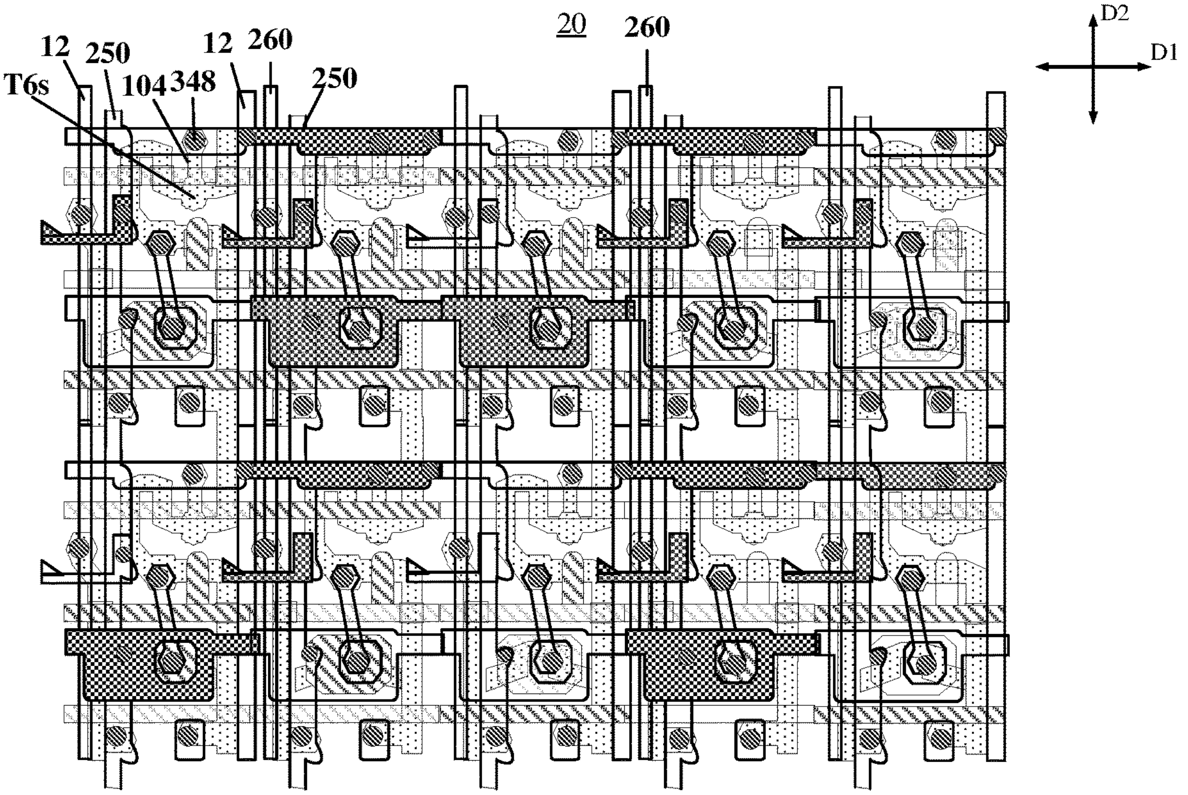
FIG. 9C is an eleventh schematic diagram of a display substrate provided by at least of the embodiment of the present disclosure.

In some other examples, as shown in FIG. 9C, the semiconductor layer 102 includes a connection portion 104. The connection portion 104 is formed into a conductor. The connection portion electrically connects the first reset voltage line 240 (an example of the first reset voltage line of the present disclosure) to the first electrode T6*s* of the reset transistor (i.e., the sixth transistor T6) in the sub-pixel. Such an arrangement may avoid the provision of the connection electrode 232 and the via hole 347, thus simplifying the design.

For example, an orthographic projection of the connection portion on the base substrate overlaps an orthographic projection of the reset voltage line 240 on the base substrate and an orthographic projection of the first electrode T6*s* of the reset transistor on the base substrate.

For example, as shown in FIG. 9B to FIG. 9C, the first electrodes of the seventh transistors T7 in a previous row of sub-pixels are electrically connected to the first electrodes of the sixth transistors T6 in the current row of sub-pixels and electrically connected to the reset voltage line 240 (i.e., the top reset voltage line 240 in FIG. 9B) corresponding to the current row of sub-pixels to receive the second reset voltage Vinit2. The first electrodes of the seventh transistors T7 in the current row of sub-pixels are electrically connected to the first electrodes of the sixth transistors T6 in next row of sub-pixels and electrically connected to the reset voltage line 240 (i.e., the middle reset voltage line 240 in FIG. 9B) corresponding to next row of sub-pixels to receive the second reset voltage Vinit2.

As shown in FIG. 9A to FIG. 9B, the conductive layer 503 further includes a plurality of reset voltage lines 260 extending in the second direction D2. As shown in FIG. 9B, the reset voltage lines 260 are each electrically connected to the reset voltage lines 240 in the conductive layer 502 through via holes 351 to form a crisscross reticular conductive structure. The reticular conductive structure may reduce the resistance, thus reducing a voltage drop and being conducive to transferring the reset voltage uniformly to the sub-pixels on the substrate.

For example, as shown in FIG. 9B, every two adjacent reset voltage lines 260 are spaced apart by two columns of sub-pixels. That is, the reset voltage lines 260 are not disposed in one-to-one correspondence with the columns of sub-pixels. Thus, a routing density can be reduced. For example, in a group of signal lines between two adjacent columns of sub-pixels, the reset voltage line 260 and the power line 250 are directly adjacent to the data line 12 and located on two sides of the data line 12, respectively, and the reset voltage line 260 is located on a side, away from the column of sub-pixels electrically connected to the data line 12, of the data line 12.

With reference to FIG. 6A to FIG. 6B and FIG. 10, the conductive layer 504 includes the first electrode (i.e., the pixel electrode) 134 of the light emitting element. The first electrode 134 of the light emitting element of each sub-pixel is electrically connected to the connection electrode 232 in the sub-pixel through the via hole 350 and thus is electrically connected to the second electrode T5*d* of the fifth transistor T5 through the connection electrode 233. For example, the via hole 350 penetrates through the insulating layer 504. FIG. 10 schematically illustrates, using a circle, the contact region in the first electrode 134 that is in contact with the via hole 350.

For example, with reference to FIG. 6A to FIG. 6B, the display substrate 20 may further include a pixel defining layer 405 located on the first electrode of the light emitting element. An opening is formed in the pixel defining layer 405 to expose at least a portion of the pixel electrode 134, thus defining a pixel opening region (i.e., an effective light emitting region) 600 of each sub-pixel of the display substrate. The organic functional layer 136 of the light emitting element 120 is formed at least within the opening, and the second electrode 135 is formed on the organic functional layer 136, thus forming the light emitting element 120. For example, the second electrode 135 is a common electrode and is disposed in the display substrate 20 as an entire surface. For example, the first electrode 134 is a positive electrode of the light emitting element, and the second electrode 135 is a negative electrode of the light emitting element. FIG. 10 schematically illustrates, using a rectangle, the pixel opening region 600 of each sub-pixel. However, the present disclosure is not limited thereto.

As shown in FIG. 10, the conductive layer 504 may further include a plurality of reset voltage lines 270 extending in the first direction D1. The reset voltage line 270 is, for example, of a broken line structure, and for example, is Z-shaped extending in the first direction D1 to match the shape of the first electrode 134, thus facilitating routing.

For example, the reset voltage line 270 is connected in parallel to the reset voltage line 260 and/or the reset voltage line 240 to further reduce the resistance of the reset voltage line, thus reducing the voltage drop on the reset voltage line. For example, the reset voltage line 270 is electrically connected to the reset voltage line 260 and/or the reset voltage line 240 in the non-display region. The reset voltage lines 270 are not necessary.

Figure 10B:
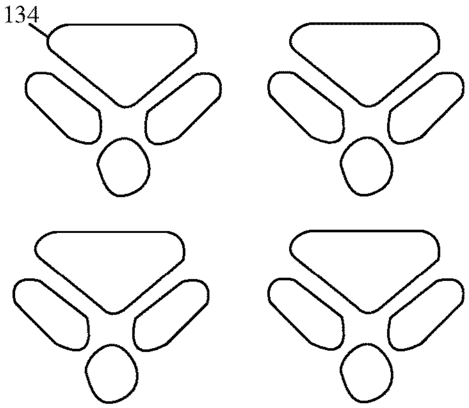
FIG. 10B is a fourteenth schematic diagram of a display substrate provided by at least one embodiment of the present disclosure.
Figure 10C:
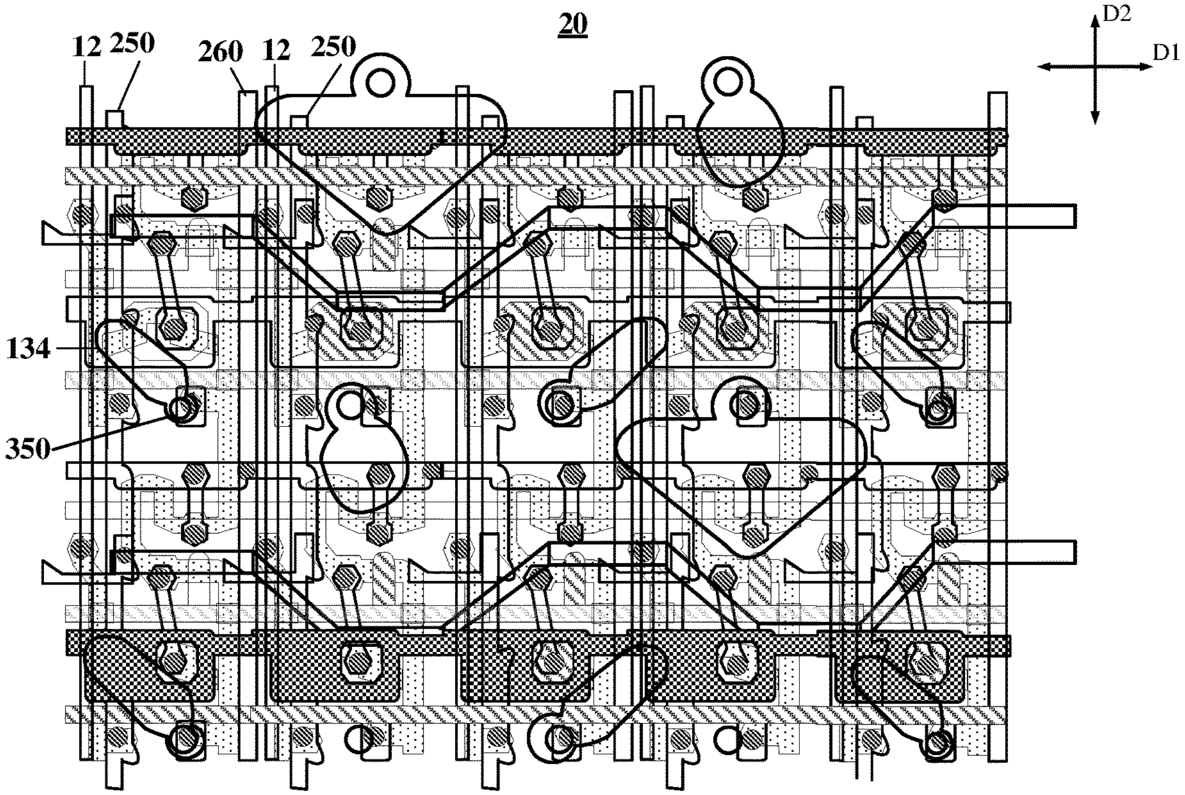
FIG. 10C is a fifteenth schematic diagram of a display substrate provided by at least one embodiment of the present disclosure.

It needs to be noted that the distribution of the first electrodes of the light emitting elements of the display substrate provided by the embodiments of the present disclosure is not limited to the case shown in FIG. 10A, and is also applicable to the distribution of other pixel electrodes. FIG. 10B is a distribution diagram of the first electrodes 134 of the light emitting elements provided by some other embodiments of the present disclosure, and FIG. 10C illustrates a connection relationship of the first electrodes to pixel circuits below them.

As shown in FIG. 10B, every four first electrodes 134 form a group of electrodes. The four first electrodes 134 in the group of electrodes correspond to one blue pixels, one red pixels, and two green pixels, respectively. The two green pixels are disposed oppositely in the first direction, and the blue pixel and the red pixel are disposed oppositely in the second direction. For example, as shown in FIG. 10B, the via hole 350 for the red pixel and the corresponding via hole 349 do not overlap in the direction perpendicular to the base substrate.

The two green pixels have a same shape and a same area, and areas of the blue pixel, the green pixels, and the red pixel are different from one another. For example, the blue sub-pixel having the lowest efficiency has the largest area and the red sub-pixel having the highest efficiency has the smallest area so as to realize better color intensity and image resolution.

For example, materials of the conductive layers may include: gold (Au), silver (Ag), copper (Cu), aluminum (Al), molybdenum (Mo), magnesium (Mg), tungsten (W), and alloy materials formed by such metals; or conductive metal oxide materials such as indium tin oxide (ITO), indium zinc oxide (IZO), zinc oxide (ZnO), and zinc oxide aluminum (AZO); or a stacked structure of a plurality of layers of metals; or a stacked structure of a metal and a conductive metal oxide.

For example, the conductive layer 504 includes a TI/AL/TI stacked structure.

For example, the material of the conductive layer 505 is a transparent conductive material, e.g, a metal oxide material, such as indium tin oxide (ITO), indium zinc oxide (IZO), zinc oxide (ZnO), and zinc oxide aluminum (AZO). For example, the conducive layer 505 includes an ITO/Ag/ITO stacked structure.

For example, the light emitting element 120 is of a top-emitting structure. The first electrode (i.e., the pixel electrode) 134 is reflective while the second electrode 135 is transmissive or semi-transmissive. For example, the first electrode 134 is a positive electrode, and the second electrode 135 is a negative electrode. For example, the first electrode 134 is an ITO/Ag/ITO stacked structure. The transparent electrically conductive material ITO is a high-work-function material and may be in direct contact with a light emitting material to increase a hole injection rate. The metal material Ag is conducive to improving the reflectivity of the first electrode. For example, the second electrode layer 135 is made of a low-work-function material, e.g., a semi-transmitting metal or metal alloy material (e.g., an Ag/Mg alloy material), to act as the negative electrode.

For example, a material of each insulating layer is, e.g., an inorganic insulating layer, e.g., silicon oxides, silicon nitrides, or silicon oxynitrides, such as silicon oxide, silicon nitride, and silicon oxynitride, or an insulating material including metal oxynitrides such as aluminum oxide and titanium nitride.

For example, a material of the pixel defining layer 405 is an organic material, e.g., an organic insulating material such as polyimide (PI), acrylate, epoxy resin, and polymethyl methacrylate (PMMA).

For example, the base substrate 100 may be a rigid substrate, such as a glass substrate and a silicon substrate, and may also be formed from a flexible material with excellent heat resistance and durability, such as polyimide (PI), polycarbonate (PC), polyethylene terephthalate (PET), polyethylene, polyacrylate, polyarylate, polyetherimide, polyethersulfone, polyethylene terephthalate (PET), polyethylene (PE), polypropylene (PP), polysulfone (PSF), polymethyl methacrylate (PMMA), triacetate cellulose (TAC), cycloolefin polymer (COP), and cycloolefin copolymer (COC).

For example, a material of the semiconductor material 102 includes but is not limited to Si-based materials (amorphous silicon (a-Si), polycrystalline silicon (p-Si), etc.), metal-oxide semiconductors (IGZO, ZnO, AZO, IZTO, etc.), and organic materials (sexithiophene, polythiophene, etc.).

For example, the display substrate 20 includes the structure shown in FIG. 2. In the present embodiment, description is made by taking for example that the connection structure shown in FIG. 2 is disposed at a position where the first electrode 134 is connected to the connection electrode 232. However, the present disclosure is not limited thereto.

With reference to FIG. 6A to FIG. 6B, the connection electrode 232 (an example of the first conductive structure of the present disclosure) includes a bottom surface 232*a* close to the base substrate, a top surface 232*b* away from the base substrate, and a first side surface 232*c* located between the bottom surface 232*a* and the top surface 232*b*. The connection electrode 232 is electrically connected to the first electrode 314 (an example of the second conductive structure of the present disclosure) of the light emitting element through the via hole 350 (an example of the first via hole of the present disclosure). The via hole 350 overlaps at least in part the via hole 349 (an example of the first depression structure of the present disclosure) in the direction perpendicular to the base substrate such that the insulating layer 404 (an example of the second insulating layer of the present disclosure) is depressed downwards. The via hole 350 exposes at least a portion of the first side surface 232*c* of the connection electrode 232, and the first electrode 314 of the light emitting element is depressed downwards and includes a protrusion 314*a* (an example of the first protrusion of the present disclosure). The protrusion 314*a* is in contact with at least a portion of the first side surface 232*c* and covers the portion of the first side surface 232*c* that is exposed by the via hole 350.

As shown in FIG. 6A to FIG. 6B, the portions of the connection electrode 232 and the first electrode 134 that are in direct contact with the connection electrode 232 are both located between the signal lines on two sides.

As shown in FIG. 6A to FIG. 6B, the protrusion 314*a* is located between the signal lines on two sides of a pixel column (an example of the first pixel column of the present disclosure) where the sub-pixel is located, i.e., located between the first signal line on the left side and the second signal line on the right side. The first signal line is, for example, the data line 12 or the power line 250 connected to the sub-pixel, and the second signal line is, for example, the reset voltage line 260, the data line 12, or the power line 250 on the right side. The data line 12 and the power line 250 on the right side are connected to a pixel column (an example of the second pixel column of the present disclosure) adjacent to the pixel column. That is, an orthographic projection of the protrusion 314*a* on the base substrate 100 is located between an orthographic projection of the first signal line on the base substrate and an orthographic projection of the second signal line on the base substrate.

As shown in FIG. 6A, the orthographic projections of the first electrodes 134 of the light emitting elements of the first pixel column on the base substrate overlap at least in part the orthographic projection of the power line 250 on the left side thereof on the base substrate and the orthographic projection of the data line 12 on the right side thereof on the base substrate, respectively.

As shown in FIG. 6B, orthographic projections of electrodes, on a side close to the base substrate, of the light emitting elements of the first pixel column on the base substrate overlap at least in part the orthographic projection of the first signal line on the base substrate and the orthographic projection of the second signal line on the base substrate, respectively.

With the protrusion 134*a* of the first electrode 134 disposed in contact with the first side surface 232*c* of the connection electrode 232, not only is the contact area of the first electrode 134 and the connection electrode 232 increased and the contact resistance therebetween reduced, but also the longitudinal cross-sectional area of the first electrode 134 is effectively increased. Meanwhile, the protrusion 134*a* is disposed between the first signal line and the second signal line so that the mutual interference between the first signal line and the second signal line can also be reduced. For example, since a high-frequency signal is transmitted in the data line, it is easy to cause interference with signals in other signal lines. For example, the protrusion 134*a* may reduce the interference of the data line 12 on one side with a signal in the signal line (such as a data line, a power line, and a reset voltage line) on the other side.

With reference to FIG. 2 and FIG. 6A to FIG. 6B, the structure shown in FIG. 2 may be regarded as a portion of the sectional structure of the display substrate 20 along the section line A-A', i.e., the structure marked by the dotted line in FIG. 6B. The connection electrode 232, the first electrode 134, the protrusion 134*a*, the via hole 350, and the via hole 349 in FIG. 6B may be regarded as the first conductive structure 21, the second conductive structure 22, the protrusion 220, the via hole V1, and the depression structure G1 in FIG. 2, respectively. The description on FIG. 2 is also applicable to FIG. 6B, which will not be redundantly described here.

For example, as shown in FIG. 6A to FIG. 6B, the connection electrode 232 includes a protrusion 232*t* facing the via hole 349, and an orthographic projection of the protrusion 232*t* on the base substrate is located within the orthographic projection of the via hole 349 on the base substrate.

As shown in FIG. 6A, a distance between the orthographic projection of the protrusion 134*a* on the base substrate and the orthographic projection of the power line 250 (an example of the first signal line of the present disclosure) on the left side on the base substrate in the reference direction F (e.g., the first direction D1) is denoted as l, and the reference direction F is parallel to the surface of the base substrate, e.g., parallel to the first direction D1. For example, measurement may be performed with respect to the lowest point of the protrusion 134*a*. A distance between the orthographic projection of the data line 12 (an example of the second signal line of the present disclosure) on the right side on the base substrate and the orthographic projection of the power line 250 on the base substrate in the reference direction F is denoted as m.

Within the section cross shown in FIG. 6B, a size of a portion of the connection electrode 232 that is located on a side, away from the base substrate, of the insulating layer 403 in the direction perpendicular to the base substrate is denoted as e, and a size of a portion, covered by the protrusion 134*a*, of the first side surface 232*c* in the direction perpendicular to the base substrate is denoted as d. For example, $l/m>0.9(d/e)$. For example, $l/m>1.2*(d/e)$. The larger the distance of the protrusion 134*a* to the power line 250, the poorer the effect of shielding the right data line 12 from the left power line 250. Accordingly, the first side surface 232*c* needs to be more covered. With the above arrangement, it can be guaranteed that the protrusion 134*a* can well shield the interference of the data line 12 on the signal of the power line 250.

For example, as shown in FIG. 6A to FIG. 6B, orthographic projections of a plurality of pixel opening regions 600 on the base substrate are separated from, i.e., do not overlap, the orthographic projection of the protrusion 134*a* on the base substrate, thus avoiding poor display phenomena such as color cast caused by uneven light emitting materials in effective light emitting regions (i.e., the pixel opening regions) due to the provision of the protrusion 134*a*.

Figure 11:
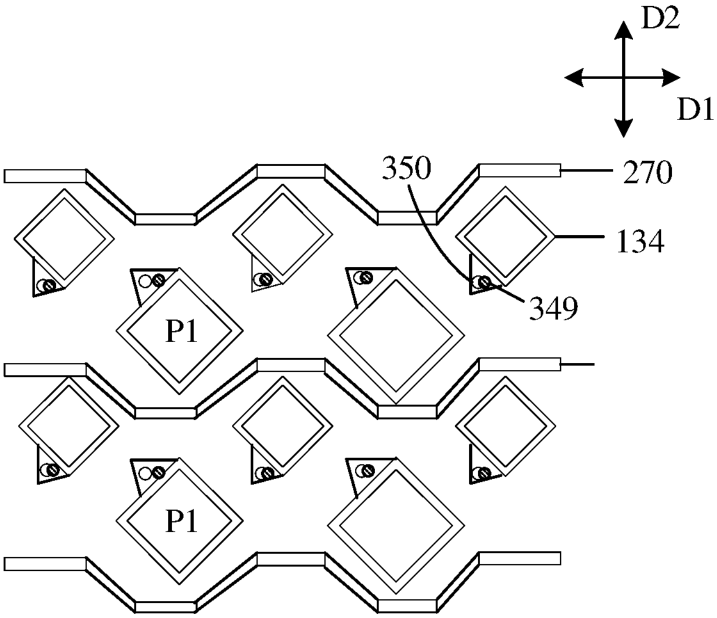
FIG. 11 is a sixteenth schematic diagram of a display substrate provided by at least one embodiment of the present disclosure.

FIG. 11 is a schematic diagram of a display substrate provided by some other embodiments of the present disclosure, in which the orthographic projections of the conductive layer 504, the via holes 349, and the via holes 350 on the base substrate are shown and in which the via holes 350 and the via holes 349 are schematically shown using hollow circles and solid circles, respectively.

As shown in FIG. 11, the insulating layer 403 includes a plurality of via holes 349 that correspond to a plurality of sub-pixels one to one. The plurality of via holes 349 are arranged in a plurality of via hole rows and a plurality of via hole columns in the first direction D1 and the second direction D2. The insulating layer 404 includes a plurality of via holes 350 that correspond to a plurality of sub-pixels one to one and disposed in one-to-one correspondence with the plurality of via holes 349. The plurality of via holes 349 are arranged in a plurality of via hole rows and a plurality of via hole columns in the first direction D1 and the second direction D2.

For example, overlapping situations of the via hole 349 and the via hole 350 in each sub-pixel overlap are different. As shown in FIG. 11, in the pixel column where the sub-pixel P1 is located, the orthographic projections of the via hole 349 and the via hole 350 on the base substrate do not overlap. Accordingly, the structure shown in FIG. 2 or FIG. 6B cannot be formed.

For example, for each row of sub-pixels, there are three continuous adjacent sub-pixels having the structure shown in FIG. 2 or FIG. 6B at an interval of one sub-pixel. That is, for each row of via holes 350, there are three continuous via holes 350 at an interval of one via hole 350, and each of the three via holes 350 overlaps the corresponding via hole 349 in the direction perpendicular to the base substrate to form the structure shown in FIG. 2 or FIG. 6B. The one via hole 350 does not overlap the corresponding via hole 349 in the direction perpendicular to the base substrate. For example, the one via hole corresponds to the red pixel.

For example, a plurality of columns of sub-pixels include a pixel column in which each sub-pixel has the structure shown in FIG. 2 or FIG. 6B (the first, third, fourth, and fifth columns of columns of sub-pixels shown in FIG. 11) or there is one sub-pixel having the structure shown in FIG. 2 or FIG. 6B at an interval of one sub-pixel. That is, there is a column of via holes 350 in which each via hole 350 overlaps the corresponding via hole 349 in the direction perpendicular to the base substrate to form the structure shown in FIG. 2 or FIG. 6B; alternatively, at an interval of one via hole 350, there is one via hole 350 overlapping the corresponding via hole 349 in the direction perpendicular to the base substrate to form the structure shown in FIG. 2 or FIG. 6B.

Figure 12A:
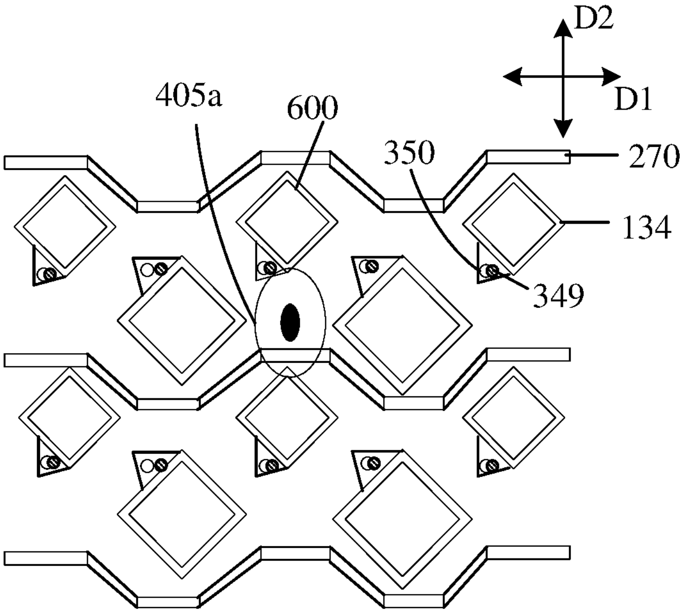
FIG. 12A is a seventeenth schematic diagram of a display substrate provided by at least one embodiment of the present disclosure.
Figure 12B:
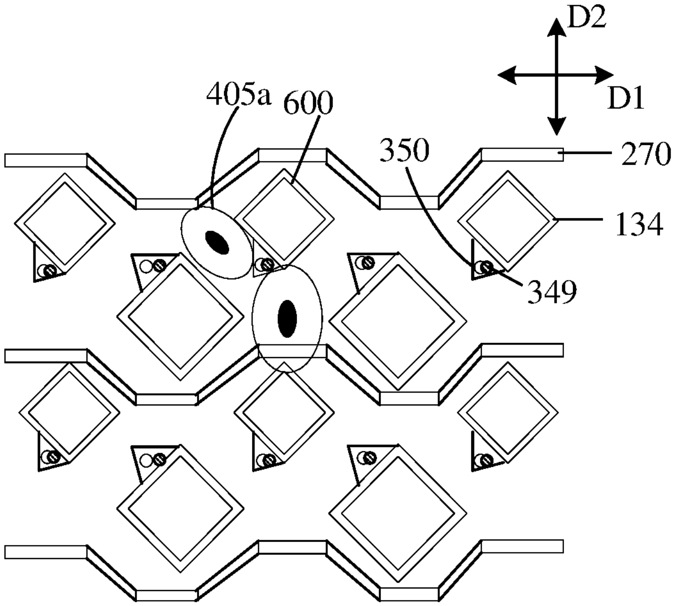
FIG. 12B is an eighteenth schematic diagram of a display substrate provided by at least one embodiment of the present disclosure.
Figure 12C:
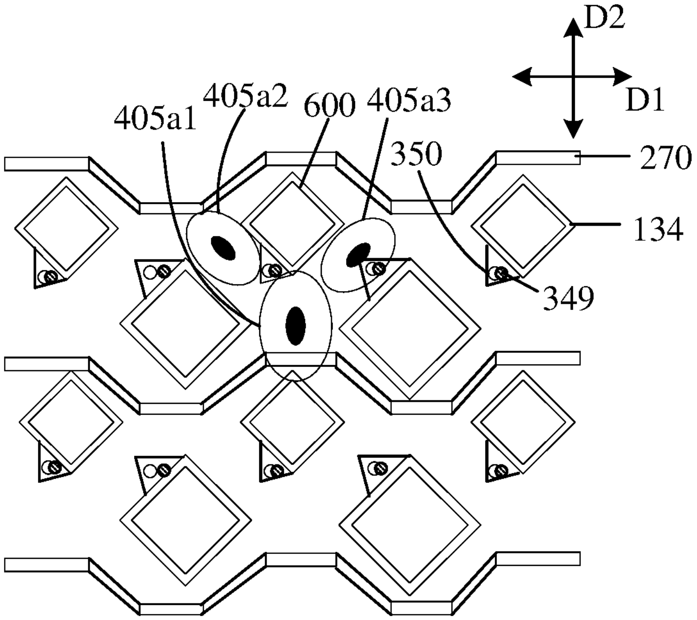
FIG. 12C is a nineteenth schematic diagram of a display substrate provided by at least one embodiment of the present disclosure.

FIG. 12A to FIG. 12C are schematic diagrams of a display substrate provided by some other embodiments of the present disclosure, in which the orthographic projections of the conductive layer 504, the pixel defining layer 405, the via holes 349, and the via holes 350 on the base substrate are shown and in which the via holes 350 and the via holes 349 are schematically shown using hollow circles and solid circles, respectively.

The pixel defining layer 405 includes a plurality of pixel opening regions 600 and a non-opening region. For example, the pixel defining layer 405 further has a plurality of spaced protrusion portions 405*a* formed in the non-opening region. That is, the pixel defining layer 405 has a nonuniform thickness. The protrusion portions 405*a* are capable of playing a role of supporting a mask during evaporation. In some examples, the protrusion portion is also referred to as a spacer.

As shown in FIG. 12A to FIG. 12C, for example, the protrusion portion is tapered. Orthographic projections of the bottoms and the tops of the protrusion portions 405*a* on the base substrate are schematically illustrated using hollow ellipses and solid ellipses in FIG. 12A to FIG. 12C, respectively.

For example, the orthographic projection of the via hole 350 on the base substrate is separated from, i.e., does not overlap, the orthographic projection of a portion having a maximum thickness of the pixel defining layer on the base substrate (i.e., the orthographic projection of the top of the protrusion portion 405*a*). Such an arrangement can avoid the adverse effect on the supporting function caused by uneven top of the protrusion portion 405*a* due to the provision of the via hole 350. For example, the unevenness of the protrusion portion 405*a* may lead to tilting of the mask, thus rendering the organic functional layer (including the light emitting layer) formed by evaporation uneven.

As shown in FIG. 12A to FIG. 12C, the protrusion portions 405*a* may have a different arrangement density. For example, one (as shown in FIG. 12A), two (as shown in FIG. 12B), or three (as shown in FIG. 12C) protrusion portions 405*a* may be disposed around one pixel opening region 600. An arrangement density of the protrusion portions may be determined according to a gap between the first electrodes 134. With a great density, the stability of supporting the mask can be improved.

As shown in FIG. 12C, three protrusion portions 405*a* are disposed around the pixel opening region 600: a first protrusion portion 405*a*1, a second protrusion portion 405*a*2, and a third protrusion portion 405*a*3. The first protrusion portion 405*a*1, the second protrusion portion 405*a*2, and the third protrusion portion 405*a*3 are disposed around the pixel opening region 600, and connecting lines of centers of orthographic projections thereof on the base substrate form a triangle.

For example, as shown in FIG. 12C, the first protrusion portion 405*a*1 is located between four adjacent pixel opening regions 600, and the second protrusion portion 405*a*2 and the third protrusion portion 405*a*3 are each located between two adjacent pixel opening regions. For example, an area of the orthographic projection of the first protrusion portion 405*a*1 on the base substrate is greater than an area of the orthographic projection of the second protrusion portion 405*a*2 on the base substrate and greater than an area of the orthographic projection of the third protrusion portion 405*a*3 on the base substrate.

Figure 9D:
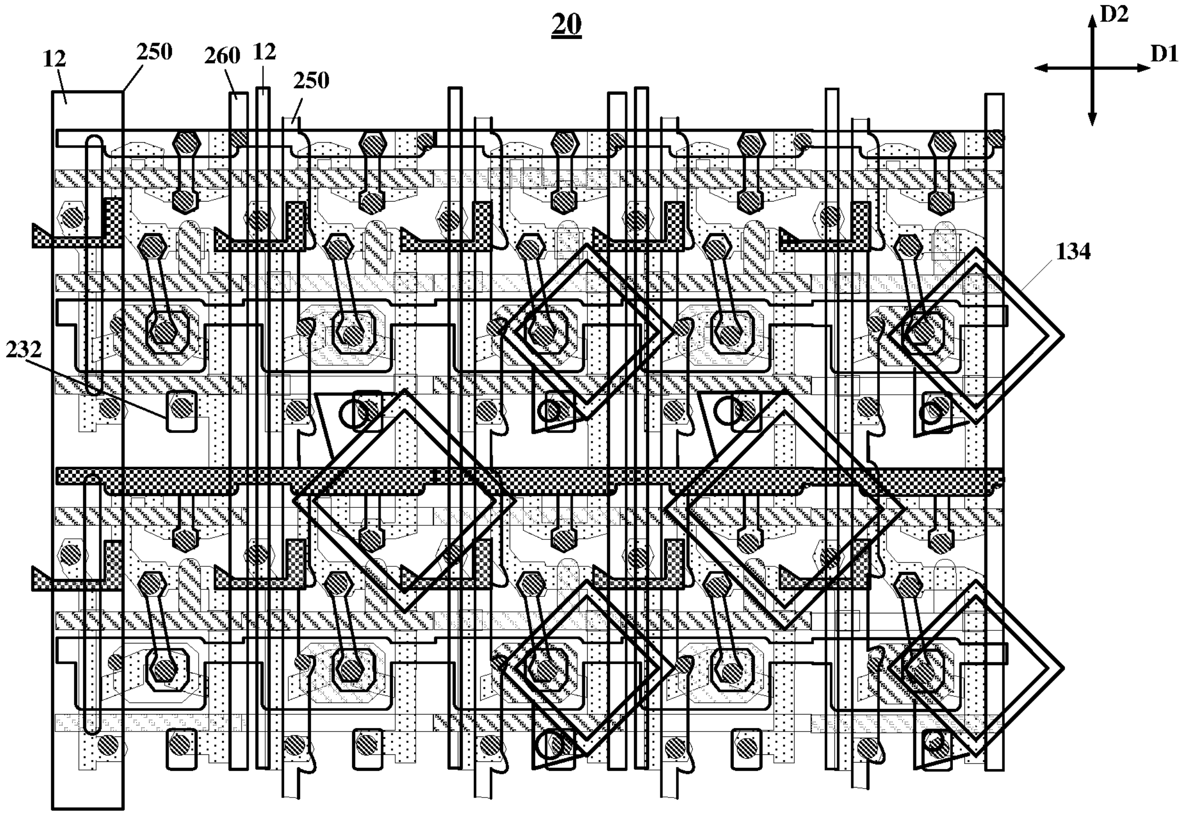
FIG. 9D is a twelfth schematic diagram of a display substrate provided by at least one embodiment of the present disclosure.

For example, as shown in FIG. 9D, the display substrate further includes a dummy area, such as the first column of sub-pixels starting from the left in FIG. 9D. The pixel structure is disposed in the dummy area in a substantially same way as in the display region, with a major difference that no light emitting element is disposed in the dummy area and there is no first electrode 134 (i.e., the second conductive structure). That is, in this column of sub-pixels, the orthographic projection of the first conductive structure on the base substrate is separated from the orthographic projection of the second conductive layer on the base substrate. The dummy area is provided to improve the uniformity of the process.

As shown in FIG. 9D, the connection electrode 232 (i.e., the first conductive structure) is disposed in the dummy area in a same way as in the effective display region. The connection manner of the connection electrode 232 is also the same as that in the effective display region, which will not be described here redundantly.

For example, in this case, a data line (an example of the third signal line in the present disclosure) and a power line (an example of the fourth signal line of the present disclosure) correspondingly connected to the sub-pixel column (an example of the third pixel column of the present disclosure, the first column of sub-pixels starting from the left side in FIG. 9D) are electrically connected to each other. That is, the two signal lines provide the same signal, e.g., a power voltage signal, and are located on the same side of the pixel column. Because of no problem of mutual interference of signals in the dummy area, there is no need for the protrusion of the first electrode 134 for shielding.

The structure of a display substrate provided by some other embodiments of the present disclosure will be described below exemplarily by taking the pixel circuit shown in FIG. 5B for example in conjunction with FIG. 13A to FIG. 13B, FIG. 14, FIG. 15, FIG. 16A to FIG. 16C, FIG. 17A to FIG. 17B, FIG. 18A to FIG. 18C, and FIG. 19A to FIG. 19C.

Figure 13A:
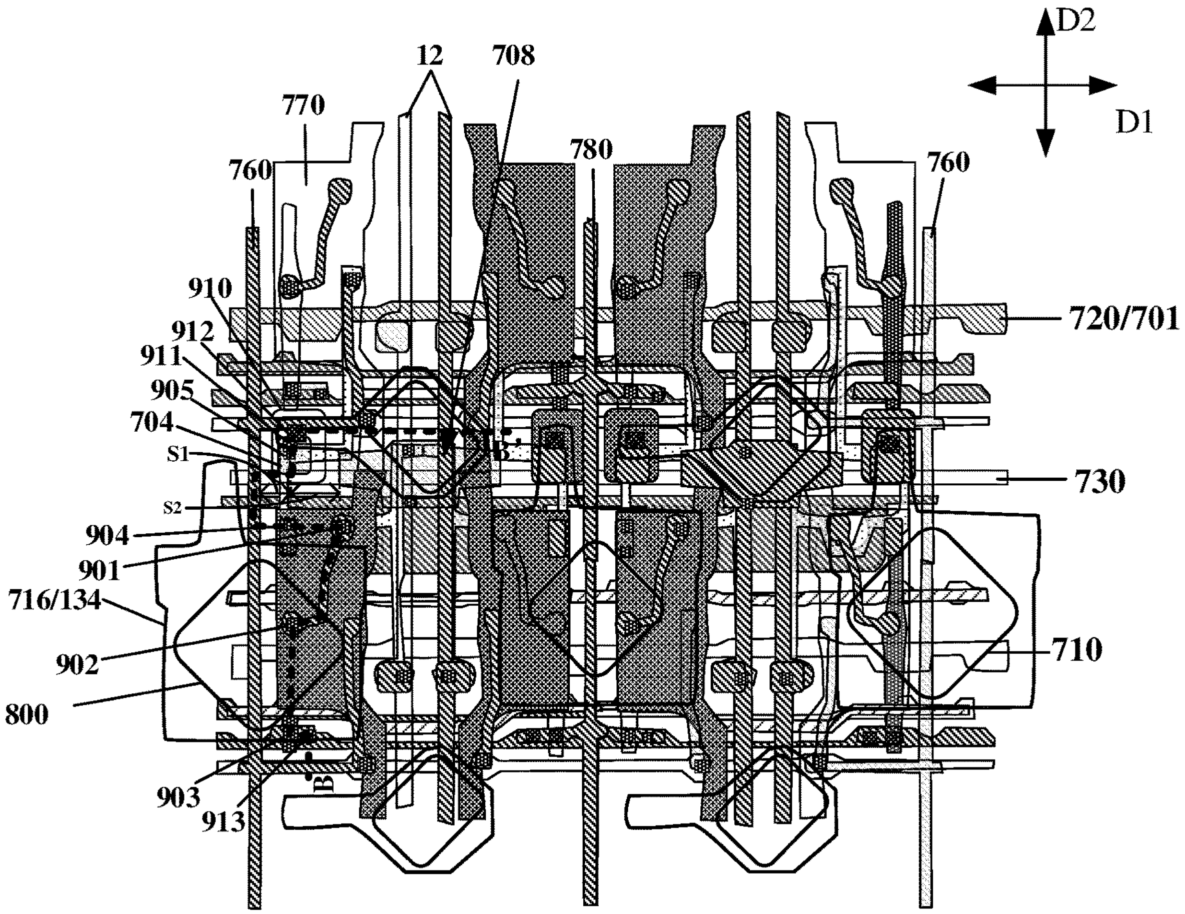
FIG. 13A is a twentieth schematic diagram of a display substrate provided by at least one embodiment of the present disclosure.
Figure 13B:
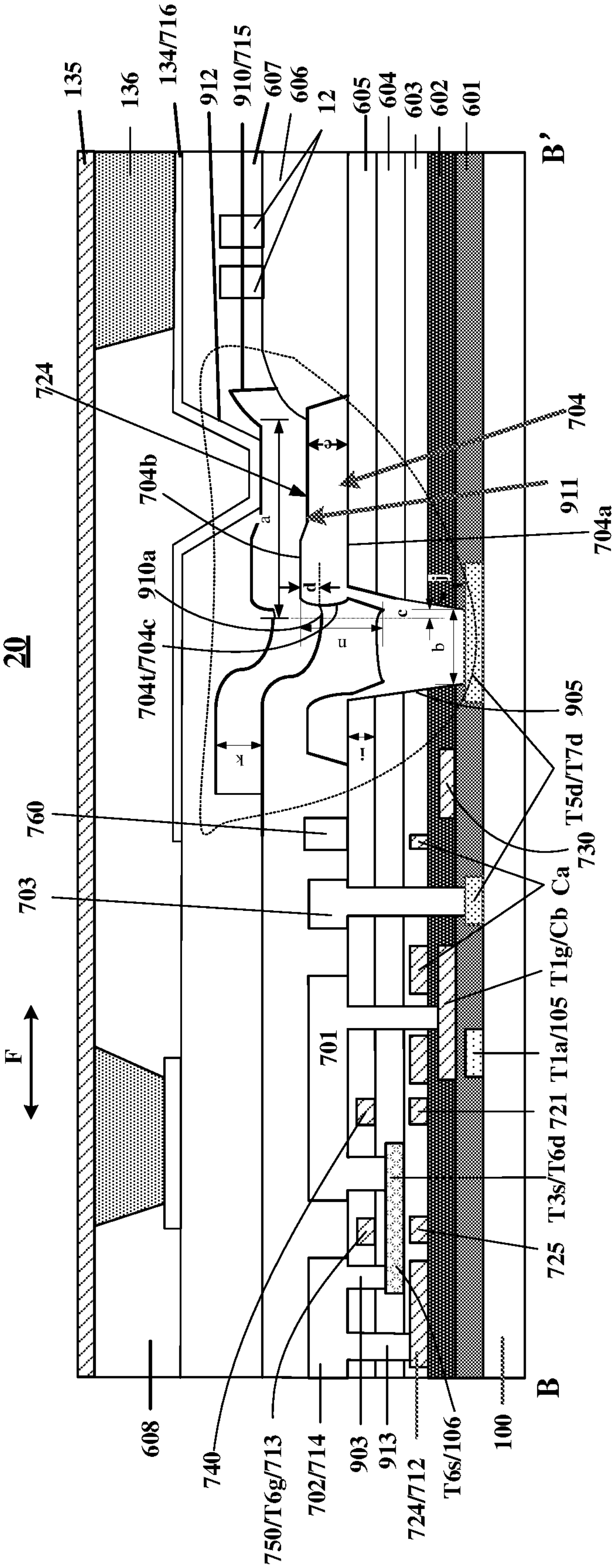
FIG. 13B is a sectional view taken along line B-B' in FIG. 13A.

FIG. 13A is a schematic diagram of a display substrate 20 provided by some other embodiments of the present disclosure, and FIG. 13B is a sectional view taken along section line B-B' in FIG. 13A. It needs to be noted that for the sake of clarity, some structures having no direct electrical connection relationship at the section line are omitted in FIG. 13B.

As shown in FIG. 13A, the array substrate 20 includes a base substrate 100, and a plurality of sub-pixels are located on the base substrate 100. Pixel circuits of the plurality of sub-pixels P are arranged in a pixel circuit array. For example, a row direction of the pixel circuit array is a first direction D1 and a column direction is a second direction D2. In some embodiments, the pixel circuits of the sub-pixels may have a completely identical structure. That is, the pixel circuits are arranged repeatedly in the row direction and the column direction.

For ease of description, FIG. 13A exemplarily illustrates four columns of sub-pixels. For example, as shown in FIG. 13A, an arrangement rule of the pixel circuit of a sub-pixels may be identical to or different from an arrangement rule of a pixel electrode (i.e., the first electrode of the light emitting element) thereabove. For ease of description, the description of the arrangement of the sub-pixels is made here with reference to the arrangement rule of the pixel circuit, and the description of a relative positional relationship of sub-pixels is made with reference to the relative position of the pixel circuits of the sub-pixels. For example, adjacent sub-pixels refer to sub-pixels of which the pixel circuits are adjacent. These are the same as above in the following embodiments, which will not be described redundantly.

For example, as shown in FIG. 13A to FIG. 13B, the display substrate 20 includes a semiconductor layer 105, an insulating layer 601, a conductive layer 711, an insulating layer 602, a conductive layer 712, an insulating layer 603, a semiconductor layer 106, an insulating layer 604, a conductive layer 713, an insulating layer 605, a conductive layer 714, an insulating layer 606, a conductive layer 715, an insulating layer 607, and a conductive layer 716 that are stacked on the base substrate 100 in sequence.

Figure 14:
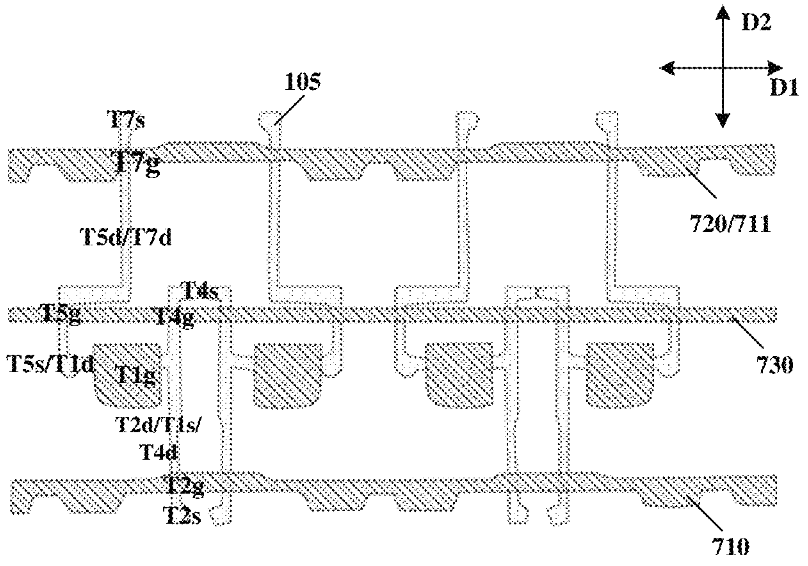
FIG. 14 is a twenty-first schematic diagram of a display substrate provided by at least one embodiment of the present disclosure.
Figure 15:
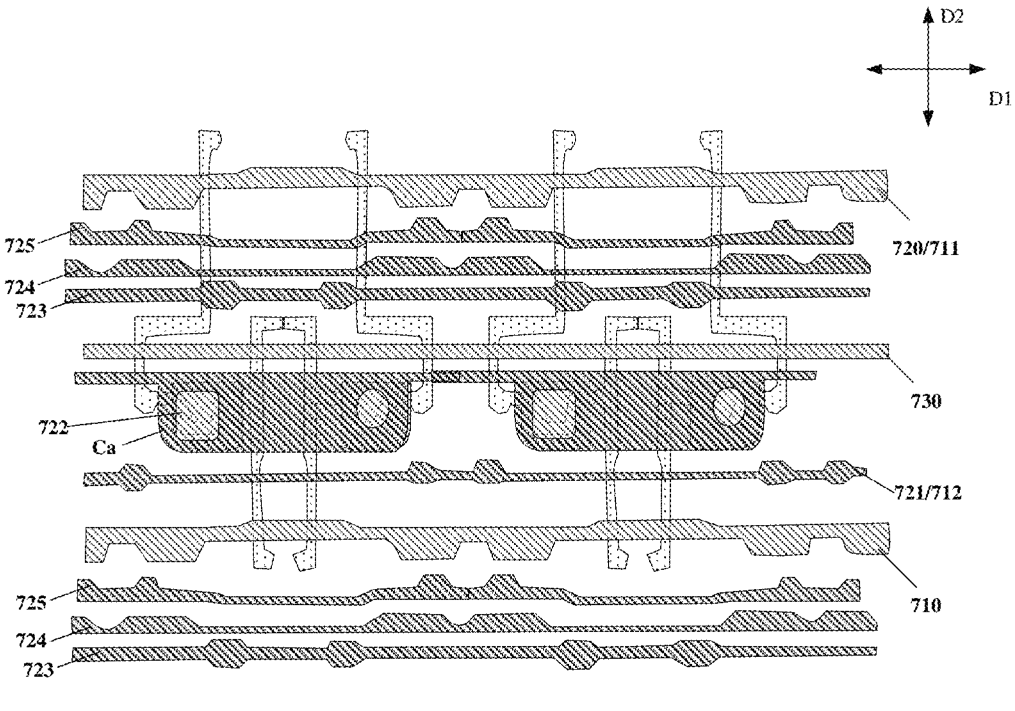
FIG. 15 is a twenty-second schematic diagram of a display substrate provided by at least one embodiment of the present disclosure.
Figure 16A:
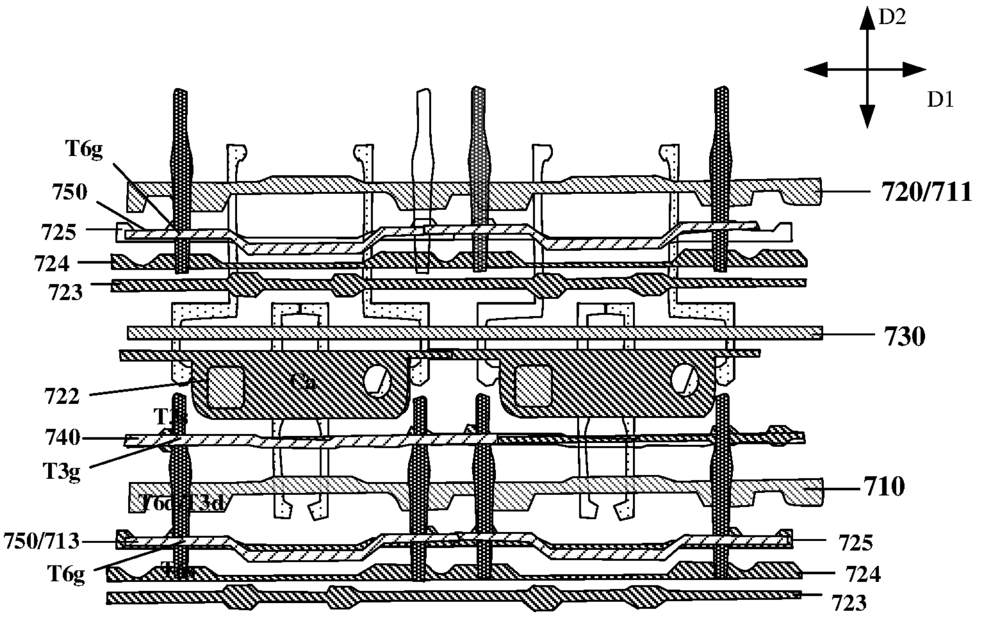
FIG. 16A is a twenty-third schematic diagram of a display substrate provided by at least one embodiment of the present disclosure.
Figure 17A:
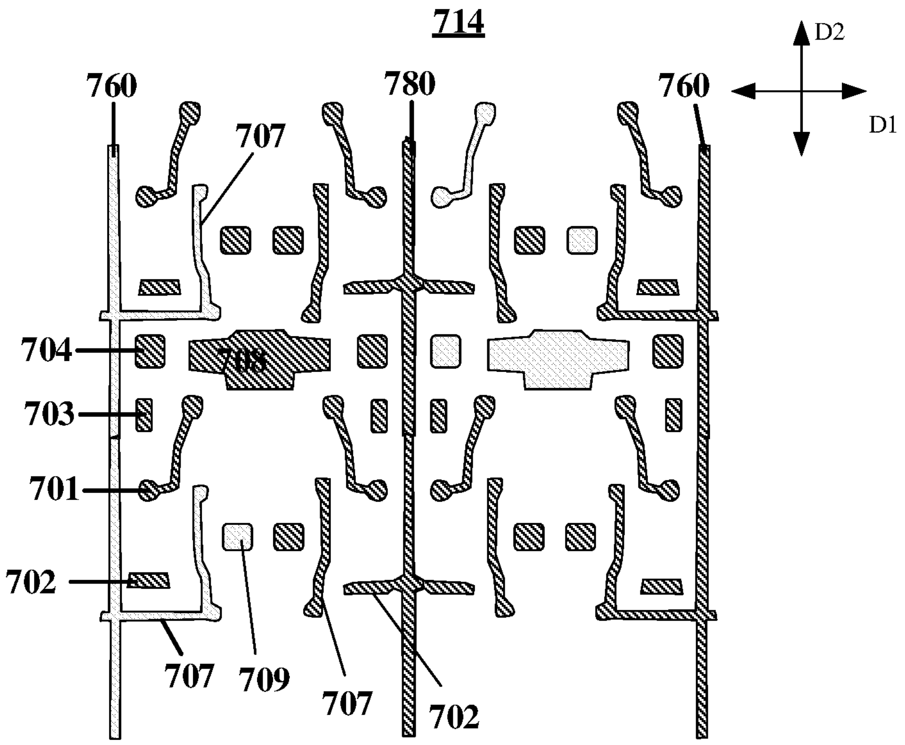
FIG. 17A is a twenty-sixth schematic diagram of a display substrate provided by at least one embodiment of the present disclosure.
Figure 17B:
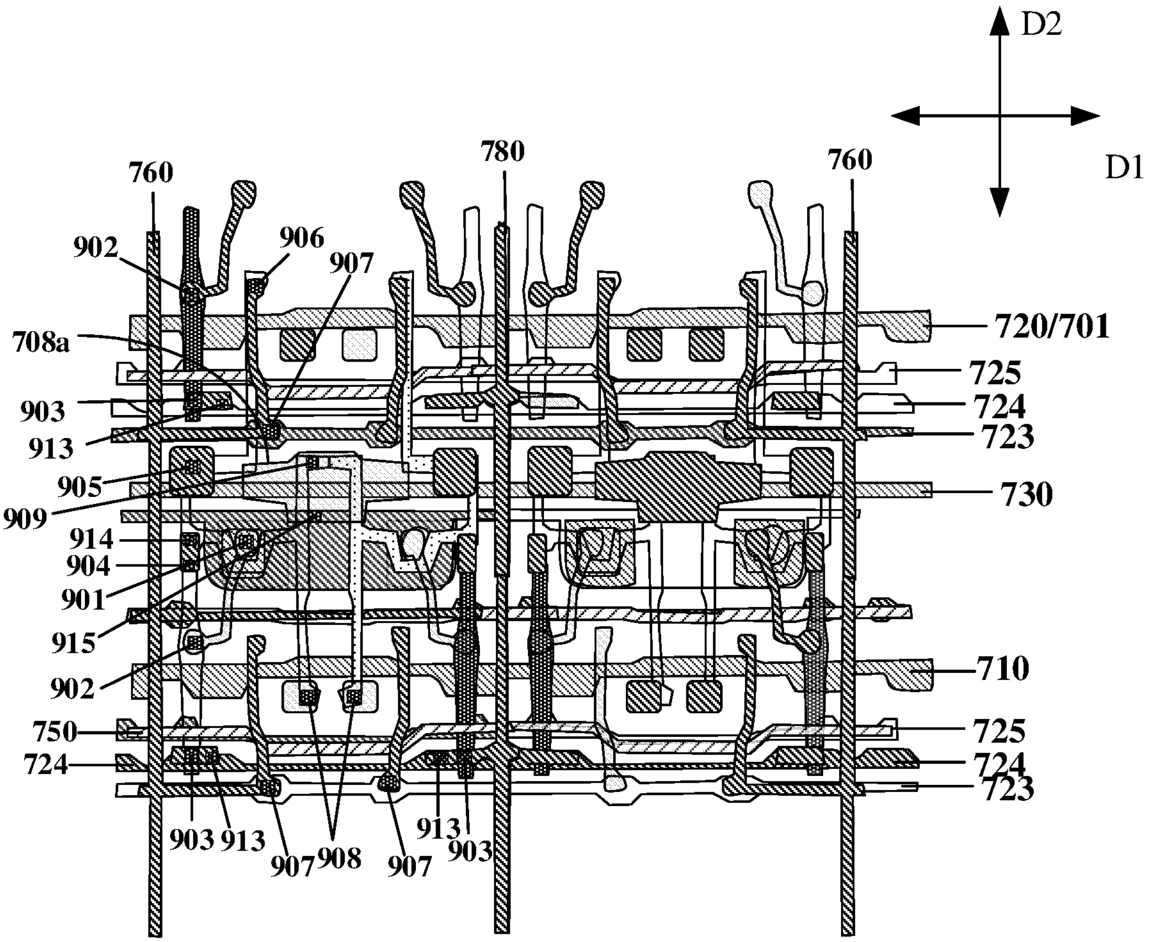
FIG. 17B is a twenty-seventh schematic diagram of a display substrate provided by at least one embodiment of the present disclosure.
Figure 18A:
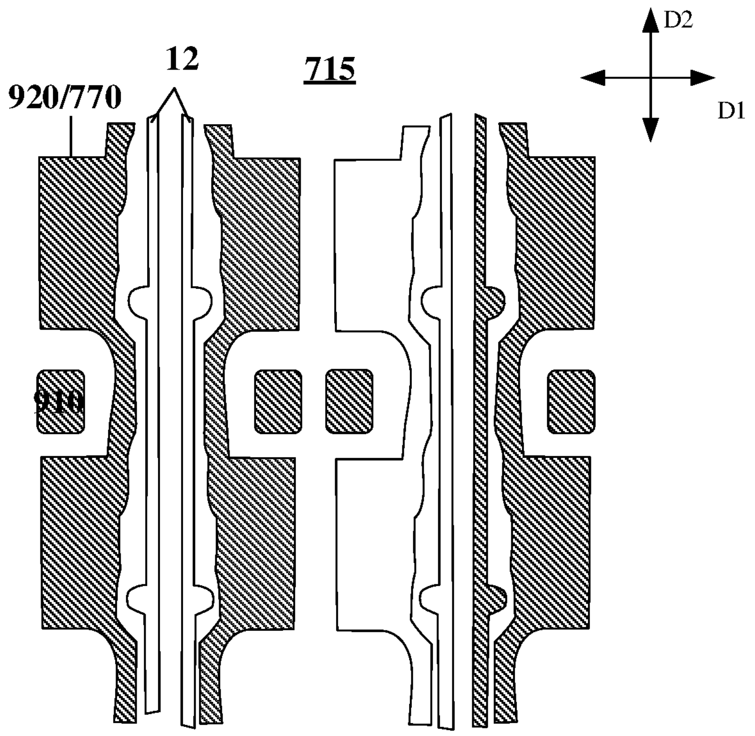
FIG. 18A is a twenty-eighth schematic diagram of a display substrate provided by at least one embodiment of the present disclosure.
Figure 18B:
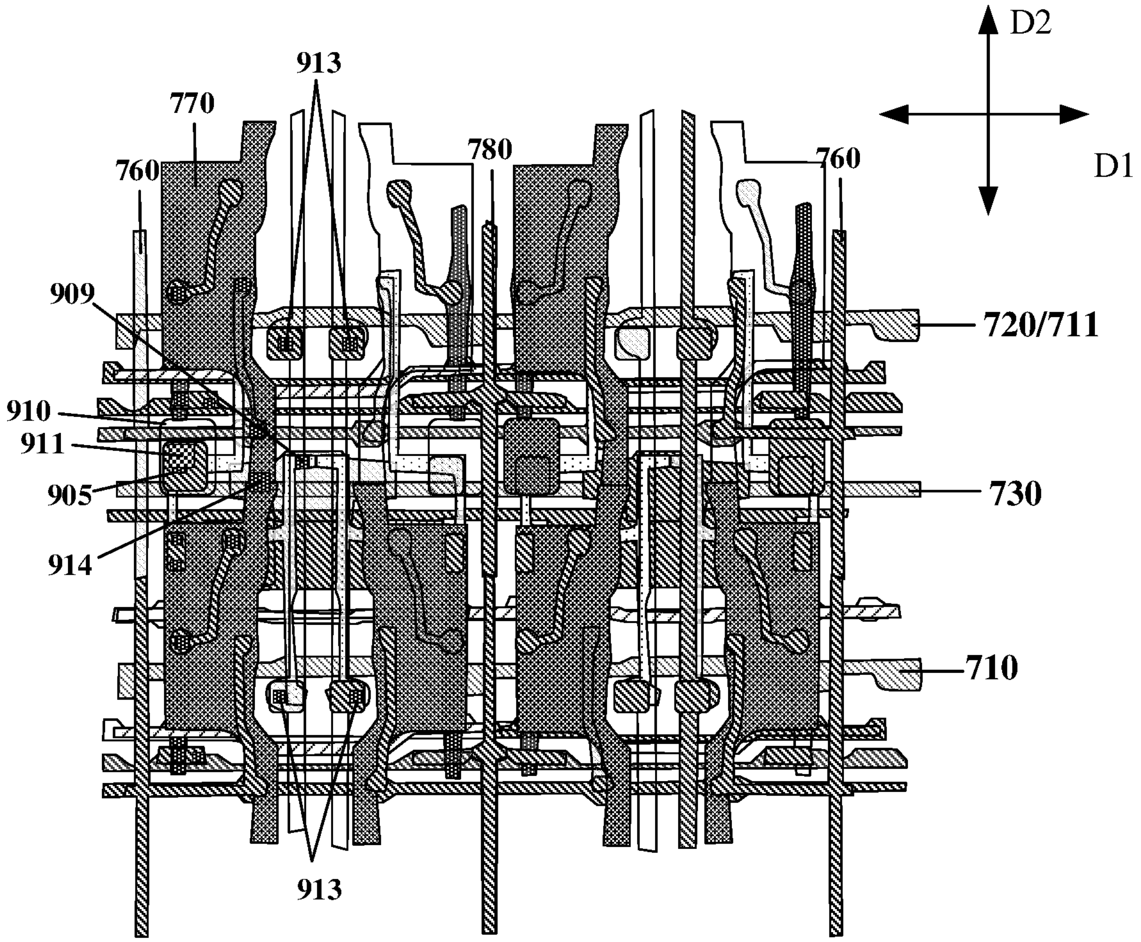
FIG. 18B is a twenty-ninth schematic diagram of a display substrate provided by at least one embodiment of the present disclosure.

FIG. 14 illustrates the semiconductor layer 105 and the conductive layer 711 (an example of the first metal layer of the present disclosure) corresponding to FIG. 13A; FIG. 15 illustrates the pattern of the conductive layer 712 on the basis of FIG. 14, and FIG. 16 illustrates the patterns of the semiconductor layer 106 and the conductive layer 713 on the basis of FIG. 15; FIG. 17A illustrates the conductive layer 714, and FIG. 17B illustrates the conductive layer 714 on the basis of FIG. 16A; FIG. 18A illustrates the conductive layer 715, and FIG. 18B illustrates the conductive layer 715 on the basis of FIG. 17B.

For ease of description, the gate, the first pole, the second pole, and a channel region of the nth transistor Tn are denoted by Tng, Tns, Tnd, and Tna in the following description, respectively, wherein n is 1 to 7.

It needs to be noted that the so-called "disposed in a same layer" in the present disclosure refers to that two (or more than two) structures are formed through a same deposition process and patterned through a same patterning process, but are not necessarily located in a same horizontal plane, and may be made of a same material or different materials. It needs to be noted that the so-called "integrated structure" in the present disclosure refers to a structure that is formed by connecting two (or more than two) structures formed through a same deposition process and patterned through a same patterning process to each other, and the structures may be made of a same material or different materials.

For example, as shown in FIG. 14, the semiconductor layer 105 includes the channel regions (T1*a*, T2*a*, T4*a*, T5*a*, and T7*a*), the first electrodes (T1*s*, T2*s*, T4*s*, T5*s*, and T7*s*), and the second electrodes (T1*d*, T2*d*, T4*d*, T5*d*, and T7*d*) of the first transistor T1, the second transistor T2, the fourth transistor T4, the fifth transistor T5, and the seventh transistor T7.

For example, the self-aligned process is carried out for the display substrate 20. The semiconductor layer 105 is processed into a conductor (e.g., doped) with the conductive layer 711 as a mask such that a portion of the semiconductor layer 105 that is not covered with the conductive layer 711 becomes a conductor. Thus, the portions, located on two sides of the channel region of each transistor, of the semiconductor layer are formed into conductors to act as the first electrode and the second electrode of the transistor, respectively. For example, the semiconductor layer 105 is made of a low-temperature polycrystalline silicon material.

For example, as shown in FIG. 14, the conductive layer 711 further includes a scan line 710, a reset control line 720, and a light emitting control line 730 that are insulated from one another. These signal lines may be examples of the gate lines 11 shown in FIG. 4.

The scan line 710 is electrically connected (or of an integrated structure) with the gates T2*g* of the second transistors T2 in the corresponding row of sub-pixels to provide the first scanning signal Ga1, and the reset control line 720 is electrically connected (or of an integrated structure) with the gates T6*g* of the sixth transistors T6 in the corresponding row of sub-pixels to provide the first reset control signal Rst1. The light emitting control line 730 is electrically connected to the gates T4*g* of the fourth transistors T4 in the corresponding row of sub-pixels to provide the first light emitting control signal EM1. For example, the scan line 710 for the current row of sub-pixels may act as the reset control line 720 for next row of sub-pixels.

For example, as shown in FIG. 14, the light emitting control line 730 is further electrically connected to the gates T5*g* of the fifth transistors T5 to provide the second light emitting control signal EM2. That is, the first light emitting control signal EM1 and the second light emitting control signal EM2 are the same signal.

For example, as shown in FIG. 15, the conductive layer 712 (an example of the second metal layer of the present disclosure) includes a first capacitor electrode Ca. The first capacitor electrode Ca overlaps the gate T1*g* of the first transistor T1 in the direction perpendicular to the base substrate 100 to form a storage capacitor Cst. That is, the gate T1*g* of the first transistor T1 acts as a second capacitor electrode Cb of the storage capacitor Cst. For example, the first capacitor electrode Ca includes an opening 722. The opening 722 exposes at least a portion of the gate T1*g* of the first transistor T1 so that the gate T1*g* is electrically connected to other structure. For example, the first capacitor electrodes Ca of the sub-pixels located in a same row are connected to one another into an integrated structure.

As shown in FIG. 15, the openings 722 in the adjacent sub-pixels in the first direction D1 are different in size. For example, the sub-pixel having a larger opening 722 is a green pixel, and the sub-pixel having a smaller opening 722 is a red pixel or a blue pixel.

Lightening voltages and data signals for the green pixel, the red pixel, and the blue pixel are different. The driving circuit of the green pixel needs to be adjusted to increase the charging speed of the green pixel so that the uniformity of display can be improved. A large opening 722 is provided so that the area of the first capacitor electrodes Ca can be reduced, allowing the green pixel to have a small storage capacitor Cst and thus increasing the charging speed. In some other embodiments, the storage capacitance of the green pixel may also be reduced in other ways, e.g., by reducing the area of the second capacitor electrode Cb or adjusting a width to length ratio of the driving transistor.

For example, the conductive layer 712 may further include a first auxiliary control line 721, a second auxiliary control line 725, and reset voltage lines 723 and 724 that extend in the first direction D1, which will be specifically described below with reference to FIG. 16A and FIG. 17A to FIG. 17B.

As shown in FIG. 16A, the semiconductor layer 106 includes the channel regions (T3*a* and T6*a*) of the third transistor T3 and the sixth transistor T6, the first electrodes (T3*s* and T6*s*) of the third transistor T3 and the sixth transistor T6, and the second electrodes (T3*d* and T6*d*) of the third transistor T3 and the sixth transistor T6. The conductive layer 713 includes a scan line 740 and a reset control line 750 that extend in the first direction D1.

For example, the semiconductor layer 106 is made of an oxide semiconductor, e.g., a material such as IGZO, ZnO, AZO, and IZTO.

The oxide thin-film transistors have the advantage of small leakage current. Since the third transistor T3 and the sixth transistor T6 are transistors directly connected to the gate of the first transistor T1 (i.e., the driving transistor). Therefore, the stability of the third transistor T3 and the sixth transistor T6 directly affects the stability of the voltage of the gate of the first transistor T1 (the node N1). The third transistor T3 and the sixth transistor are N-type metal oxide thin-film transistors, which is conducive to reducing the leakage current of the transistors and thus conducive to maintaining the voltage of the node N1. Thus, at the compensation phase, the threshold voltage of the first transistor T1 can be compensated fully, and then the display uniformity of the display substrate at the light emitting phase is improved.

For example, the self-aligned process is carried out for the display substrate 20. The second semiconductor layer 106 is processed into a conductor (e.g., doped) with the conductive layer 713 as a mask such that a portion of the semiconductor layer 106 that is not covered with the conductive layer 713 becomes a conductor. Thus, the portions, located on two sides of the channel regions of the third transistor T3 and the sixth transistor T6, of the semiconductor layer 106 are formed into conductors to act as the first electrodes and the second electrodes of the third transistor T3 and the sixth transistor T6, respectively.

For example, with reference to FIG. 13A to FIG. 13B and FIG. 16A, in the direction perpendicular to the base substrate, the scan line 740 overlaps at least in part the first auxiliary control line 721. For example, an orthographic projection of the channel region T3*a*, located below the scan line 740, of the third transistor T3 on the base substrate is located within an orthographic projection of the first auxiliary control line 721 on the base substrate.

Thus, the first auxiliary control line 721 may serve as a light shading layer to prevent light from being incident on the channel region of the third transistor T3 from the back of the channel region to produce a bad influence on the characteristic of the third transistor T3. For example, the oxide semiconductor material is sensitive to light. When the channel region of the third transistor T3 is made of the oxide semiconductor material, a threshold drift of the third transistor T3 may be caused easily when light is incident on the channel region. With the first auxiliary control line 721, the stability of the third transistor T3 can be improved, thereby further stabilizing the gate voltage of the first transistor T1.

For example, the scan line 740 and the first auxiliary control line 721 are configured to receive a same scanning signal. Thus, the third transistor T3 forms a double-sided gate structure, thereby improving the gate control capability of the third transistor T3 and further stabilizing the gate voltage of the first transistor T1.

For example, with reference to FIG. 13A to FIG. 13B and FIG. 16A, in the direction perpendicular to the base substrate, the reset control line 750 overlaps at least in part the second auxiliary control line 725. For example, the orthographic projection of the channel region T6*a*, located below the reset control line 750, of the sixth transistor T6 on the base substrate is located within an orthographic projection of the second auxiliary control line 725 on the base substrate.

Thus, the first second auxiliary control line 725 may serve as a light shading layer to prevent light from being incident on the channel region of the sixth transistor T6 from the back of the channel region to produce a bad influence on the characteristic of the sixth transistor T6. For example, the oxide semiconductor material is sensitive to light. When the channel region of the sixth transistor T6 is made of the oxide semiconductor material, a threshold drift of the sixth transistor T6 may be caused easily when light is incident on the channel region. With the second auxiliary control line 725, the stability of the sixth transistor T6 can be improved, thereby further stabilizing the gate voltage of the first transistor T1.

For example, the reset control line 750 and the second auxiliary control line 725 are configured to receive a same scanning signal. Thus, the sixth transistor T6 forms a double-sided gate structure, thereby improving the gate control capability of the sixth transistor T6 and further stabilizing the gate voltage of the first transistor T1.

In some other examples, the active layer of the seventh transistor T7 may also be disposed in the semiconductor layer 106, e.g., made of an oxide semiconductor material. Since the seventh transistor T7 is directly electrically connected to the first electrode 134 of the light emitting element 120, such an arrangement can reduce the leakage current of the seventh transistor T7 and improve the stability of the potential of the first electrode 134, thus improving the stability of light emission.

Figure 16B:
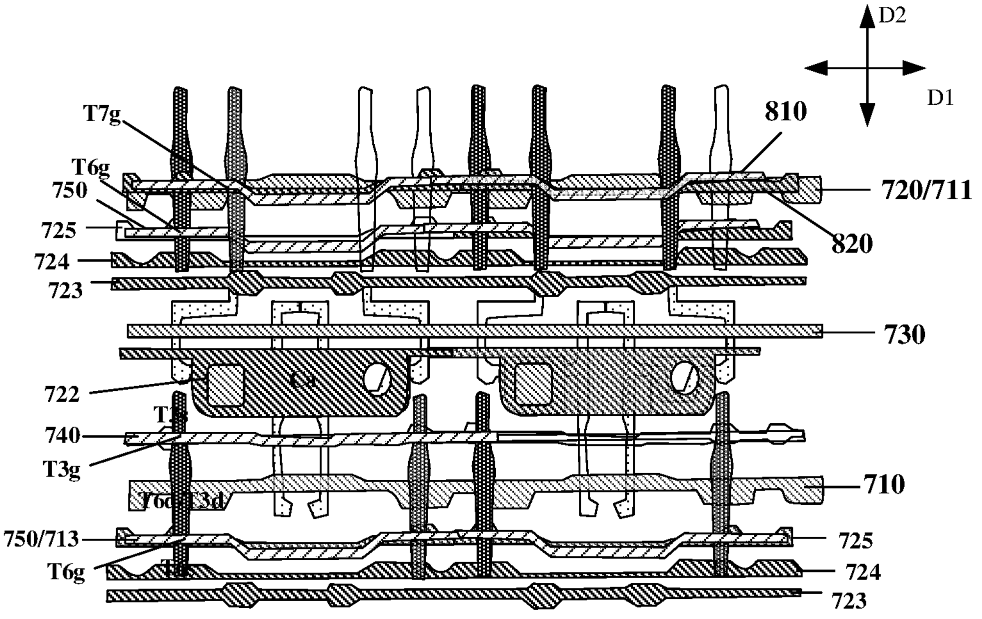
FIG. 16B is a twenty-fourth schematic diagram of a display substrate provided by at least one embodiment of the present disclosure.

As shown in FIG. 16B, in this case, the conductive layer 712 further includes an auxiliary control line 810 (an example of the first reset control line of the present disclosure), and the conductive layer 713 further includes a reset control line 820 (an example of the second reset control line of the present disclosure). The reset control line 820 and the auxiliary control line 810 are configured to provide gate voltage control on the seventh transistor T7. For example, the reset control line 820 and the auxiliary control line 810 are configured to receive a same scanning signal. Thus, the seventh transistor T7 forms a double-sided gate structure, thereby improving the gate control capability of the seventh transistor T7 and further stabilizing the voltage of the first electrode 134.

In the direction perpendicular to the base substrate, the reset control line 820 overlaps at least in part the auxiliary control line 810. For example, an orthographic projection of the channel region, located below the reset control line 820, of the seventh transistor T7 on the base substrate is located within an orthographic projection of the auxiliary control line 810 on the base substrate.

In this case, the connection manner of the seventh transistor T7 needs to be adapted. For example, the second electrode T7*d* of the seventh transistor T7 is no longer directly electrically connected to the second electrode T5*d* of the seventh transistor T5 in the semiconductor layer 105, and instead, through a via hole, which will not be redundantly described here.

Figure 16C:
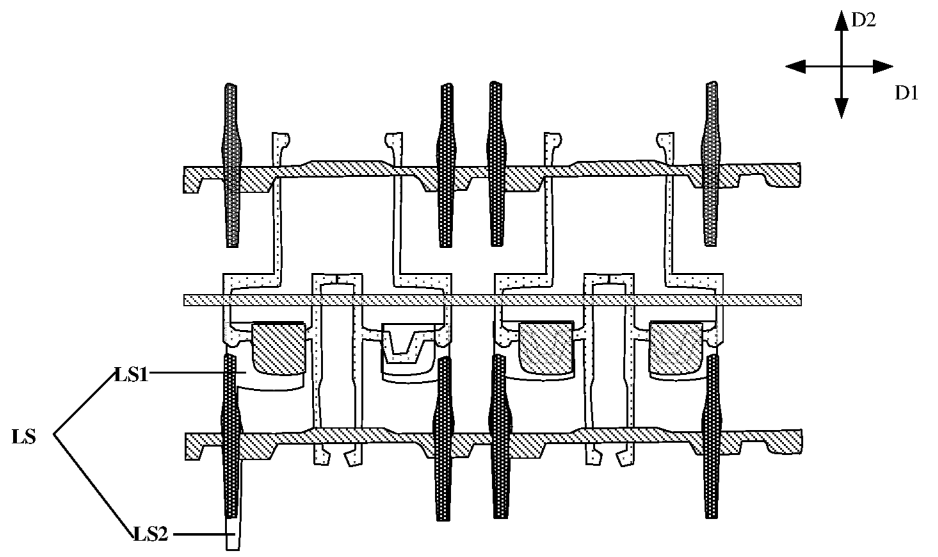
FIG. 16C is a twenty-fifth schematic diagram of a display substrate provided by at least one embodiment of the present disclosure.

FIG. 16C illustrates a schematic diagram of a display substrate provided by still another examples of the present disclosure. As shown in FIG. 16C, the display substrate further includes a light shading layer LS located on a side, close to the base substrate 100, of the semiconductor layer 105. The light shading layer LS is configured to shade the channel region of the transistor, thus preventing a threshold drift of the transistor caused when light is incident on the channel region (e.g., from the back or a side surface). For example, the light shading layer LS includes a first light shading pattern LS1. The first light shading pattern LS1 is disposed correspondingly to the channel region T1*a* of the first transistor, and an orthographic projection of the channel region T1*a* on the base substrate falls within the first light shading pattern LS1, thus shielding the channel region of the first transistor and improving the stability of the first node N1.

For example, the light shading layer LS may further include a second light shading pattern LS2. The second light shading pattern LS2 is disposed correspondingly to the channel regions of the third transistor T3 and the sixth transistor T6, and orthographic projections of the channel regions of the third transistor T3 and the sixth transistor T6 on the base substrate fall within the second light shading pattern LS2, thus shielding the channel regions of the third transistor T3 and the sixth transistor T6. The leakage currents of the third transistor T3 and the sixth transistor T6 are effectively reduced, and the stability of the first node N1 is further improved.

For example, the light shading layer LS may be made of, for example, a metal material, or an organic or inorganic insulating light shading material.

For example, with reference to FIG. 13A to FIG. 13B and FIG. 17A to FIG. 17B, the conductive layer 714 includes a connection electrode 701. One end of the connection electrode 701 is electrically connected to the gate electrode T1*g* (i.e., the second capacitor electrode Cb) of the first transistor T1 through the opening 722 in the first capacitor electrode Ca and a via hole 901 in the insulating layer, and the other end of the same is electrically connected to the second electrode T3*d* of the third transistor T3 through a via hole 902. Thus, the second capacitor electrode Cb is electrically connected to the second electrode T3*d* of the third transistor T3.

For example, with reference to FIG. 13A to FIG. 13B and FIG. 17A to FIG. 17B, the conductive layer 714 further includes a connection electrode 703. The connection electrode 703 is electrically connected to the first electrode T3*s* of the third transistor T3 and the first electrode T5*s* of the fifth transistor T5 through a via hole 904 and a via hole 914, respectively. Thus, the first electrode T3*s* of the third transistor T3 is electrically connected to the first electrode T5*s* of the fifth transistor T5.

For example, the conductive layer 714 further includes a connection electrode 704. The connection electrode 704 is electrically connected to the second electrode T5*d* of the fifth transistor T5 and the second electrode T7*d* of the seventh transistor T7 through via holes 905 to electrically connect the second electrode T5*d* of the fifth transistor T5 and the second electrode T7*d* of the seventh transistor T7 with the first electrode 134 of the light emitting element 120.

For example, the conductive layer 714 further includes a connection electrode 708 configured to load the first power voltage VDD. The connection electrode 708 is electrically connected to the first electrode T4*s* of the fourth transistor T4 and the first capacitor electrode Ca through a via hole 909 and a via hole 915, respectively.

For example, the conductive layer 714 further includes a connection electrode 709. The connection electrode 709 is electrically connected to the first electrode T2*s* of the second transistor T2 through a via hole 908.

For example, with reference to FIG. 17A to FIG. 17B, the conductive layer 714 further includes a connection electrode 702. For example, the connection electrode 702 is electrically connected to the first electrode T6*s* of the sixth transistor T6 (an example of the gate reset transistor of the present disclosure) and the reset voltage line 724 through a via hole 903 and a via hole 913, respectively. Thus, the first electrode T6*s* of the sixth transistor T6 is electrically connected to the reset voltage line 724 such that the first electrode T6*s* of the sixth transistor T6 is capable of receiving the first reset voltage Vinit1 from the reset voltage line 724.

For example, as shown in FIG. 17A to FIG. 17B, the conductive layer 714 further includes a connection electrode 707. The connection electrode 707 is electrically connected to the first electrode T7*s* of the seventh transistor T7 (an example of the pixel electrode reset transistor of the present disclosure) and the reset voltage line 723 (an example of the first pixel electrode reset voltage line of the present disclosure) through a via hole 906 (an example of the fourth via hole of the present disclosure) and a via hole 907, respectively. Thus, the first electrode T7*s* of the seventh transistor T7 is electrically connected to the reset voltage line 723 such that the first electrode T7*s* of the seventh transistor T7 is capable of receiving the second reset voltage Vinit2 from the reset voltage line 723.

For example, as shown in FIG. 17A to FIG. 17B, the conductive layer 714 further includes reset voltage lines 760 and 780 extended in the second direction D2. In the first direction D1, the reset voltage lines 760 and the reset voltage lines 780 are disposed alternately. The adjacent reset voltage line 760 and reset voltage line 780 are spaced apart by two columns of sub-pixels. The connection electrodes 708 in the two columns of sub-pixels are, for example, of an integrated structure. Every two adjacent columns of sub-pixels share one reset voltage line 760 or one reset voltage line 780. The reset voltage lines 760 are configured to provide the second reset voltage Vinit2, and the reset voltage lines 780 are configured to provide the first reset voltage Vinit1.

As shown in FIG. 17A to 17B, the reset voltage line 760 (an example of the second pixel electrode reset voltage line of the present disclosure) is electrically connected to the connection electrodes 707 in the adjacent sub-pixels, e.g., connected into an integrated structure, and thus are electrically connected to the transverse reset voltage lines 723 to form a crisscross reticular conductive structure. The reticular conductive structure may reduce the resistance, thus reducing a voltage drop and being conducive to transferring the second reset voltage Vinit2 uniformly to the sub-pixels on the substrate.

As shown in FIG. 17A to 17B, the reset voltage line 780 (an example of the second gate reset voltage line of the present disclosure) are electrically connected to the connection electrodes 702 in the adjacent sub-pixels, e.g., connected into an integrated structure, and thus are electrically connected to the transverse reset voltage line 724 to form a crisscross reticular conductive structure. The reticular conductive structure may reduce the resistance, thus reducing a voltage drop and being conducive to transferring the first reset voltage Vinit1 uniformly to the sub-pixels on the substrate.

For example, the conductive layer 715 further includes a plurality of data lines 12 extended in the second direction D2. For example, the plurality of data lines 12 are electrically connected to a plurality of columns of sub-pixels in one-to-one correspondence to provide the data signal Vd. Each data line 12 is electrically connected to the first electrode T2*s* of the second transistor T2 in the corresponding column of sub-pixels to provide the data signal Vd.

With reference to FIG. 18A to FIG. 18B, the data line 12 is electrically connected to the connection electrode 709 through the via hole 913 and thus connected to the first electrode T2*s* of the second transistor T2.

For example, the conductive layer 715 further includes a plurality of power electrodes 920. The plurality of power electrodes 920 are disposed in one-to-one correspondence with the plurality of sub-pixels to provide the first power voltage VDD. The power electrode 920 includes a depression structure configured to be provided with other conductive structure (e.g. the connection electrode 910 mentioned below). The power electrodes 920 corresponding to a column of sub-pixels are connected to one another into an integrated structure so as to form a power line 770 extended in the second direction D2.

With reference to FIG. 18A to FIG. 18B, each power line 770 is electrically connected to the connection electrodes 708 in the corresponding column of sub-pixels through via holes 914 such that the first power voltage VDD is delivered to the first electrode T4*s* of the fourth transistor T4 and the first capacitor electrode Ca through the connection electrode 708.

For example, as shown in FIG. 18B, a data line group is disposed between every two adjacent columns of sub-pixels. The data line group includes two data lines 12 that are configured to provide data signals for the two columns of sub-pixels, respectively. Two adjacent data line groups are spaced apart by two columns of sub-pixels.

The orthographic projections of the two data lines 12 on the base substrate 100 do not overlap the orthographic projections of the reset voltage lines 760 and 780 on the base substrate, thus avoiding the generation of parasitic capacitance.

Adjacent power lines 770 are spaced apart from each other. For example, as shown in FIG. 18A to FIG. 18B, a data line group is disposed between every two adjacent power lines 770, and adjacent data line groups are spaced apart by two power lines 770. The two power lines between two adjacent data line groups are spaced apart from each other in order to avoid the generation of parasitic capacitance due to overlapping with the reset voltage line 780 or the reset voltage line 760 below them. In other words, the reset voltage line 780 or the reset voltage line 760 is disposed correspondingly to a gap between the two adjacent power lines 770.

With reference to FIG. 13A to FIG. 13B and FIG. 18A to FIG. 18B, the conductive layer 715 further includes a connection electrode 910. The connection electrode 910 is electrically connected to the connection electrode 704 through a via hole 911 to electrically connect the connection electrode 704 with the first electrode 134 of the light emitting element 120. As shown in FIG. 13A to FIG. 13B, the connection electrode 910 is electrically connected to the first electrode 134 of the light emitting element 120 through a via hole 912.

With the connection electrodes 910 and 704 as transfer electrodes, the first electrode of the transistor below is led out to be electrically connected to the light emitting element above. Such an arrangement may avoid poor connection, line breakage, or unevenness resulting from an excessive filling depth of an electrically conductive material due to a directly penetrating via hole in the direction perpendicular to the base substrate. With the transfer electrodes, the depth of the via hole is reduced and the contact efficiency is improved.

Figure 18C:
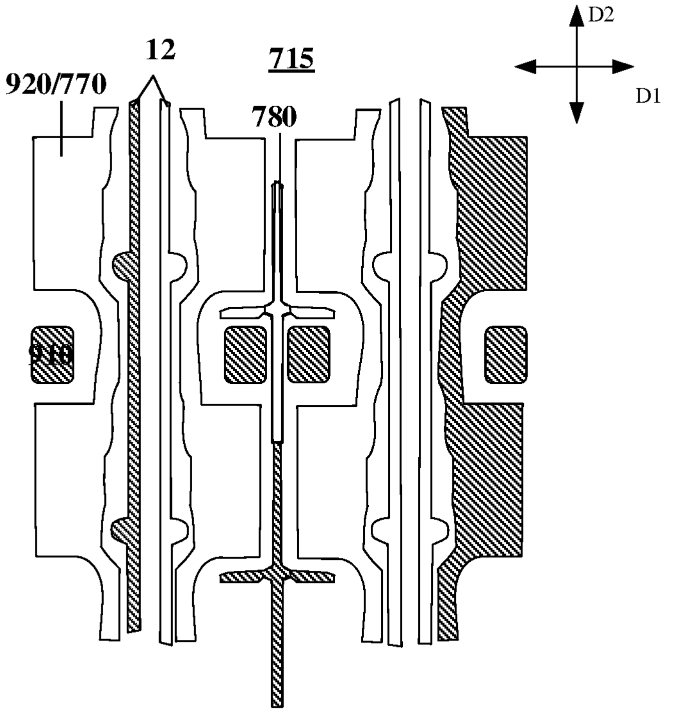
FIG. 18C is a thirtieth schematic diagram of a display substrate provided by at least one embodiment of the present disclosure.
Figure 19A:
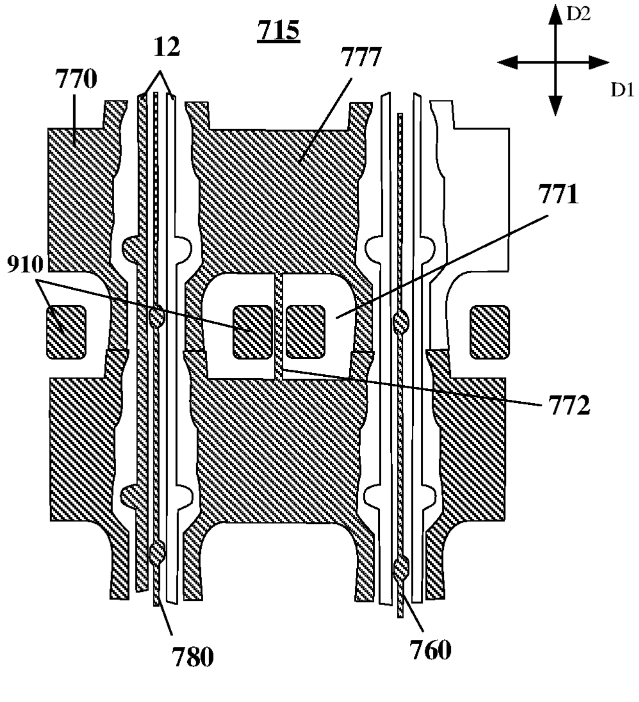
FIG. 19A is a thirty-first schematic diagram of a display substrate provided by at least one embodiment of the present disclosure.
Figure 19B:
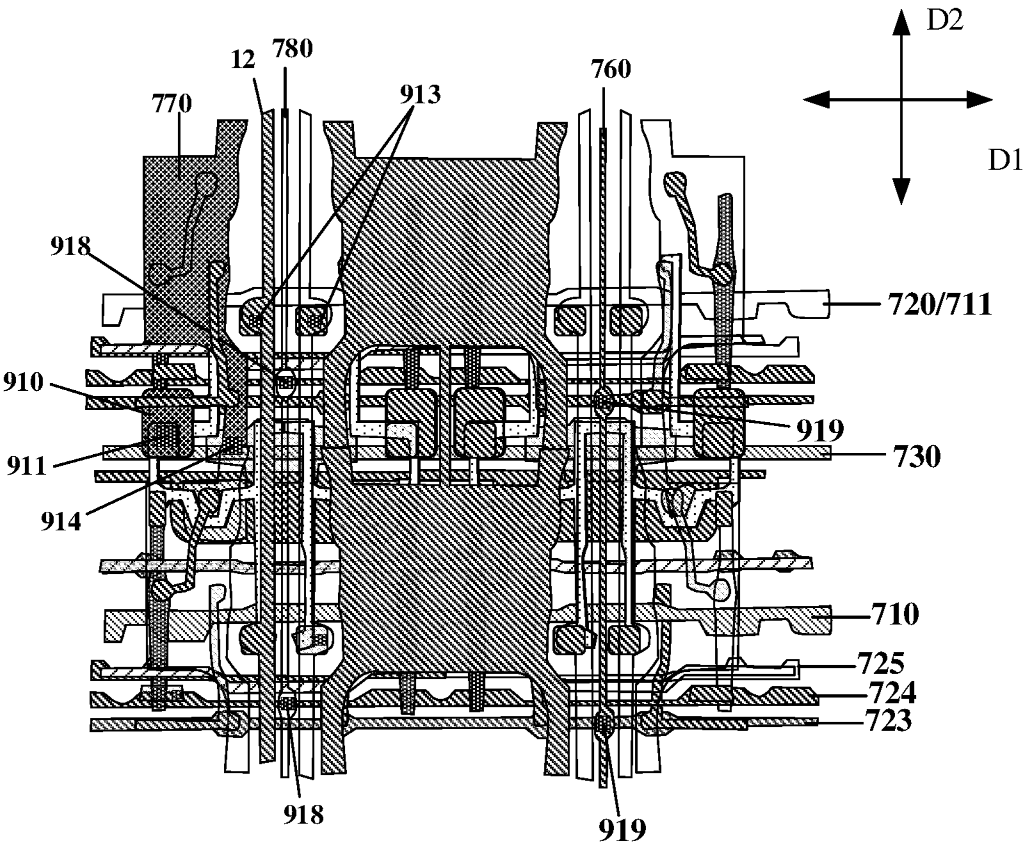
FIG. 19B is a thirty-second schematic diagram of a display substrate provided by at least one embodiment of the present disclosure.

FIG. 18C is a schematic diagram of a display substrate provided by some other embodiments of the present disclosure. As shown in FIG. 18C, in the present embodiment, the reset voltage line 780 may be translated vertically upwards into the conductive layer 715 to be located between two adjacent power lines 770. FIG. 19A and FIG. 19B are schematic diagrams of a display substrate provided by still another embodiments of the present disclosure. The present embodiment differs from the embodiment shown in FIG. 18A and FIG. 18B mainly in that the positions of the reset voltage lines 760 and 780 are changed. Specifically, the reset voltage lines 760 and 780 are located in the conductive layer 715 rather than in the conductive layer 714, and located between the two data lines 12 in a data line group.

As shown in FIG. 19B, the reset voltage lines 780 are electrically connected to the reset voltage lines 724 through via holes 918 (an example of the second via hole of the present disclosure) to form a crisscross reticular reset voltage line structure. The reset voltage lines 760 are electrically connected to the reset voltage lines 723 through via holes 919 (an example of the third via hole of the present disclosure) to form a crisscross reticular reset voltage line structure.

As shown in FIG. 19A, in the first direction, the reset voltage lines 760 and the reset voltage lines 780 are disposed alternately and located between two data lines 12 in a data line group alternately. The two power lines 770 between the adjacent data line groups are connected into an integrated structure. Since no reset voltage line 760 or reset voltage line 780 is disposed correspondingly in the gap between the two power lines 770, connecting the two power lines 770 into the integrated structure may not cause parasitic capacitance.

For example, as shown in FIG. 19A, every two adjacent power electrodes 920 in the first direction D1 are connected to each other into an integrated power electrode set 777. The power electrode set 777 includes a hollowed-out region 771, and the hollowed-out region 771 is used to arrange the connection electrodes 910 in the sub-pixels corresponding to the two power electrodes 920. For example, the conductive layer 715 further includes a connection line 772. The connection line 772 extends in the second direction D2 and is located in the middle of each hollowed-out region 771 to divide the hollowed-out region into two hollowed-out sub-regions, and the two connection electrodes 910 in the hollowed-out region 771 are located in the two hollowed-out sub-regions and located on two sides of the connection line 772, respectively. The connection line 772 is provided to help further reduce the resistance of the power line 770.

With reference to FIG. 13A to FIG. 13B, the conductive layer 206 includes the first electrode 134 of the light emitting element 120. The display substrate 20 may further include a pixel defining layer 608 located on the first electrode 134 of the light emitting element. An opening is formed in the pixel defining layer 308 to expose at least a portion of a pixel electrode 134, thus defining an opening region (i.e., an effective light emitting region) 800 of each sub-pixel of the display substrate. A light emitting layer 136 of the light emitting element 120 is formed at least in the opening region (the light emitting layer 136 may also cover a surface of a side, away from the first electrode of the light emitting element, of part of the pixel defining layer), and a second electrode 135 is formed on the light emitting layer 136, thus forming the light emitting element 120. For example, the second electrode 135 is a common electrode and is disposed in the display substrate 20 as an entire surface. For example, the pixel electrode 134 is a positive electrode of the light emitting element, and the second electrode 135 is a negative electrode of the light emitting element.

Figure 19C:
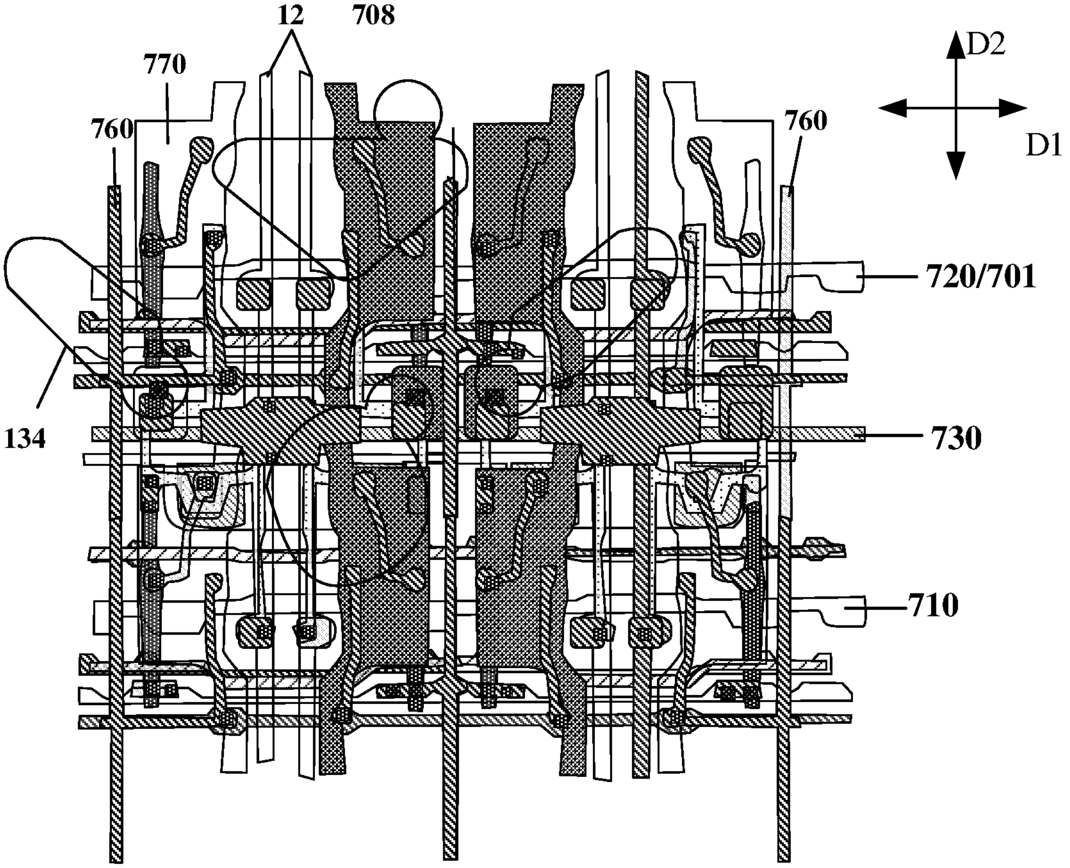
FIG. 19C is a thirty-third schematic diagram of a display substrate provided by at least one embodiment of the present disclosure.

It needs to be noted that the distribution of the first electrodes of the light emitting elements of the display substrate provided by the embodiments of the present disclosure is not limited to the case shown in FIG. 13A, and is also applicable to the distribution of other pixel electrodes. As shown in FIG. 19C, the distribution diagram of the first electrodes 134 of the light emitting element shown in FIG. 10B is also applicable to the display substrate provided by the present embodiment.

For example, materials of the conductive layers may include: gold (Au), silver (Ag), copper (Cu), aluminum (Al), molybdenum (Mo), magnesium (Mg), tungsten (W), and alloy materials formed by such metals; or conductive metal oxide materials such as indium tin oxide (ITO), indium zinc oxide (IZO), zinc oxide (ZnO), and zinc oxide aluminum (AZO); or a stacked structure of a plurality of layers of metals; or a stacked structure of a metal and a conductive metal oxide.

For example, the light emitting element 120 is of a top-emitting structure. The first electrode (i.e., the pixel electrode) 134 is reflective while the second electrode 135 is transmissive or semi-transmissive. For example, the first electrode 134 is a positive electrode, and the second electrode 135 is a negative electrode. For example, the first electrode 134 is an ITO/Ag/ITO stacked structure. The transparent electrically conductive material ITO is a high-work-function material and may be in direct contact with a light emitting material to increase a hole injection rate. The metal material Ag is conducive to improving the reflectivity of the first electrode. For example, the second electrode layer 135 is made of a low-work-function material, e.g., a semi-transmitting metal or metal alloy material (e.g., an Ag/Mg alloy material), to act as the negative electrode.

For example, a material of each insulating layer is, e.g., an inorganic insulating layer, e.g., silicon oxides, silicon nitrides, or silicon oxynitrides, such as silicon oxide, silicon nitride, and silicon oxynitride, or an insulating material including metal oxynitrides such as aluminum oxide and titanium nitride.

For example, the material of the pixel defining layer 608 is an organic material, e.g., an organic insulating material such as polyimide (PI), acrylate, epoxy resin, and polymethyl methacrylate (PMMA).

For example, the base substrate 100 may be a rigid substrate, such as a glass substrate and a silicon substrate, and may also be formed from a flexible material with excellent heat resistance and durability, such as polyimide (PI), polycarbonate (PC), polyethylene terephthalate (PET), polyethylene, polyacrylate, polyarylate, polyetherimide, polyethersulfone, polyethylene terephthalate (PET), polyethylene (PE), polypropylene (PP), polysulfone (PSF), polymethyl methacrylate (PMMA), triacetate cellulose (TAC), cycloolefin polymer (COP), and cycloolefin copolymer (COC).

For example, the materials of the semiconductor materials 105 and 106 include but are not limited to Si-based materials (amorphous silicon (a-Si), polycrystalline silicon (p-Si), etc.), oxide semiconductor materials such as metal-oxide semiconductors (IGZO, ZnO, AZO, IZTO, etc.), and organic materials (sexithiophene, polythiophene, etc.).

For example, the display substrate 20 includes the structure shown in FIG. 2. In the present embodiment, description is made by taking for example that the connection structure shown in FIG. 2 is disposed at a position where the connection electrode 704 is connected to the connection electrode 910. However, the present disclosure is not limited thereto.

With reference to FIG. 13A to FIG. 13B, the connection electrode 704 (an example of the first conductive structure of the present disclosure) includes a bottom surface 704*a* close to the base substrate, a top surface 704*b* away from the base substrate, and a first side surface 704*c* located between the bottom surface 704*a* and the top surface 704*b*.

The connection electrode 704 is electrically connected to the connection electrode 910 (an example of the second conductive structure of the present disclosure) through a via hole 911 (an example of the first via hole of the present disclosure). The via hole 911 overlaps at least in part the via hole 905 (an example of the first depression structure of the present disclosure) in the direction perpendicular to the base substrate such that the insulating layer 606 (an example of the second insulating layer of the present disclosure) is depressed downwards. The via hole 911 exposes at least a portion of the first side surface 704*c* of the connection electrode 704, and the connection electrode 910 is depressed downwards and includes a protrusion 910*a* (another example of the first protrusion of the present disclosure). The protrusion 910*a* is in contact with at least a portion of the first side surface 704*c* and covers the portion of the first side surface 704*c* that is exposed by the via hole 911.

With reference to FIG. 2 and FIG. 13A to FIG. 13B, the structure shown in FIG. 2 may be regarded as a portion of the sectional structure of the display substrate 20 along the section line B-B', i.e., the structure marked by the dotted line in FIG. 13B. The connection electrode 704, the connection electrode 910, the protrusion 910*a*, the via hole 911, and the via hole 905 in FIG. 13B may be regarded as the first conductive structure 21, the second conductive structure 22, the protrusion 220, the via hole V1, and the depression structure G1 in FIG. 2, respectively. The description on FIG. 2 is also applicable to FIG. 13B, which will not be redundantly described here.

For example, as shown in FIG. 13A to FIG. 13B, the connection electrode 704 includes a protrusion 704*t* facing the via hole 905, and an orthographic projection of the protrusion 704*t* on the base substrate is located within the orthographic projection of the via hole 905 on the base substrate.

For example, within the cross section shown in FIG. 13B, a size of the via hole 905 in the reference direction F is denoted as b, and the reference direction F is parallel to the surface of the base substrate, and is, for example, the second direction D2. A size of an overlapping region of the via hole 911 and the via hole 905 in the reference direction F is denoted as c, and a size of a portion, covered by the connection electrode 910, of the first side surface 704*c* of the connection electrode 704 in the direction perpendicular to the base substrate is denoted as d.

As shown in FIG. 13B, the connection electrode 704 includes a contact portion 724 that is located on a side, away from the base substrate, of the insulating layer 605 and in contact with the connection electrode 910. The contact portion 724 may be regarded as, for example, a longitudinal segment of the connection electrode 704 within a range of contact with the connection electrode 910. A size of the contact portion 724 in the direction perpendicular to the base substrate is denoted as e. A size of the first side surface 704*c* in the direction perpendicular to the base substrate is denoted as n.

For example, within the cross section shown in FIG. 13B, a maximum depth of the via hole 905 is denoted as i; an included angle formed by a side edge of the via hole 905 and the surface of the base substrate is denoted as j; and a size of a portion, in contact with the connection electrode 704, of the connection electrode 910 in the direction perpendicular to the base substrate is denoted as k. For example, d/e>2.1*i*sin(j)/k.

For example, c/b is greater than 0.1, and d/e is greater than 0.3. For example, c/b is greater than 0.28.

For example, d/n is greater than 0.6.

The covered size of the first side surface 704*c* is positively correlated to the depth of the via hole 905 and a base angle of the via hole 905 and negatively correlated to a thickness of the connection electrode 910. By reducing d/e or c/b within a certain range, the overlap of the via hole 911 and the via hole 905 can be reduced, thus reducing the size of the downward protrusion 910*a* of the connection electrode 910 and improving the flatness of the connection electrode 910. Thus, the flatness of the pixel electrode above is improved, and the display quality is improved.

For example, d/e>2.5*i*sin(j)/k.

The above arrangement may increase the overlapping area of the connection electrode 910 and the connection electrode 704 in the longitudinal direction, which is conductive to reducing the planar areas of the via hole 911 and the via hole 905. Since the pixel opening region 800 needs to be avoided from overlapping the via hole 911 or the via hole 905 as much as possible to improve the flatness, such an arrangement can effectively increase the aperture opening ratio of the display substrate.

In an example, b=56.8 um, c=8.1 um, c/b=0.143, d=2.9 um, e=14.1 um, and d/e=0.206.

In another example, b=33.2 um, c=5.1 um, c/b=0.154, d=3.1 um, e=9.1 um, and d/e=0.341.

In still another example, b=99.1 um, c=26.0 um, c/b=0.262, d=12.8 um, e=22.5 um, and d/e=0.569.

For example, an average thickness of the protrusion 910*a* is smaller than an average thickness of a portion of the connection electrode 910 that is in contact with the top surface 704*b* of the connection electrode 704.

For example, for each sub-pixel, the protrusion 910*a* is located between the reset voltage line 760/780 connected to the sub-pixel and the connection electrode 708; that is, an orthographic projection of the protrusion 910*a* on the base substrate 100 is located between the orthographic projection of the reset voltage line 760/780 on the base substrate and the orthographic projection of the connection electrode 708 on the base substrate. Since the first power voltage VDD is loaded onto the connection electrode 708, such an arrangement is conducive to reducing the signal interference between the reset voltage line 760/780 and the connection electrode 708.

With reference to FIG. 13A to FIG. 13B, for the first sub-pixel starting from the left side as shown, the protrusion 910*a* is located between the reset voltage line 760 and the connection electrode 708 that are connected to the column of sub-pixels. As shown in FIG. 13A, a distance between the orthographic projection of the protrusion 910*a* on the base substrate and the orthographic projection of the reset voltage line 760 on the base substrate in the reference direction F (e.g., the first direction D1) is denoted as s1, and a distance between the orthographic projection of the protrusion 910*a* on the base substrate and the orthographic projection of the connection electrode 708 on the base substrate in the reference direction F is denoted as s2. For example, s1 is smaller than s2. Such an arrangement can better shield the reset voltage line 70.

For example, as shown in FIG. 17B, the connection electrode 708 includes a main body portion and an extension portion 708*a* extended in the first direction D1. The extension portion 708*a* protrudes towards the reset voltage line 760, and a size of the extension portion 708*a* in the second direction D2 is smaller than a size of the main body portion in the second direction D2. In the second direction D2, the connection electrode 704 overlaps at least in part the extension portion 708*a* of the connection electrode 708. Such an arrangement is conducive to further improving the effect of shielding the interference of the power voltage signal in the connection electrode 708 on the reset voltage line 760.

At least one embodiment of the present disclosure further provides a display panel including any display substrate 20 described above. For example, the display panel is an OLED display panel, and correspondingly, the display substrate 20 included therein is an OLED display substrate. The display substrate 20 may include or not include a light emitting element. In other words, the light emitting element may be formed on the panel after the display substrate 20 is completed. In the case in which the display substrate 20 itself includes no light emitting element, the display panel provided in the embodiments of the present disclosure further includes a light emitting element in addition to the display substrate 20.

Figure 20:
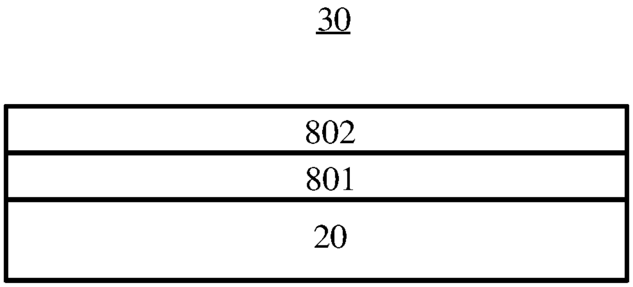
FIG. 20 is a schematic diagram of a display panel provided by at least one embodiment of the present disclosure.

As shown in FIG. 20, for example, the display panel 30 further includes an encapsulation layer 801 and a cover plate 802 that are disposed on the display substrate 20. The encapsulation layer 801 is configured to seal the light emitting element on the display substrate 20 to prevent external moisture and oxygen from infiltration to the light emitting element and a driving sub-circuit to cause damage thereto. For example, the encapsulation layer 801 includes an organic thin film or includes a structure of alternately stacked inorganic-organic-inorganic thin films. For example, a water absorbing layer (not shown) may also be disposed between the encapsulation layer 801 and the display substrate 20, which is configured to absorb residual water vapor or sol on the light emitting element resulting from a preproduction process. The cover plate 802 is, for example, a glass cover plate or a flexible cover plate. For example, the cover plate 802 and the encapsulation layer 801 may be of an integrated structure.

At least one embodiment of the present disclosure further provides a touch display panel including any display substrate 20 described above. The touch display panel provided by at least one embodiment of the present disclosure will be described below exemplarily with reference to FIG. 21 and by taking for example that the touch display panel includes the display substrate shown in FIG. 6A to FIG. 6B.

Figure 21:
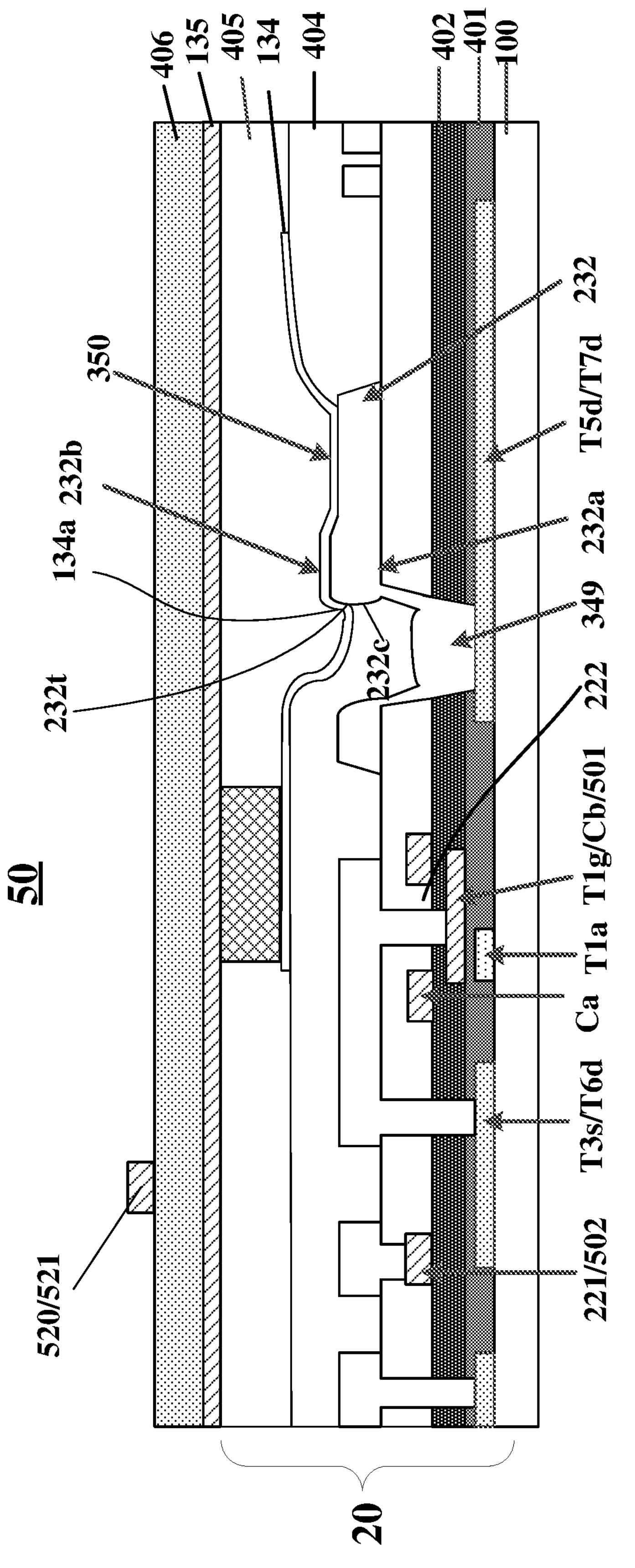
FIG. 21 is a schematic diagram of a touch display panel provided by at least one embodiment of the present disclosure.

As shown in FIG. 21, the touch display panel 50 includes a display substrate 20 and a touch structure 520 that are stacked, and further includes an insulating layer 406 located between the display substrate 20 and the touch structure 520. For example, the insulating layer 406 includes an encapsulation layer 406. The encapsulation layer 406 is configured to seal the light emitting element 120 to prevent external moisture or oxygen from infiltration to the light emitting element and the driving circuit to damage devices such as the light emitting element 120. For example, the encapsulation layer 406 may be a single-layer structure or a multi-layer structure, e.g., a multi-layer structure including an organic thin film and an inorganic thin film or including alternately stacked organic thin films and inorganic thin films. For example, the touch display panel further includes a buffer layer (not shown) located between the encapsulation layer 406 and the touch structure 520. The buffer layer is configured to improve the adhesion force between the touch structure 520 and the display substrate 20.

As shown in FIG. 21, the touch structure 520 includes a touch electrode 521. The touch electrode 521 is, for example, a blocky electrode or a metal grid electrode.

In the direction perpendicular to the base substrate, the protrusion of the second conductive structure and the touch electrode in the display substrate do not overlap. That is, an orthographic projection of the protrusion (e.g., the protrusion 314*a* in FIG. 21) of the second conductive structure on the base substrate is separated from an orthographic projection of the touch electrode on the base substrate. Such an arrangement is conducive to avoiding undesirable effects caused by the protrusion affecting the flatness of the touch electrode.

For example, in the direction of the base substrate, the first conductive structure (e.g., the connection electrode 232 in FIG. 21) and the touch electrode in the display substrate do not overlap. That is, an orthographic projection of the first conductive structure on the base substrate is separated from an orthographic projection of the touch electrode on the base substrate.

Figure 22:
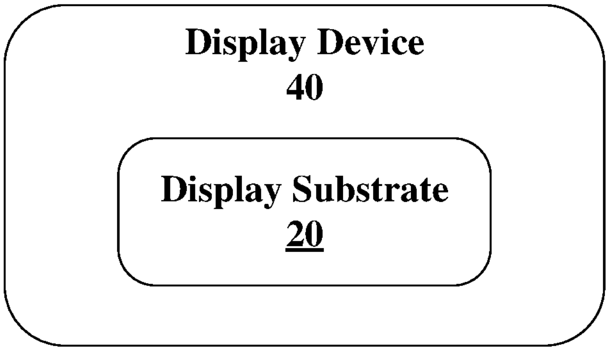
FIG. 22 is a schematic diagram of a display device provided by at least one embodiment of the present disclosure.

At least one embodiment of the present disclosure further provides a display device 40. As shown in FIG. 22, the display device 40 includes any display substrate 20 or display panel or a touch display panel described above. The display device provided in the present embodiment may be any product or component having the display function, such as a display, an OLED panel, an OLED television, an electronic paper, a mobile phone, a tablet computer, a laptop, a digital photo frame and a navigator.

What have been described above merely are specific implementations of the present disclosure, and the protection scope of the present disclosure is not limited thereto. The protection scope of the present disclosure should be based on the protection scope of the claims.

The invention claimed is:

1. A display substrate, comprising:

a base substrate; and a first insulating layer, a first conductive layer, a second insulating layer, and a second conductive layer which are disposed on the base substrate in sequence, wherein the first insulating layer comprises a first depression structure; the first conductive layer comprises a first conductive structure comprising a bottom surface close to the base substrate, a top surface away from the base substrate, and a first side surface between the bottom surface and the top surface;

the second insulating layer comprises a first via hole, and the second conductive layer comprises a second conductive structure;

an orthographic projection of the first via hole on the base substrate is at least partially overlapped with an orthographic projection of the first depression structure on the base substrate;

the first via hole exposes at least a portion of the first side surface of the first conductive structure, and the second conductive structure is in contact with the at least portion of the first side surface of the first conductive structure;

the first side surface of the first conductive structure comprises a protruding curved surface, and the second conductive structure covers at least a portion of the protruding curved surface;

the first conductive structure comprises a connection portion located in the first depression structure and connected to the protruding curved surface; and in a direction parallel to a surface of the base substrate, the protruding curved surface protrudes towards a middle of the first depression structure relative to the connection portion.

2. The display substrate according to claim 1, wherein the second conductive structure comprises a first protrusion, and an orthographic projection of the first protrusion on the base substrate is located within the orthographic projection of the first depression structure on the base substrate;

the first protrusion is in contact with at least a portion of the first side surface of the first conductive structure; and the orthographic projection of the first depression structure on the base substrate is at least partially overlapped with the orthographic projection of the first via hole on the base substrate.

3. The display substrate according to claim 1, having a first cross section, wherein a size of the first depression structure within the first cross section in a reference direction parallel to a surface of the base substrate is denoted as b;

within the first cross section, a size of an overlapping region of the first via hole and the first depression structure in the reference direction is denoted as c, and a size of a portion, covered by the second conductive structure, of the first side surface of the first conductive structure in the direction perpendicular to the base substrate is denoted as d; the first conductive structure comprises a contact portion located on the side, away from the base substrate, of the first insulating layer and in contact with the second conductive structure, and a size of the contact portion in the direction perpendicular to the base substrate is denoted as e;

c/b is greater than 0.1; and d/e is greater than 0.3.

4. The display substrate according to claim 1, wherein the first insulating layer further comprises a second depression structure spaced apart from the first depression structure;

the first conductive structure further comprises a second side surface located between the bottom surface and the top surface, and the first side surface is opposite to the second side surface;

an orthographic projection of the second side surface on the base substrate is at least partially overlapped with an orthographic projection of the second depression structure on the base substrate;

the first via hole further exposes at least a portion of the second side surface, and the second conductive structure covers the at least portion of the second side surface of the first conductive structure.

5. A display device, comprising the display substrate according to claim 1.

6. A display substrate, comprising:

a base substrate; and a first insulating layer, a first conductive layer, a second insulating layer, and a second conductive layer which are disposed on the base substrate in sequence, wherein the first insulating layer comprises a first conductive structure; the second conductive layer comprises a second conductive structure;

the first conductive structure comprises a bottom surface close to the base substrate, a top surface away from the base substrate, and a first side surface located between the bottom surface and the top surface;

the second insulating layer comprises a first via hole, and the second conductive layer is in contact with the first conductive structure through the first via hole;

the second conductive structure comprises a first protrusion; the first via hole exposes at least a portion of the first side surface of the first conductive structure, and the first protrusion is in contact with the at least portion of the first side surface of the first conductive structure;

the first insulating layer comprises a first depression structure and a second depression structure spaced apart from each other; the first conductive structure further comprises a second side surface located between the bottom surface and the top surface, and the first side surface is opposite to the second side surface; and at least a portion of the first conductive structure is respectively located in the first depression structure and the second depression structure.

7. The display substrate according to claim 6, wherein the first conductive structure comprises a second protrusion facing the first depression structure, and an orthographic projection of the second protrusion on the base substrate is located within an orthographic projection of the first depression structure on the base substrate.

8. The display substrate according to claim 6, further comprising a plurality of sub-pixels located on the base substrate, wherein the plurality of sub-pixels are arranged in a plurality of pixel rows along a first direction and a plurality of pixel columns along a second direction, and the first direction is different from the second direction;

the first conductive layer further comprises a first signal line and a second signal line which are spaced apart from the first conductive structure, and the first signal line and the second signal line are extended in the second direction;

a distance of an orthographic projection of the first protrusion on the base substrate to an orthographic projection of the first signal line on the base substrate in the first direction is denoted as l, and a distance of an orthographic projection of the second signal line on the base substrate to the orthographic projection of the first signal line on the base substrate in the first direction is denoted as m;

the display substrate comprising a first cross section perpendicular to the base substrate; within the first cross section, a size of a portion of the first conductive structure which is located on a side, away from the base substrate, of the first insulating layer in a direction perpendicular to the base substrate is denoted as e, and a size of a portion, covered by the first protrusion, of the first side surface in the direction perpendicular to the base substrate is denoted as d; and $l/m>0.9$ (d/e).

9. The display substrate according to claim 6, further comprising a third conductive layer on the side, close to the base substrate, of the first conductive layer, wherein the display substrate further comprises a plurality of sub-pixels located on the base substrate; the plurality of sub-pixels are arranged in a plurality of pixel rows in a first direction and a plurality of pixel columns in a second direction, and the first direction is different from the second direction;

the first conductive layer comprises a first reset voltage line extended in the second direction, and the third conductive layer comprises a second reset voltage line extended in the first direction, and the first reset voltage line is electrically connected to the second reset voltage line;

the display substrate further comprises a semiconductor layer on a sided, close to the base substrate, of the third conductive layer; the semiconductor layer comprises a connection portion which electrically connects the first reset voltage line to a first electrode of a reset transistor in a sub-pixel; and an orthographic projection of the connection portion on the base substrate is overlapped with an orthographic projection of the first reset voltage line on the base substrate and is overlapped with an orthographic projection of the first electrode of the reset transistor on the base substrate.

10. The display substrate according to claim 6, further comprising a plurality of sub-pixels located on the base substrate, wherein the plurality of sub-pixels are arranged in a plurality of pixel rows in a first direction and a plurality of pixel columns in a second direction, and the first direction is different from the second direction;

the display substrate further comprises a first gate reset voltage line and a first pixel electrode reset voltage line which are extended in the second direction, and a second gate reset voltage line and a second pixel electrode reset voltage line which are extended in the second direction, the first gate reset voltage line is electrically connected to the second gate reset voltage line through a second via hole, and the first pixel electrode reset voltage line is electrically connected to the second pixel electrode reset voltage line through a third via hole;

the first gate reset voltage line and the second gate reset voltage line are configured to provide a reset voltage signal for a gate electrode of a driving transistor, and the first pixel electrode reset voltage line and the second pixel electrode reset voltage line are configured to provide a reset voltage signal for a pixel electrode.

11. The display substrate according to claim 10, wherein the second pixel electrode reset voltage line is electrically connected to a first electrode of a pixel electrode reset transistor through a fourth via hole, and orthographic projections of the fourth via hole and the third via hole on the base substrate are separated from each other;

the second gate reset voltage line is electrically connected to a first electrode of a gate electrode reset transistor through a fifth via hole, and orthographic projections of the fifth via hole and the second via hole on the base substrate are separated from each other.

12. The display substrate according to claim 6, further comprising a plurality of sub-pixels on the base substrate, wherein the plurality of sub-pixels are arranged in a plurality of pixel rows along a first direction and a plurality of pixel columns along a second direction, and the first direction is different from the second direction;

each of the plurality of sub-pixels comprises a first capacitor electrode; the display substrate further comprises a plurality of data lines extended in the second direction;

first capacitor electrodes of two sub-pixels adjacent in the first direction are connected by a connection portion, and the plurality of data lines are respectively overlapped with a plurality of connection portions in a direction perpendicular to the base substrate;

the connection portion comprises a first portion overlapping a corresponding data line and a second portion not overlapping the corresponding data line;

a size of the first portion in the second direction is greater than a size of the second portion in the second direction;

the display substrate further comprises a reset voltage line extended along the second direction; and the second portion is overlapped with the reset voltage line in the direction perpendicular to the base substrate.

13. A display substrate, comprising:

a base substrate; and a first metal layer, a second metal layer, a first conductive layer, and a second conductive layer which are disposed on the base substrate in sequence, wherein the display substrate further comprises a first sub-pixel and a second sub-pixel which are on the base substrate and adjacent in a first direction; the first sub-pixel comprises a first pixel circuit, and the second sub-pixel comprises a second pixel circuit; the first pixel circuit and the second pixel circuit each comprise a capacitor which comprises a first capacitor electrode in the second metal layer and a second capacitor electrode in the first metal layer;

the first capacitor electrode of the first pixel circuit and the first capacitor electrode of the second pixel circuit are connected to each other into an integrated capacitor electrode block;

the capacitor electrode block has a first opening and a second opening; an orthographic projection of the first opening on the base substrate is overlapped with an orthographic projection of the second capacitor electrode of the first pixel circuit on the base substrate, and an orthographic projection of the second opening on the base substrate is overlapped with an orthographic projection of the second capacitor electrode of the second pixel circuit on the base substrate; and an area of the orthographic projection of the first opening on the base substrate is different from an area of the orthographic projection of the second opening on the base substrate;

wherein the second conductive layer comprises a reset voltage line, a first data line, a second data line, a first power line, and a second power line which are extended along a second direction, and the first direction is different from the second direction;

each of the first pixel circuit and the second pixel circuit comprises a driving transistor and a data writing transistor;

the reset voltage line is configured to provide a reset voltage for pixel electrodes or gate electrodes of the driving transistors of the first pixel circuit and the second pixel circuit; the first data line and the second data line are configured to provide data voltages for the data writing transistors of the first pixel circuit and the second pixel circuit, respectively;

the first power line is configured to provide a power voltage for the driving transistor of the first pixel circuit, and the second power line is configured to provide a power voltage for the driving transistor of the second pixel circuit;

the reset voltage line is between the first data line and the second data line;

the first data line and the second data line are both between the first power line and the second power line; and the first power line and the second power line each have a closed hollowed-out region.

14. The display substrate according to claim 13, wherein an orthographic projection of a pixel electrode of the first sub-pixel on the base substrate is overlapped with an orthographic projection of each of the reset voltage line, the first data line, the second data line, the first power line, and the second power line on the base substrate.

15. The display substrate according to claim 13, further comprising a plurality of sub-pixels located on the base substrate and arranged in a plurality of pixel rows in the first direction and a plurality of pixel columns in a second direction, wherein the first direction is different from the second direction;

the first conductive layer comprises a plurality of connection electrodes which are connected to the plurality of sub-pixels in one-to-one correspondence to provide a power voltage;

the plurality of sub-pixels comprise a first sub-pixel, the display substrate further comprises a reset voltage line extended in the second direction, and the reset voltage line is connected to the first sub-pixel to provide a reset voltage; and the second conductive layer further comprises a first protrusion, and an orthographic projection of the first protrusion on the base substrate is between an orthographic projection of the connection electrode correspondingly connected to the first sub-pixel on the base substrate and an orthographic projection of the reset voltage line on the base substrate;

along the first direction, a distance of the first protrusion to the reset voltage line is smaller than a distance of the first protrusion to the connection electrode correspondingly connected to the first sub-pixel.

16. The display substrate according to claim 15, wherein the second conductive layer comprises a plurality of power electrodes that are connected to the plurality of connection electrodes in one-to-one correspondence to provide the power voltage; and the power electrodes corresponding to each of the plurality of pixel columns are connected to one another into an integrated structure so as to form a plurality of power lines extended in the second direction;

the second conductive layer further comprises a plurality of data lines extended in the second direction, wherein the plurality of data lines are connected to the plurality of pixel columns in one-to-one correspondence to provide data signals;

the plurality of data lines are divided into a plurality of data line groups, and each data line group comprises two data lines;

between every two adjacent pixel columns is provided with one data line group, and adjacent data line groups are spaced apart by two power lines of the plurality of power lines.

17. The display substrate according to claim 16, comprising a plurality of reset voltage lines extended in the second direction, wherein the plurality of reset voltage lines comprise a first reset voltage line and a second reset voltage line disposed alternately in the first direction; the first reset voltage line and the second reset voltage line are configured to provide a first reset voltage and a second reset voltage, respectively; and adjacent first reset voltage and second reset voltage are spaced apart by two pixel columns;

the plurality of reset voltage lines are in the first conductive layer;

one first reset voltage line or one second reset voltage line is provided between the two power lines between the adjacent data line groups;

an orthographic projection of any one of the plurality of reset voltage lines on the base substrate is separated from an orthographic projection of any one of the plurality of power lines on the base substrate; and the plurality of reset voltage lines are in the second conductive layer and are in one-to-one correspondence with the plurality of data line groups; and each of the plurality of reset voltage lines is between two data lines of a data line group corresponding to the each reset voltage line.

18. The display substrate according to claim 17, wherein the two power lines between adjacent data line groups are connected to each other into an integrated structure such that two power electrodes adjacent in the first direction in the two power lines are connected to each other into an integrated power electrode set;

the second conductive layer further comprises a plurality of conductive structures disposed in one-to-one correspondence with the plurality of power electrodes;

the power electrode set comprises a hollowed-out region provided with two conductive structures; and the second conductive layer further comprises a connection line extended in the second direction to divide the hollowed-out region into two hollowed-out sub-regions; and the two conductive structures are disposed within the two hollowed-out sub-regions and located on two sides of the connection line, respectively.

* * * * *